US006396320B2

(12) United States Patent
Saeki

(10) Patent No.: US 6,396,320 B2
(45) Date of Patent: May 28, 2002

(54) CLOCK CONTROL METHOD AND CIRCUIT

(75) Inventor: Takanori Saeki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/915,541

(22) Filed: Jul. 27, 2001

Related U.S. Application Data

(62) Division of application No. 09/330,162, filed on Jun. 11, 1999.

(30) Foreign Application Priority Data

Jun. 12, 1998 (JP) .......................................... 10-164730

(51) Int. Cl.[7] ................................................. H03L 7/06
(52) U.S. Cl. ........................................ 327/156; 375/376
(58) Field of Search ................................ 327/147–150, 327/155–159, 163; 331/DIG. 2; 375/374–376

(56) References Cited

U.S. PATENT DOCUMENTS

| | | | |
|---|---|---|---|
| 5,469,116 A | 11/1995 | Slemmer | 331/74 |
| 5,923,188 A | 7/1999 | Kametani et al. | 326/93 |
| 5,939,919 A | 8/1999 | Proebsting | 327/295 |
| 6,137,336 A | 10/2000 | Baba et al. | 327/295 |
| 6,184,736 B1 | 2/2001 | Wissell et al. | 327/295 |
| 6,194,930 B1 * | 2/2001 | Matsuzaki et al. | 327/156 |
| 6,259,288 B1 * | 7/2001 | Nishimura | 327/156 |

FOREIGN PATENT DOCUMENTS

| | | |
|---|---|---|
| JP | 8-137091 | 5/1996 |
| JP | 8-237091 | 9/1996 |

OTHER PUBLICATIONS

J. Han, et al., "Skew Minimization Techniques for 256M–bit Synchronous DRAM and Beyond," Symposium on VLSI Circuits Digest of Technical Papers (1998), pp. 192–193.

R. B. Watson, et al., "Clock Buffer Chip with Absolute Delay Regulation Over Process and Environmental Variations," Proc. of IEEE, Custom Integrated Circuits Conference (1992), pp. 25.2.1–25.2.5, with Abstract.

Y. Okajima, et al., "Digital Delay Locked Loop and Design Technique for High–Speed Synchronous Interface," IEICE Trans. Electron, vol. E79–C, No. 6, Jun. 1996, pp. 798–807.

* cited by examiner

Primary Examiner—My-Trang Nu Ton
(74) Attorney, Agent, or Firm—Sughrue Mion, PLLC

(57) ABSTRACT

A clock control circuit for reducing jitter has at least one averaging circuit for generating, and outputting from an output terminal, a signal having a time difference obtained by internally dividing a time difference between first and second signals input respectively from first and second input terminals. First and second clock signals are supplied respectively to the first and second input terminals of the timing averaging circuit, and a clock in which a time difference between pulses of the first and second clock signals is averaged is generated.

8 Claims, 52 Drawing Sheets

F I G. 1
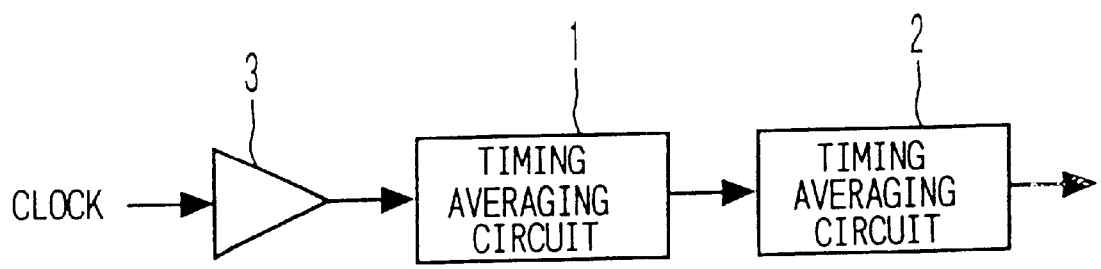

FIG. 4 (a)
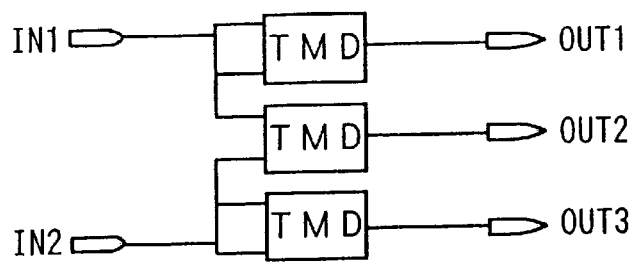
FIG. 4 (b)
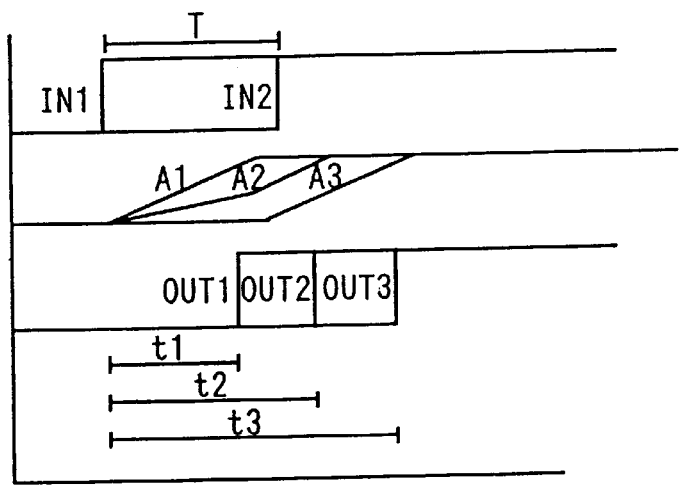
FIG. 4 (c)
t1=CV/(i1+i2)
t2=T+(CV-i1T)/(i1+i2)=T+CV/(i1+i2)-i1T/(i1+i2)=T(i2/(i1+i2))+t1
t2=(1/2)T+t1
t3=T+CV/(i1+i2)=T+t1

F I G. 8
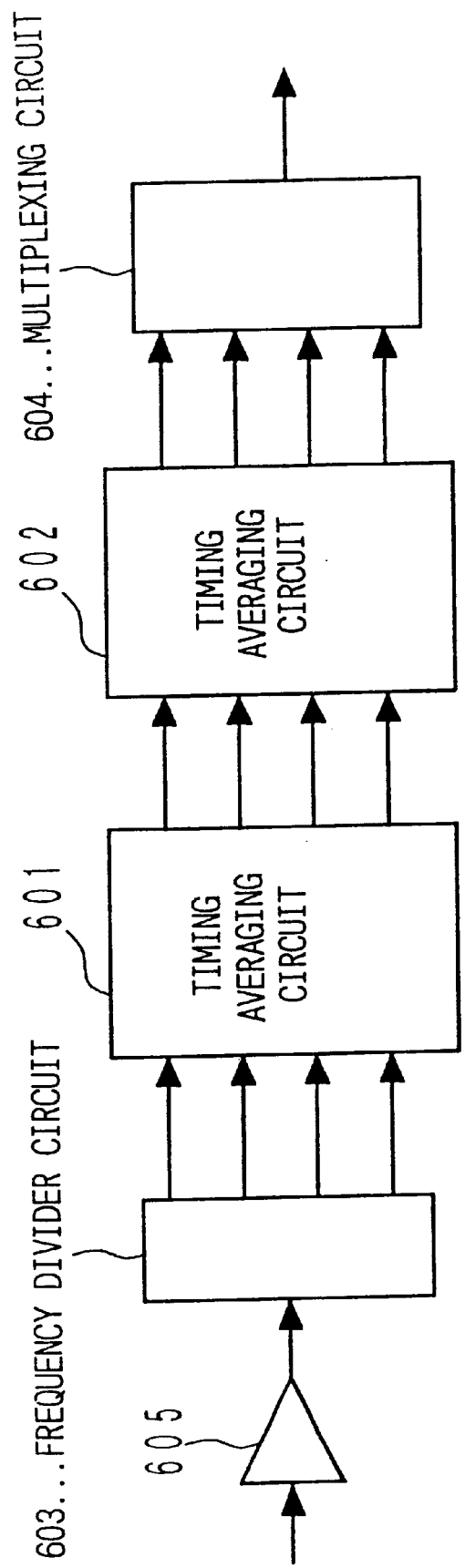

F I G. 2 3 (a)
*RELATED ART*
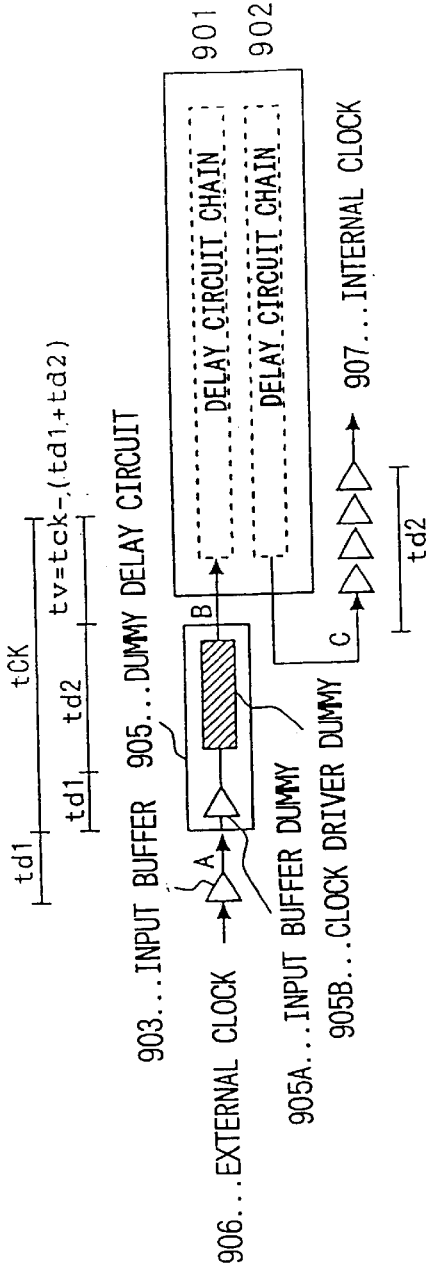
F I G. 2 3 (b)
*RELATED ART*
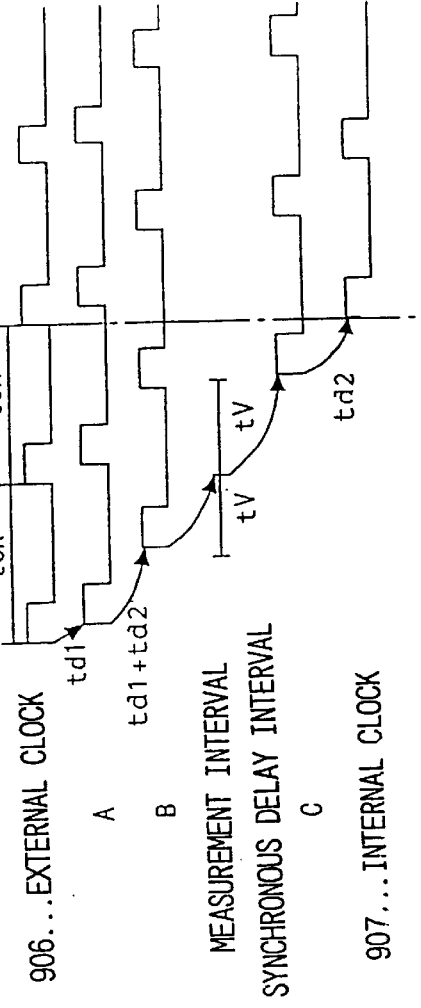

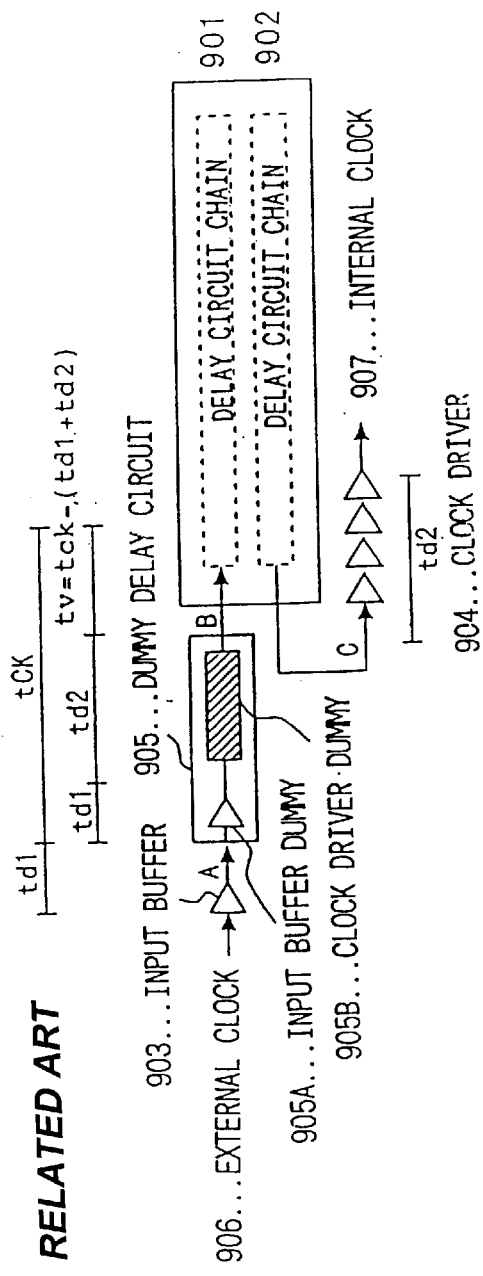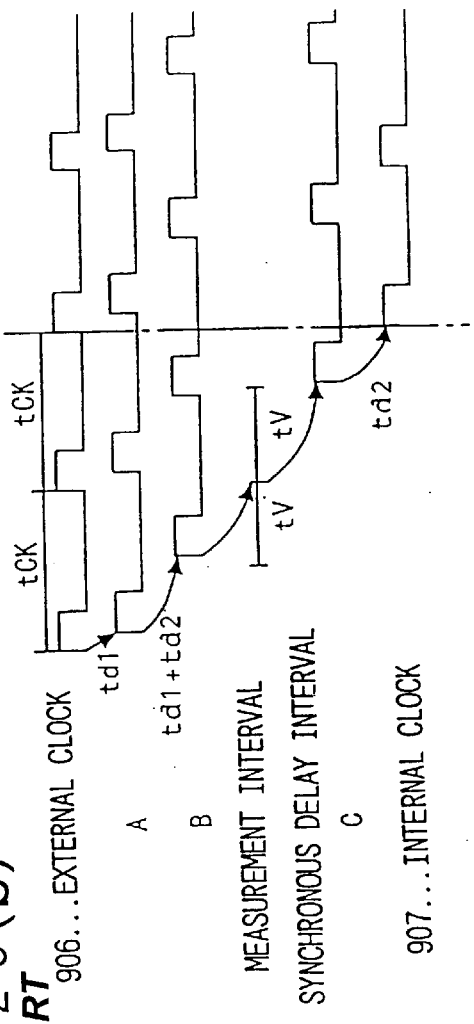

2-1...NORMAL CLOCK
2-2...CLOCK WITH JITTER
2-3...PRIMARY JITTER-COMPENSATED CLOCK
2-4...SECONDARY JITTER-COMPENSATED CLOCK

F I G. 3 2
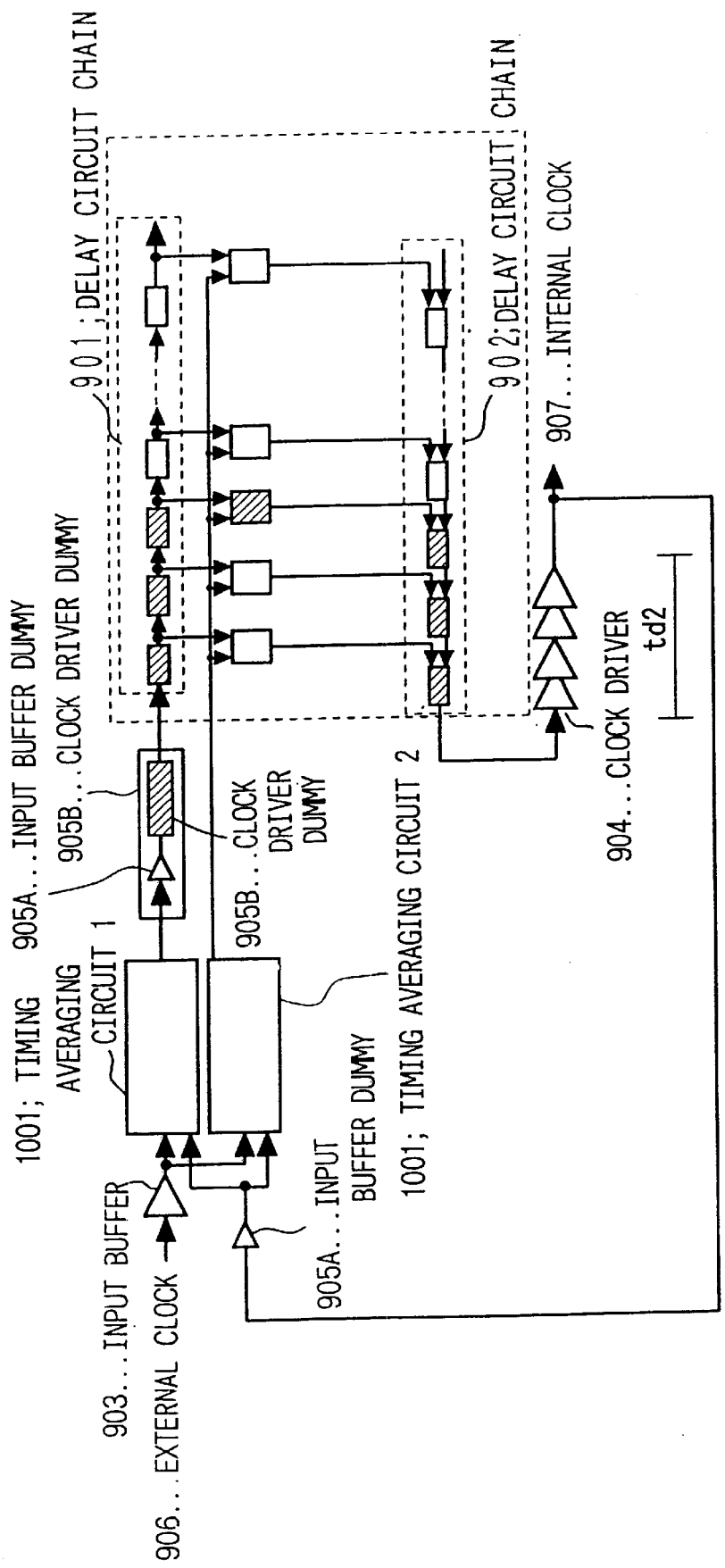

CLOCK CONTROL METHOD AND CIRCUIT

This is a divisional of application Ser. No. 09/330,162 (Confirmation Number not yet assigned) filed Jun. 11, 1999, the disclosure of which is incorporated herein by reference.

STATUS OF RELATED APPLICATIONS

The entire disclosure of the copending U.S. patent application Ser. No. 09/087,864 filed Jun. 1, 1998 by the same applicant as the present application is incorporated herein by reference.

FIELD OF THE INVENTION

This invention relates to a method of controlling clock signals and to a clock control circuit. More particularly, the invention relates to a clock signal control method and circuit ideal for application to a semiconductor integrated circuit device synchronized to a system clock to control internal circuitry. More specifically, the invention relates to a circuit that uses a timing averaging circuit for clock control, as well as to a clock control circuit that uses a timing averaging circuit in a synchronizing circuit such as a delay-locked loop, phase synchronizing loop or synchronous delay circuit.

DESCRIPTION OF THE RELATED ART

In a semiconductor integrated circuit synchronized to a system clock to control internal circuitry, the entirety of the internal circuitry is controlled by executing a given circuit operation every cycle of the clock.

In order to assure operation that takes variance due to system clock jitter into account in a semiconductor integrated circuit of this kind, the length of time in clock cycle that can actually be used for circuit operation is obtained by subtracting jitter time from the period of the clock. Accordingly, if we let Tmin represent the minimum time necessary for circuit operation executed in one clock cycle, then it will be necessary for the minimum period tCKmin of the clock to be set to a time Tmin+Tjitter, namely a length of time obtained by adding jitter time Tjitter to Tmin, as shown in FIG. 16.

Further, in order to reduce delay time between the system clock and an internal clock or to multiply the frequency of the clock in a semiconductor integrated circuit synchronized to a system clock to control the internal circuitry, the conventional practice is to use a phase-locked loop (PLL), a delay-locked loop (DLL) or a synchronous delay circuit. However, these clock control circuits can be a source of clock jitter and are susceptible to jitter of the system clock, in which case locking time is prolonged. Thus, these circuits tend to degrade the synchronization characteristic.

A PLL is effective in reducing jitter depending upon how the PLL is set up. In a PLL, a clock having a frequency and phase the same as those of an external clock is generated by a voltage-controlled oscillator (VCO) 105 configured for feedback, as shown in FIG. 21. In this arrangement, the jitter component of the system clock is suppressed by a phase comparator 102, a charge pump 103 connected to the output of the phase comparator 102 and a loop filter 104 connected to the output of the charge pump 103, thus making it possible to reduce jitter of the clock generated by the VCO 105. The charge pump 103 receives the output (UP and DOWN signals, etc.) from the phase comparator 102 and the output node thereof is charged or discharged, whereby a voltage corresponding to the phase difference between the clock and the output of the VCO 105 is applied as the input voltage of the loop filter 104.

Because a PLL is a feedback circuit, however, a long period of time on the order of several hundred to several thousand cycles is required until the clock stabilizes. In addition, if jitter is too large, there is the possibility that the PLL will not remain locked.

In a DLL, on the other hand, a clock having a phase the same as those of an external clock is generated by a voltage-controlled delay circuit 115 configured for feedback, as shown in FIG. 22. A problem that arises, therefore, is that external clock jitter passes through the delay circuit as is and is transmitted to the internal circuitry from a clock driver 106.

In a synchronous delay circuit, as shown in FIG. 23, a pair of delay circuit chains 901, 902 and a dummy delay circuit 905, which comprises an input buffer dummy 905A and a clock driver dummy 905B, are used to subtract the delay time (td1+td2) of the dummy delay circuit 905 from the clock period tCK of a clock whose phase is the same as that of an external clock, whereby a delay quantity tV is obtained. The delay quantity tV is measured as the length of time of travel through the delay circuit chain 901, and the delay is reproduced by the other delay circuit chain 902, thereby synchronizing the internal clock to the external clock.

The synchronous delay circuit, which eliminates clock skew in a short synchronization time, finds use in high-speed clock synchronizing circuits thanks to the simplicity of the circuitry and the low power consumption. Reference is had to the following literature which cites examples of synchronous delay circuits of this kind:

[1] The specification of Japanese Patent Application Laid-Open (KOKAI) No. 8-237091;

[2] Jin-Man Han et al., "Skew Minimization Technique for 256M-bit Synchronous DRAM and beyond." 1996 Symp. on VLSI Circ. pp. 192–193;

[3] Richard B. Watson et al., Clock Buffer Chip with Absolute Delay Regulation Over Process and Environment Variations." Proc. of IEEE 1992 CICC (Custom Integrated Circuits Conference), 25.2; and

[4] Yoshihiro OKAJIMA et al, "Digital Delay Locked Loop and Design Technique for High-Speed Synchronous Interface." IEICE TRANS. ELECTRON., Vol. E79-C, No. 6 June 1996 pp. 798–807.

As shown in FIG. 23, the synchronous delay circuit has a basic structure which includes a set of delay circuits, namely the delay circuit 901, which is used to measure a fixed time difference, and the dummy delay circuit 905 providing a delay time corresponding to the delay time td1+td2, which is obtained by adding the delay times td1 and td2 of an input buffer 903 and clock driver 904, respectively.

In order for the dummy delay circuit 905 to make the delay time equal to the sum of the delay times td1 and td2 of the input buffer 903 and clock driver 904, respectively, there are many cases where the dummy delay circuit 905 is constructed using the input buffer dummy 905A, which comprises circuitry exactly identical with that of the input buffer, and the clock driver dummy 905B.

The delay circuit 901 and delay circuit 902 each consist of delay circuits having equal delay times.

The purpose of the delay circuit 901 is to measure a fixed period of time, and the purpose of the delay circuit 902 is to reproduce this period of time. These objects can be achieved by passing the signal through the delay circuit 901 for the measured period of time and arranging it so that the signal can be passed through the delay circuit 902 using a number of delay elements equivalent to the number of delay elements traversed by the signal in the delay circuit 901.

The following approach may be adopted to enable a signal to be passed through the delay circuit 902 using a number of delay elements equivalent to the number of delay elements traversed by the signal in the delay circuit 901: The delay circuit 901 and delay circuit 902 are divided into two types depending upon their signal propagation directions and, in order to decide the length of the delay circuit 902, the delay circuits are divided into two types depending upon whether the terminus is selected or the entire path of the circuit is selected, giving four types of delay circuits.

Specifically, if the delay circuit 901 and delay circuit 902 are divided into two types depending upon their signal propagation directions, the delay circuits 901, 902 can have the same direction, with the length of the delay circuit 902 being decided on the side of its output terminals in order to decide the number of elements in the delay circuit 902, as illustrated in FIGS. 26 and 27, or the delay circuits 901, 902 can have opposite signal propagation directions, with the length of the delay circuit 902 being decided on the side of its input terminals in order to decide the number of elements in the delay circuit 902, as depicted in FIGS. 24 and 25.

Further, in order to decide the length of the delay circuit 902, there are two types of arrangements, namely one in which the terminus is selected and one in which the entire length of the delay circuit is selected, i.e., two approaches are available, namely one in which the terminus is selected, as shown in FIGS. 24 and 27, and one in which the entire path of the delay circuit is selected, as shown in FIGS. 25 and 26.

It should be noted that FIG. 24 corresponds to the approach described in Reference [1], namely the specification of Japanese Patent Application Laid-Open (KOKAI) No. 8-237091, the application for which was filed by the present inventor.

The arrangement illustrated in FIG. 25 corresponds to the approach described in Reference [4] (IEICE TRANS. ELECTRON., Vol. E79-C, No. 6 June 1996 pp. 798–807).

The arrangement illustrated in FIG. 26 corresponds to the approach described in Reference [2] (1996 Symp. on VLSI Circ. pp. 192–193).

The arrangement illustrated in FIG. 27 corresponds to the approach described in Reference [3] (Proc. of IEEE 1992 CICC 25.2) and Reference [4] (1996 Symp. on VLSI Circ. pp. 112–113).

SUMARRY OF THE DISCLOSURE

For the discussion, reference will be had to the schematic views and timing charts shown in FIGS. 28 and 29 to describe an operation through which clock skew is eliminated.

(1) Clock delay when synchronous delay circuit is not used

FIG. 28 illustrates an instance where a synchronous delay circuit is not used. As shown at (a) in FIG. 28, an external clock 906 is utilized as an internal clock 907 upon being directed through the input buffer 903 and clock driver 904. The delay time difference between the external and internal clocks is decided by the delay time td1 of the input buffer 903 and the delay time td2 of the clock driver 904. The sum of these delay times, namely td1+td2, is the clock skew.

(2) Principle underlying elimination of clock delay when synchronous delay circuit is used In order to eliminate clock skew effectively, a synchronous delay circuit utilizes the fact that a clock pulse enters at the clock period tCK. More specifically, a delay circuit providing a delay time of tCK−(td1+td2) is disposed between the input buffer (delay time td1) and the clock driver (delay time td2) and it is so arranged that the sum of the delay times will be equal to the clock period tCK [=td1+tCK−(td1+td2)+td2]. As a result, the timing of the internal clock output from the clock driver becomes equal to the timing of the external clock.

(3) Method of eliminating clock delay when synchronous delay circuit is used

A timing chart illustrating signal timing when a illustrating signal timing when a synchronous delay circuit is actually used is illustrated in FIG. 29.

The operation of the synchronous delay circuit requires two cycles.

The first cycle is used to measure the delay time tCK−(td1+td2), which is dependent upon the period of the clock, and to decide the length of the delay of the delay circuit that reproduces the delay quantity tCK−(td1+td2).

The next cycle is used to apply the delay quantity tCK−(td1+td2).

In the first cycle, the dummy delay circuit 905 of the clock driver 904 and the delay circuit 901 are used to measure the delay time tCK−(td1+td2) dependent upon the clock cycle.

The output of the input buffer 903, namely the first pulse of two successive pulses in the external clock 906, is allowed to traverse the dummy delay circuit 905 and delay circuit 901 during one clock period tCK, which lasts until the second pulse is output from the input buffer 903. Since the delay time of the dummy delay circuit 905 is td1+td2, the time required for a pulse to propagate through the delay circuit 901 is tCK−(td1+td2).

The delay time of the delay circuit 902 is set so as to be equal to the time tCK−(td1+td2) required for a pulse to travel through the delay circuit 901.

Methods of setting the delay time of the delay circuit 902 can be classified into the four types mentioned above, and each makes it possible to attain the desired objective.

In the next cycle, the clock that emerges from the input buffer 903 passes through the delay circuit 902 of delay tCK−(td1+td2) and exits from the clock driver 904 to generate the internal clock 907 whose delay quantity is exactly the clock cycle tCK.

The process described above provide the internal clock 907, which is free of clock skew, in two clock cycles.

Following problems have been encountered in the course of the investigations toward the present invention.

Thus, in order to reduce external clock jitter before the external clock is used as the internal clock in the conventional clock control circuit, a feedback circuit such as a PLL is required. The feedback circuit needs a long clock period in order for the clock to stabilize and it is difficult, therefore, to attain a high-speed response. Another problem is that the synchronization characteristic is degraded by jitter.

A problem encountered with a DLL is that external clock jitter propagates intact into the internal circuitry through the delay circuit.

A synchronous delay circuit is disadvantageous in that this circuit also causes an increase in external clock jitter.

Accordingly, an object of the present invention is to provide a clock control circuit and control method for reducing jitter.

Another object of the present invention is to provide a delay-locked loop circuit, a phase synchronizing loop and a synchronous delay circuit.

According to the present invention, the foregoing objects are attained by providing a clock control circuit having a timing averaging circuit generating a signal having a time component obtained by averaging an input time difference between two signals input with a fixed time difference between them, and means (or stage) which supplies the timing averaging circuit with different pulses of a clock signal, wherein a time difference between the different pulses is subjected to internal division.

Further, the present invention provides a clock control circuit having a timing averaging circuit generating a signal having a time component obtained by averaging an input time difference between two signals input with a fixed time difference between them, and a circuit supplying the timing averaging circuit with different pulses of a clock signal, wherein a DLL circuit is equipped with a circuit internally dividing a time difference between these different pulses, the circuit having an external clock input and an internal clock input used in a phase comparison, the output of the circuit being applied to a voltage-controlled delay circuit.

Further, the present invention provides a synchronous delay circuit for controlling a clock signal, comprising: a first delay circuit chains through which a pulse or a pulse edge is caused to travel for a fixed period of time; a second delay circuit chains, to which a signal from the first delay circuit chains is input, that is capable of passing a pulse or pulse edge along a length proportional to the length along which the pulse or pulse edge traveled through the first delay circuit chains; a clock driver for outputting an internal clock from an output of the second delay circuit chains; and a timing averaging circuit, to which are input a clock signal from an input buffer and an output from an input buffer dummy having a delay time equivalent to that of the input buffer on the internal clock signal output via the clock driver, for generating and outputting a signal having a time difference obtained by internally dividing the time difference between these two signals, wherein an output of the timing averaging circuit chains is supplied to the first delay circuit chains via the dummy delay circuit.

It should be noted that an arrangement may be adopted in which travel of the clock through the first delay line is halted for a period of time equivalent to time required for travel through through input buffer dummy and clock driver.

Further aspects of the present invention are disclosed in the entire claims which constitute part of the entire disclosure and may be understood in conjunction with the disclosure of the embodiments.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 1 is a block diagram useful in describing an embodiment of the present invention;

FIGS. 4(a) to 4(c) are diagrams useful in describing an embodiment of the present invention;

FIG. 8 is a block diagram useful in describing the construction of an embodiment according to the present invention;

FIGS. 23(a) and 23(b) are diagrams showing the construction of a clock control circuit using a synchronous delay circuit according to a basic structure.

FIGS. 29(a) and 29(b) are diagrams showing the construction of a clock control circuit using a synchronous delay circuit according to a basic structure;

FIG. 32 is a diagram showing the construction of a clock control circuit using a synchronous delay circuit according to an embodiment of the present invention;

* Embodiments of FIGS. 23 to 29 substantially correspond to FIGS. 9–15 of copending U.S. patent application Ser. No. 09/087,864 filed on Jun. 1, 1998 by the same inventor (applicant) as the present invention, the entire disclosure whereof is incorporated herein by reference.

PREFERRED EMBODIMENTS OF THE INVENTION

Modes for practicing the present invention will now be described.

[First Mode of the Present Invention]

As shown in FIG. 1, a first preferred mode for practicing the present invention has a timing averaging circuit 1 for averaging the cycles between pulses of a clock signal from an input buffer 3 (or clock dividing circuit), and a timing averaging circuit 2 connected, in cascade form, to the output of the timing averaging circuit 1 as necessary.

Figure 2:
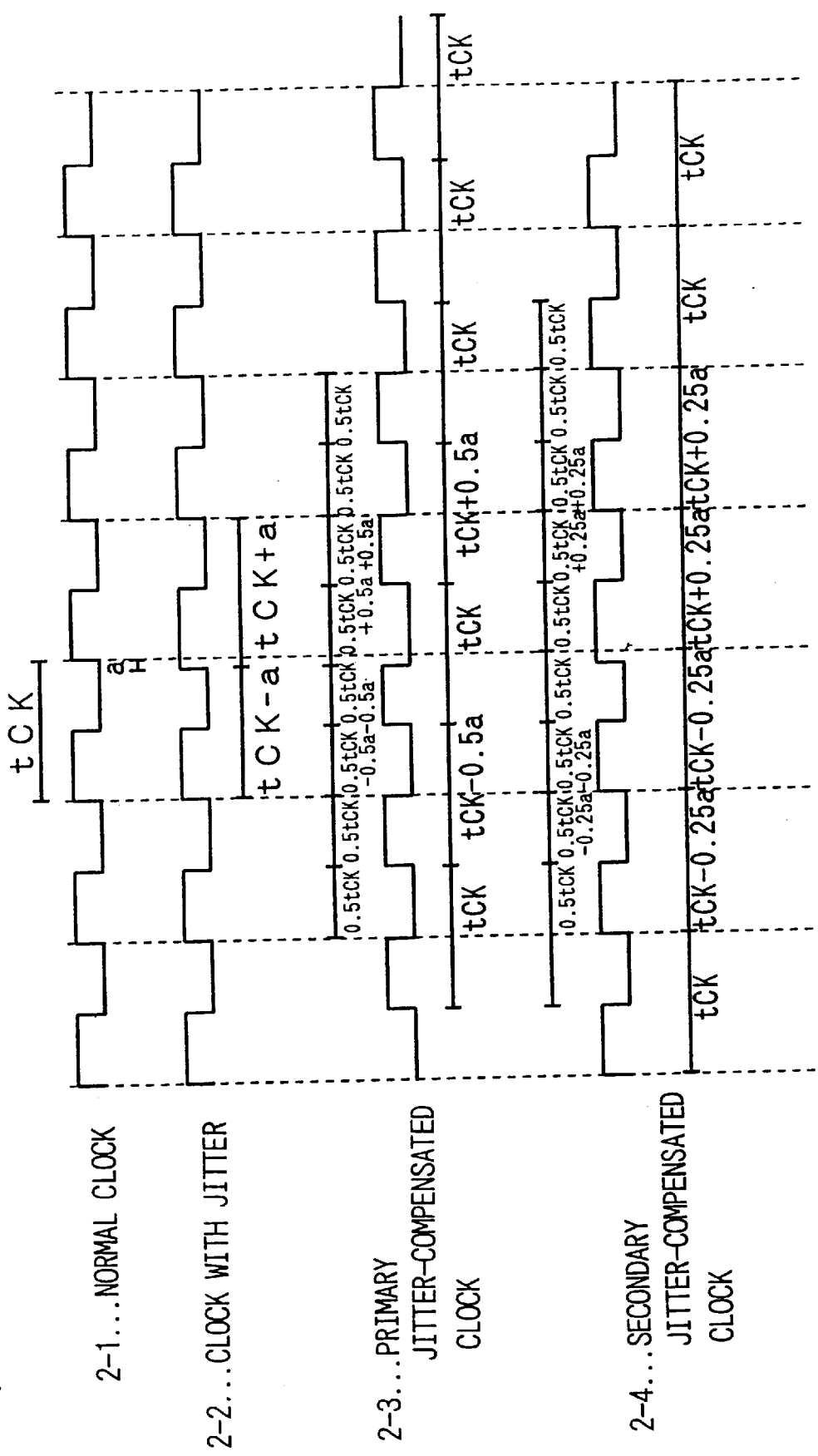
FIG. 2 is a timing chart useful in describing the principle of operation of an embodiment of the present invention.

FIG. 2 shows the waveforms of basic operating signals useful in describing the principle of operation of this mode of the present invention. If a clock 2-2 with a jitter component "a" with respect to a normal clock (2-1) enters, the jitter component has cycles of tCK+a and tCK−a with respect to the cycle tCK of the normal clock (2-1).

The jitter component of a primary jitter-compensated clock (2-3), which is obtained by passing the clock (2-2) with jitter through the first timing averaging circuit 1 of FIG. 1, is averaged along the time axis, as a result of which the jitter component becomes 0.5 a.

The jitter component of a secondary jitter-compensated clock (2-4), which is obtained by passing the primary jitter-compensated clock (2-3) through the second timing averaging circuit 2, becomes 0.25 a.

Thus, jitter is compensated for by a timing averaging circuit for averaging the cycles of the clock, and a plurality of such timing averaging circuits are connected in series to double (or amplify) the effectiveness of jitter suppression.

Various embodiments related to this mode for practicing the present invention will now be described.

[Embodiment 1-1]

Figure 3:
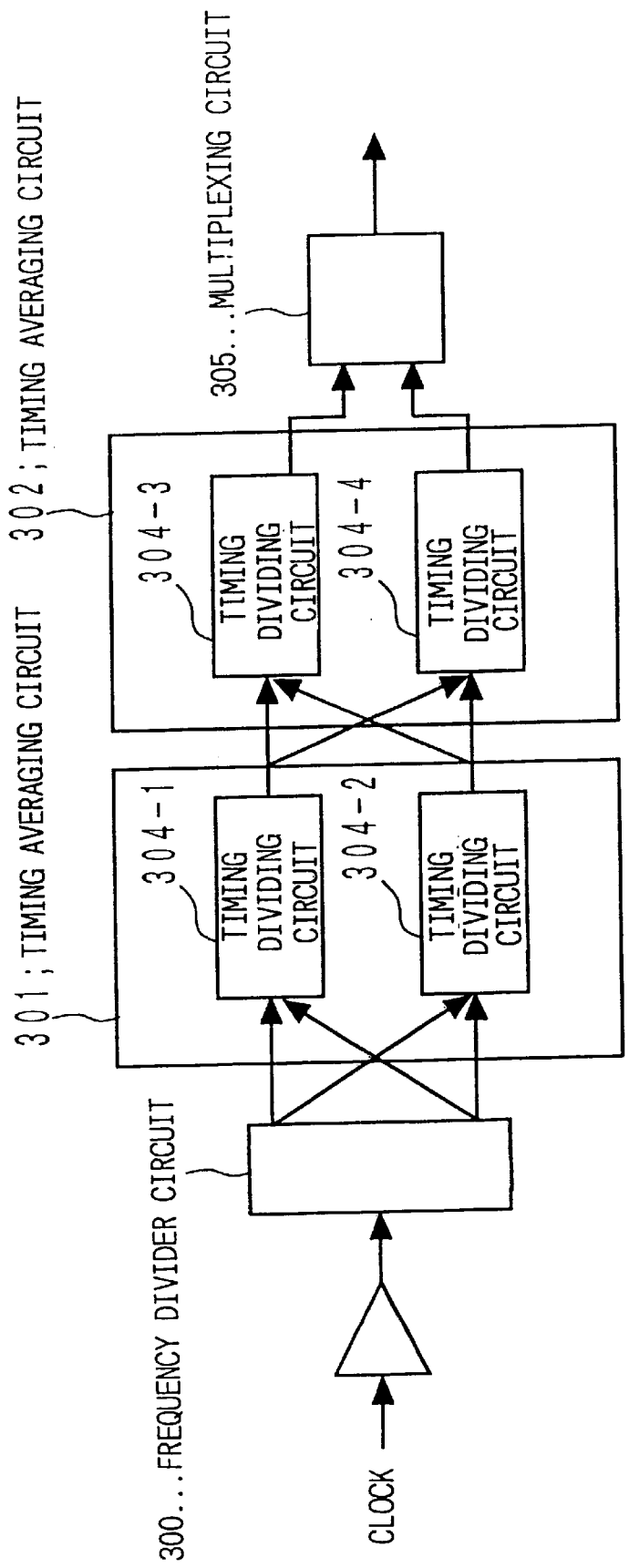
FIG. 3 is a block diagram useful in describing the construction of an embodiment according to the present invention.

FIG. 3 is a diagram useful in describing a first embodiment of the present invention. According to this embodiment, averaging of the timing of a clock signal is performed using a 2-phase clock. To accomplish this, a frequency divider (a divide-by-two divider) 300 for generating a 2-phase clock is disposed in forestage of timing averaging circuits 301, 302. In order to average the timings of the edges of the 2-phase clock, the timing averaging circuit 301 is composed of timing dividing circuits 304-1, 304-2 arranged in parallel in a number equal to the number of clock phases. Similarly, the timing averaging circuit 302 is constituted by timing dividing circuits 304-3, 304-4 arranged in parallel. The outputs of the timing dividing circuits 304-1, 304-2 are input to the timing dividing circuits 304-3, 304-4, which proceed to output signals representing the averaged timings of these input signals. The outputs of the timing dividing circuits 304-3, 304-4 of timing averaging circuit 302 output upon being multiplexed by a multiplexer circuit 305. Thus, a clock signal whose frequency is identical with that of the input clock is obtained as an output.

Figure 5:
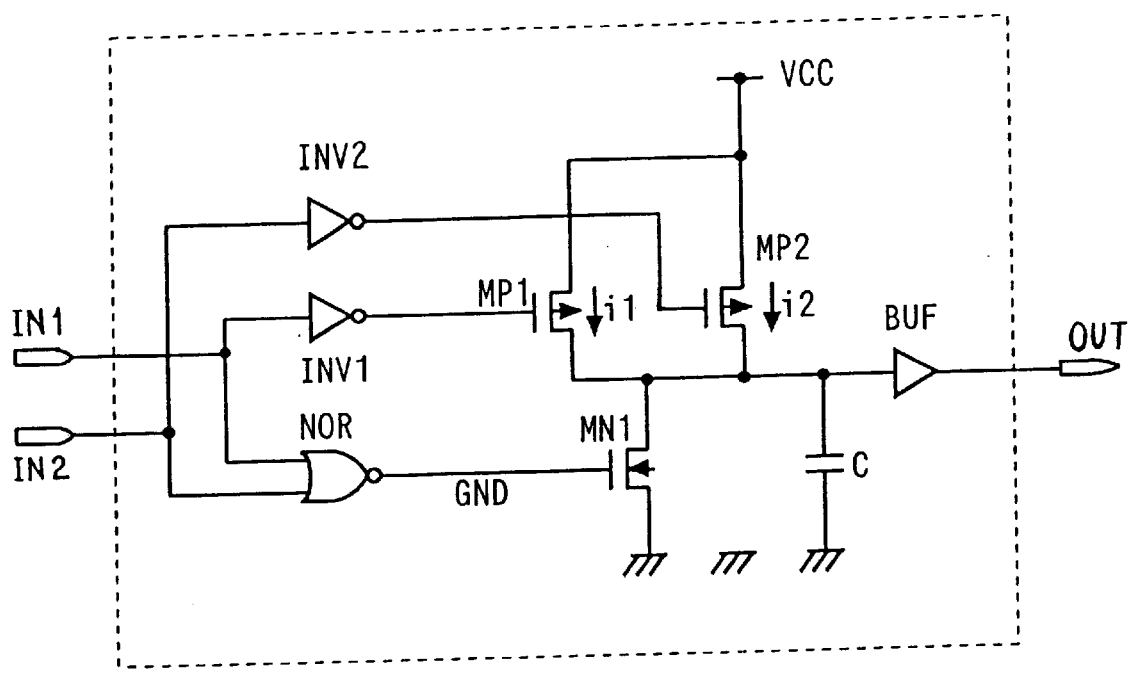
FIGS. 5(a) and 5(b) illustrate the construction of an embodiment of the present invention.
Figure 5:
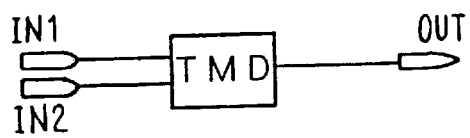

FIG. 4 is a diagram useful in describing the principle of operation of a timing dividing circuit (TMD) according to this embodiment of the present invention, and FIG. 5 is a diagram illustrating an example of the construction of the timing dividing circuit (TMD) according to this embodiment of the present invention.

According to this embodiment of the present invention, as shown in FIG. 5, first and second inputs IN1, IN2 are inverted by inverters INV1, INV2, and the outputs of the inverters INV1, INV2 are applied to the gates of PMOS transistors MP1, MP2, respectively, the drains of which are tied together and the sources of which are connected to a power supply VCC. The drains of the PMOS transistors MP1, MP2 are connected to the drain of a grounded-source NMOS transistor MN1 and to a capacitor C (or to a load capacitance at the output). Connected to the gate of the NMOS transistor MN1 is the output of a NOR gate NOR, the inputs to which are the first and second inputs IN1, IN2. The potential at the junction (output node) of the PMOS transistors MP1, MP2 and the NMOS transistor MN1 is output as a logic signal to an output terminal OUT through an output buffer BUF.

The PMOS transistor MP1 is turned on by the rising edge of the first input signal IN1, the timing of the positive-going transition of which is earlier among those of the first and second input signal IN2, as a result of which a current from the power supply flows through the PMOS transistor MP1 to charge the capacitor C (or the load capacitance). Next, the PMOS transistor MP2 is turned on by the transition (rising edge) of the second input signal IN2, as a result of which the capacitor C is charged through both of the conducting PMOS transistors MP1, MP2. The logical output OUT is produced at the threshold-value voltage of the buffer BUF, whose input is the terminal voltage of the capacitor C (or the load capacitance of the output node). With respect to the rising edge of the first input signal IN1, the signal OUT has a time difference obtained by internally dividing the time difference between the first and second input signals IN1, IN2.

The principle of timing division according to this embodiment of the present invention is as illustrated at (c) in FIG. 4. As shown at (a) in FIG. 4, three timing dividing circuits (TMD) having the construction shown in FIG. 5 are provided with respect to the two clock inputs IN1, IN2 having a time difference between them. If the signal IN1 is applied to both of the first and second input terminals of the first TMD, the signals IN1 and IN2 are applied to respective ones of the first and second input terminals of the second TMD, and the signal IN2 is applied to both of the first and second input terminals of the third TMD, then the signal waveforms of outputs OUT1 to OUT3 of the first to third TMDs will be as shown at (b) of FIG. 4.

Thus, it will be understood that a time difference T (equal to the period of the clock) exists between the rising edges of the signals IN1 and IN2, and that the output OUT2 of the second TMD, whose inputs are the signals IN1, IN2, appears at a timing approximately midway between the output OUT1 of the first TMD and the output OUT3 of the third TMD.

The signal waveforms A1, A2 and A3 at FIG. 4(b) represent the signal waveforms of the terminal potential of capacitor C produced by charging of the capacitor C in FIG. 5. Outputs obtained by converting these signal waveforms A1, A2 and A3 to logic values at the buffer are the signals OUT1, OUT2 and OUT3, respectively. The signal waveforms A1 and A3 indicate the terminal voltage of the capacitor C in a state in which the PMOS transistors MP1 and MP2 of FIG. 5 are conducting simultaneously to charge the capacitor C by a current equal to i1+i2. The signal waveform A2 indicates the terminal voltage of the capacitor C in a case where the PMOS transistor MP1 of FIG. 5 is turned on to charge the capacitor C by current i1 over a first period of time T (the gradient of the signal waveform A2 over this period of time is smaller than the gradients of the signal waveforms A1 and A3), after which the PMOS transistor MP2 is turned on to charge the capacitor C by the current i1+i2 (the gradient of the signal waveform A2 over this second period of time is the same as the gradients of the signal waveforms A1 and A3).

In other words, with reference to FIG. 5, first the capacitor C is charged by the PMOS transistor MP1 for the first period of time equal to the clock period T, then the capacitor C is charged by the PMOS transistors MP1 and MP2, thereby producing a time difference of T/2 (t2=T/2+t1) in comparison with a case where the capacitor is charged by both PMOS transistors MP1 and MP2 from the start. Furthermore, as indicated in FIG. 4(c), we have the following:

$t1=C*V/(i1+i2)$ $t2=T+(C*V-i1*T)/(i1+i2)=T[i2/(i1+i2)]+t1$ $t3=T+C*V/(i1+i2)$

When i1=i2 holds, we have t2=t1+T/2, where T represents the clock period (the time difference between the signals IN1 and IN2), C the capacitance of the capacitor C, V the voltage across the capacitor C, and i1, i2 the currents that flow when the PMOS transistors MP1, MP2 turn on.

[Embodiment 1-2]

Figure 6:
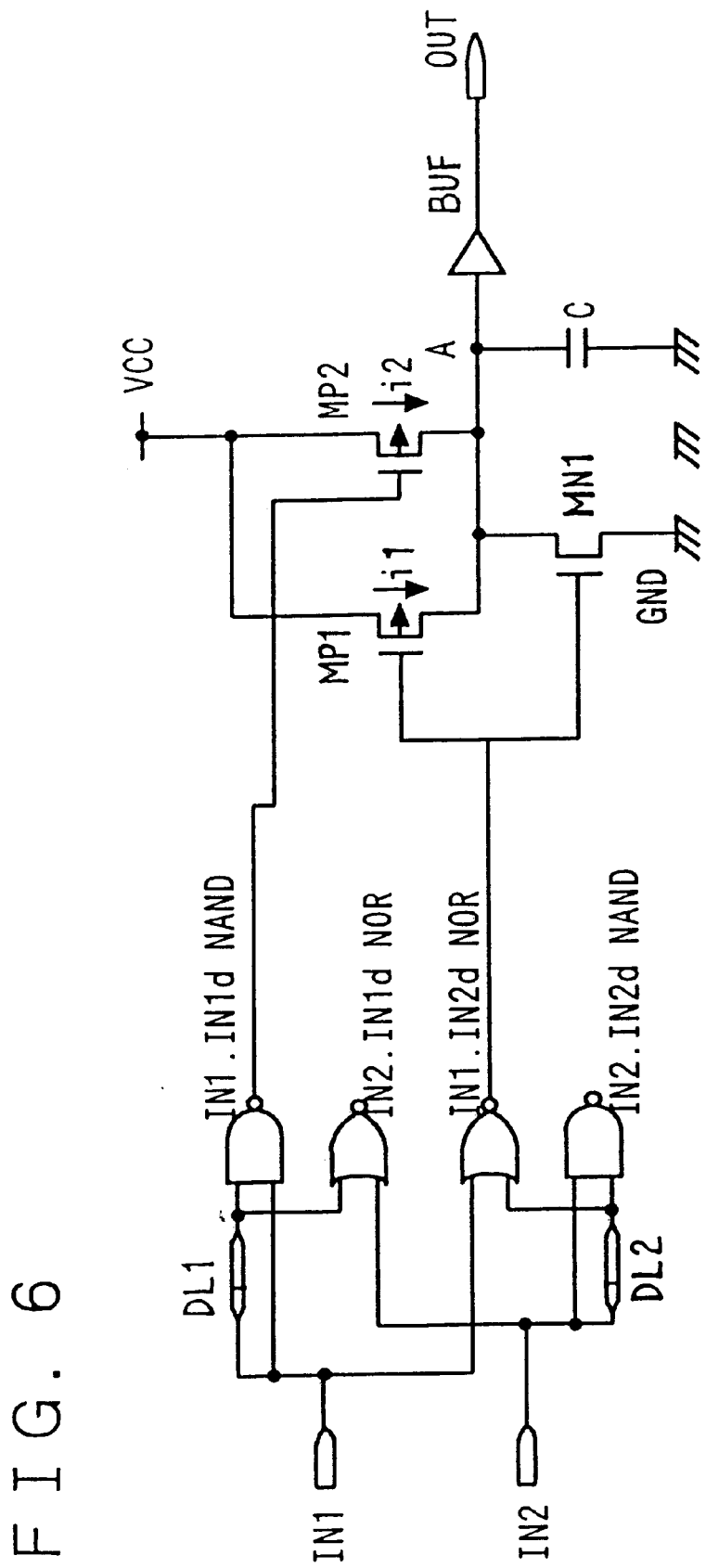
FIG. 6 illustrates the construction of an embodiment of the present invention.

FIG. 6 is a diagram illustrating an example of the construction of the timing dividing circuit (TMD) according to a second embodiment of the present invention. Since a 2-phase clock is used as the clock signal, timing division is performed using complementary signals. With this timing dividing circuit, therefore, three intervals are required, namely a first interval over which charging is performed by one of the PMOS transistors MP1, MP2, a second interval over which charging is performed by both PMOS transistors MP1 and MP2, and a third interval over which the accumulated charge is discharged.

Figure 7:
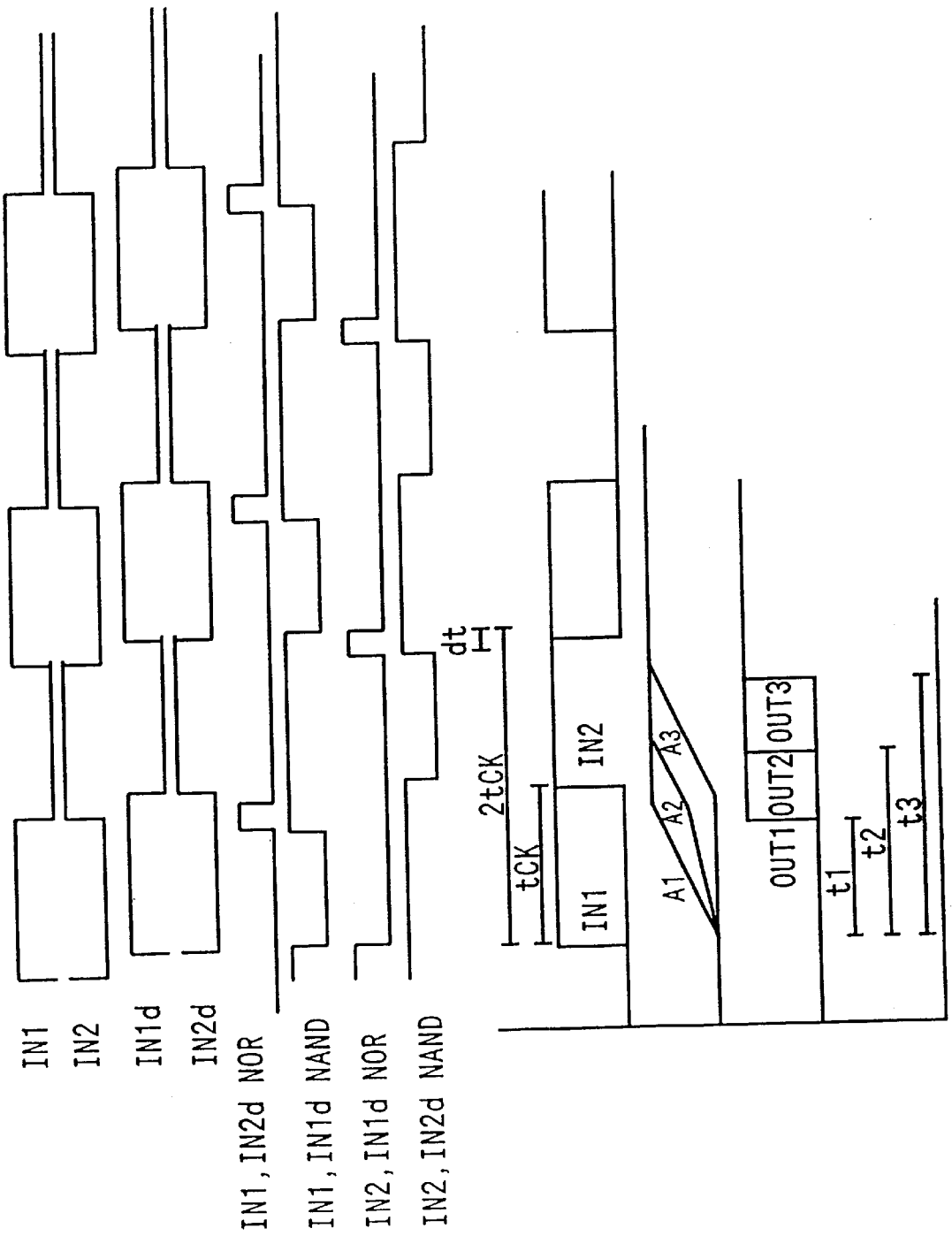
FIG. 7 is a timing chart useful in describing the operation of an embodiment of the present invention.

To accomplish this, as shown in FIG. 6, the output IN1.IN1d.NAND of a NAND gate whose inputs are the signal IN1 and a signal IN1d obtained by delaying the signal IN1 by a delay element DL1 is connected (fed) to the gate of the PMOS transistor MP2, which forms a switch for charging the capacitor C; and the output IN1.IN2d.NOR (the period of the signals IN1, IN2 is 2tCK) of a NOR gate whose inputs are the signal IN1 and a signal IN2d obtained by delaying the signal IN2 (the time difference whereof with respect to the signal IN1 is the period tCK) by a delay element DL2 is connected (fed) to the gate of the PMOS transistor MP1, which forms a switch for charging the capacitor C, and to the gate of an NMOS transistor MN1, which forms a switch for discharging the capacitor C, whereby the NAND gates each generate a one-shot pulse. This produces the first interval over which charging is performed by the one PMOS transistor MP1, the second interval over which charging is performed by both PMOS transistors MP1 and MP2, and the third interval over which the accumulated charge is discharged by turning on the NMOS transistor MN1. The signal waveforms associated with the circuit shown in FIG. 6 are illustrated in FIG. 7. The signal waveform A1, A2, A3 is the voltage at node A in FIG. 6, and the output signal OUT1, OUT2, OUT3 is the output of the buffer BUF.

[Embodiment 1-3]

A third embodiment will be described with reference to FIGS. 8 and 9. Averaging of timing is performed in this embodiment using a 4-phase clock. To accomplish this, a frequency divider 603 for generating a 4-phase clock is disposed in forestage of timing averaging circuits 601, 602.

Figure 9:
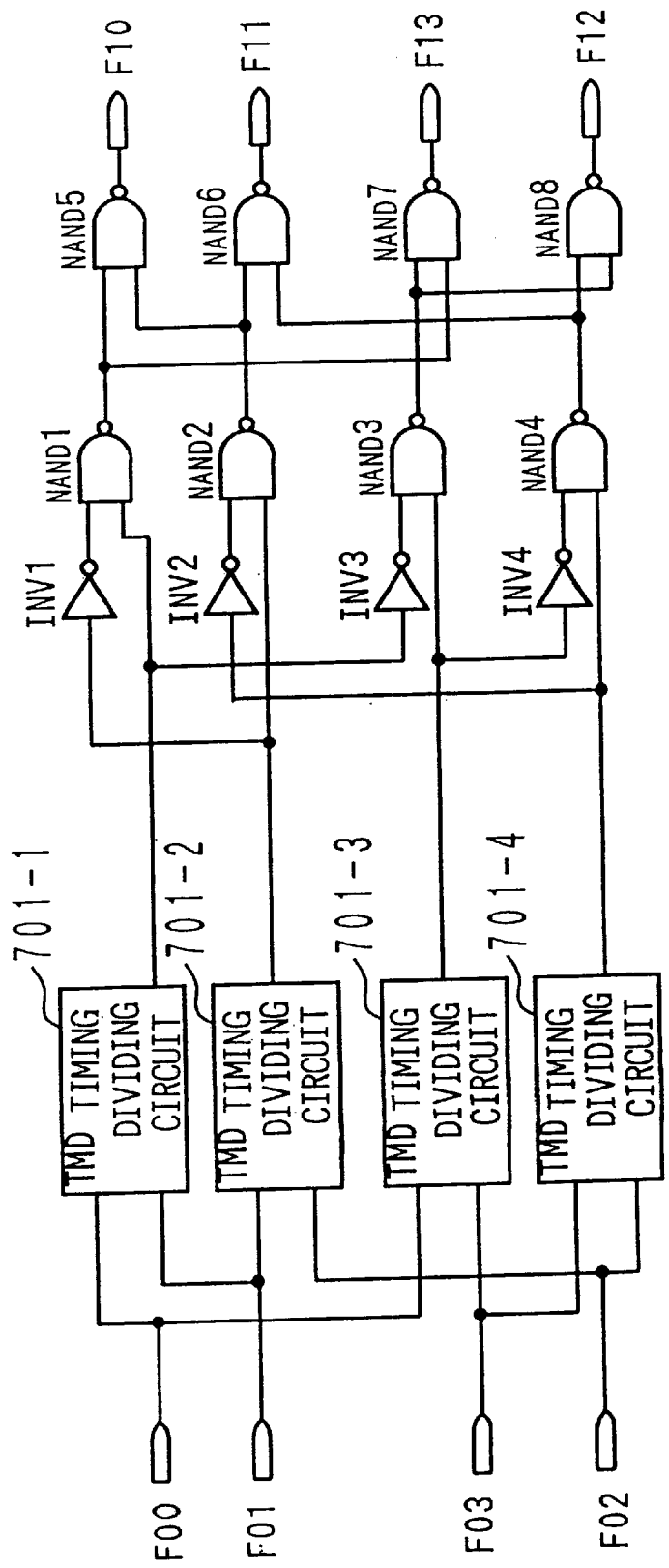
FIG. 9 is a diagram useful in describing the construction of an embodiment according to the present invention.

In order to average the timings of the edges of the 4-phase clock, the timing averaging circuit is composed of timing dividing circuits TMD 701-1 to 701-4 arranged in parallel in a number equal to the number of clock phases, as shown in FIG. 9. NAND gates NAND1 to NAND4 each output a one-shot pulse based upon every two outputs from among the outputs produced by the timing dividing circuits TMD 701-1 to 701-4, and outputs of pairs of the NAND gates NAND1 to NAND4 are combined by NAND gates NAND5 to NAND8, whereby a 4-phase clock of reduced jitter is produced.

Though the number of clock phases increases with this embodiment, the fact that a 4-phase clock is used makes it unnecessary to generate a one-shot pulse. This is advantageous in that it is possible to cope with a clock having a correspondingly higher frequency.

The methods of reducing jitter using a multiphase clock according to the first to third embodiments are applicable in a case where the number of clock phases is two or more.

Further, since a multiphase clock is regenerated by the timing averaging circuit, an advantage is that any number of stages can be connected in series.

Figure 10:
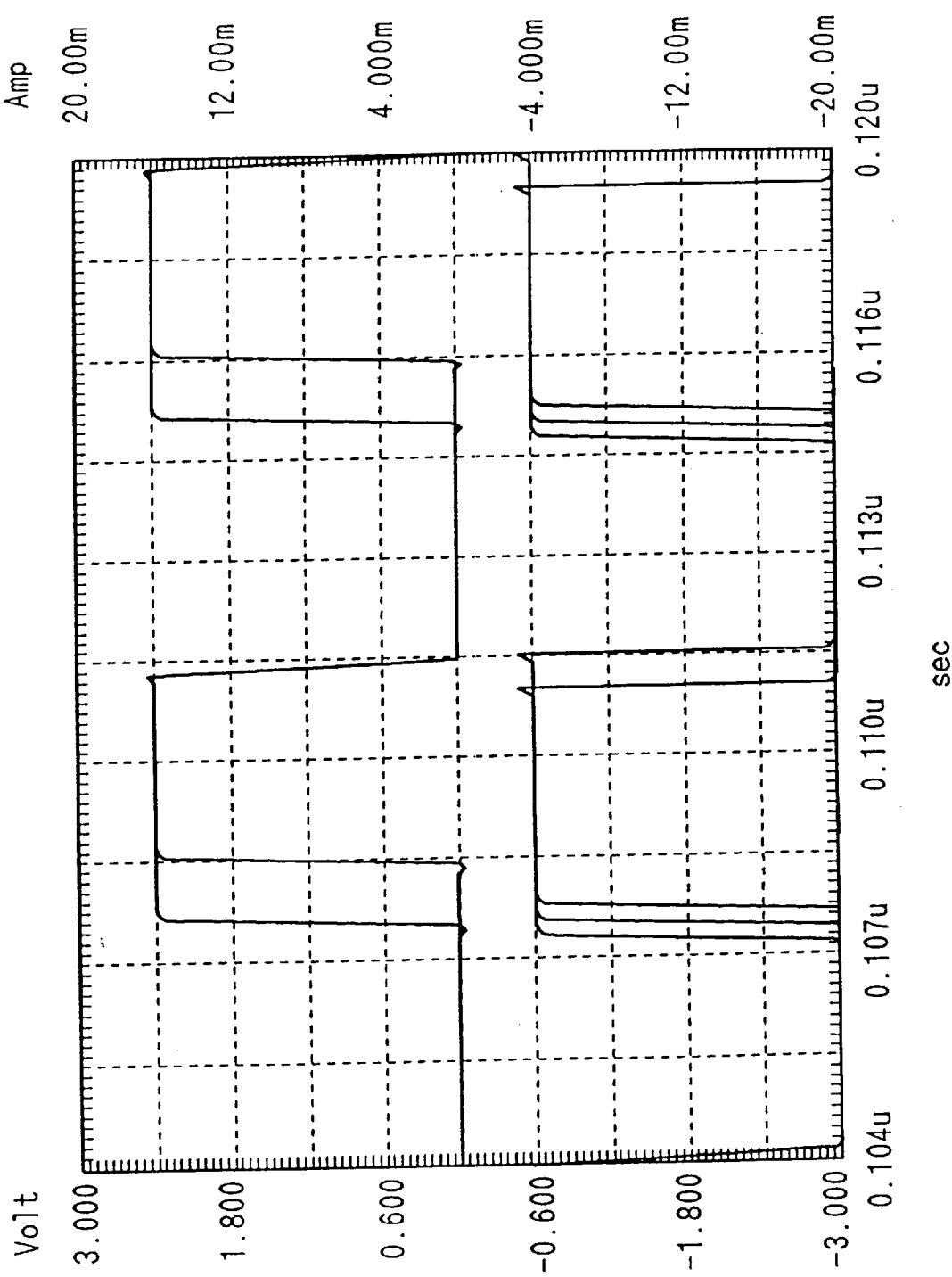
FIG. 10 is a signal waveform diagram showing the effects of a simulation according to an embodiment of the present invention.
Figure 11:
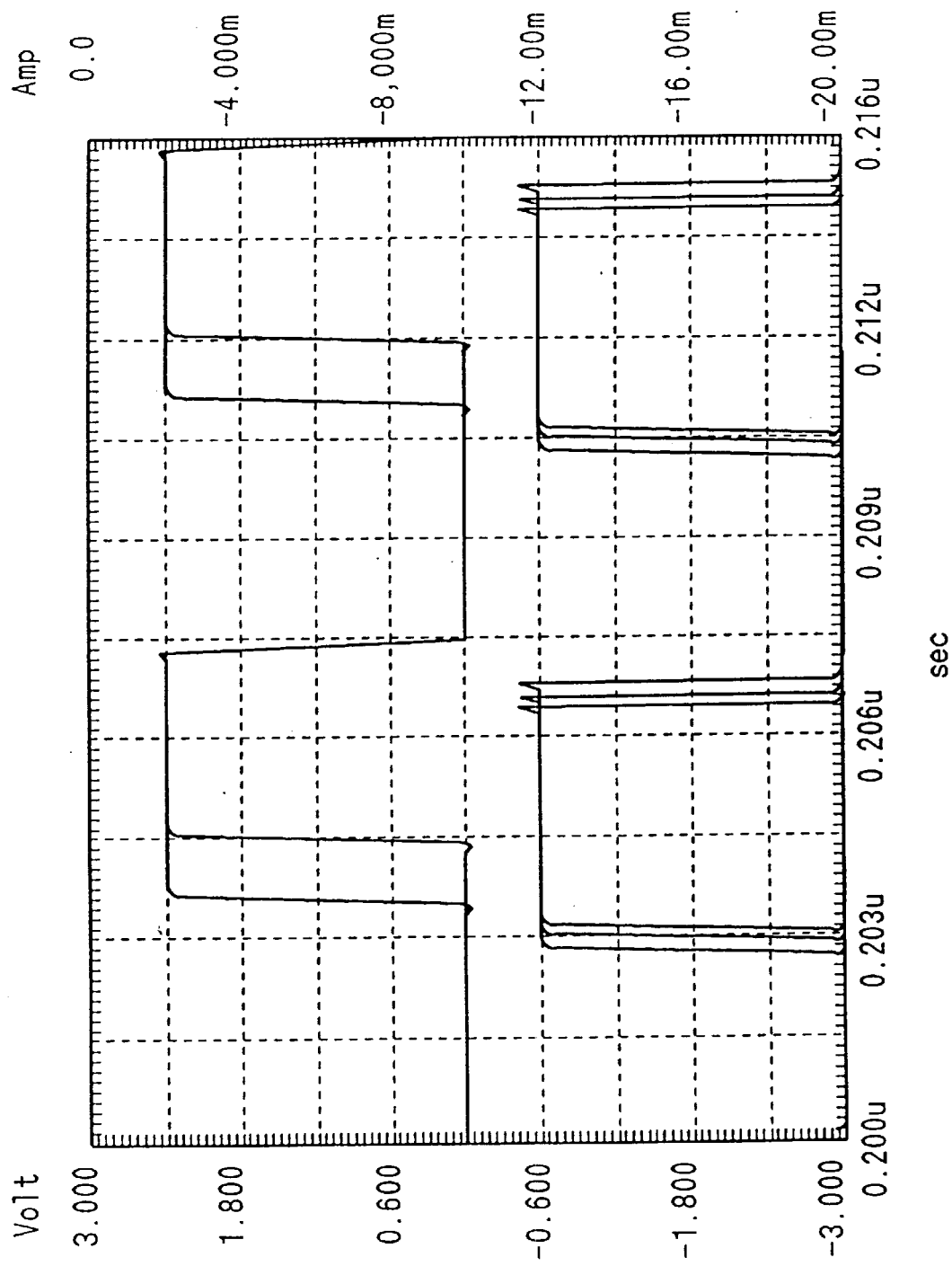
FIG. 11 is a signal waveform diagram showing the effects of a simulation according to an embodiment of the present invention.

FIGS. 10 to 11 are diagrams illustrating an example of the results of circuit simulations illustrating the effects of jitter reduction according to this embodiment of the present invention. An input clock (the signal waveform at the top of FIG. 10) is composed of clock pulses having a period of 8 ns the timing of which is displaced once by 1 ns per four pulses. As for the eye pattern of the input pulses, the shift of 1 ns is approximately halved by the first stage of the timing averaging circuit and is halved again by the second stage thereof (see FIG. 11).

[Embodiment 1-4]

Figure 12:
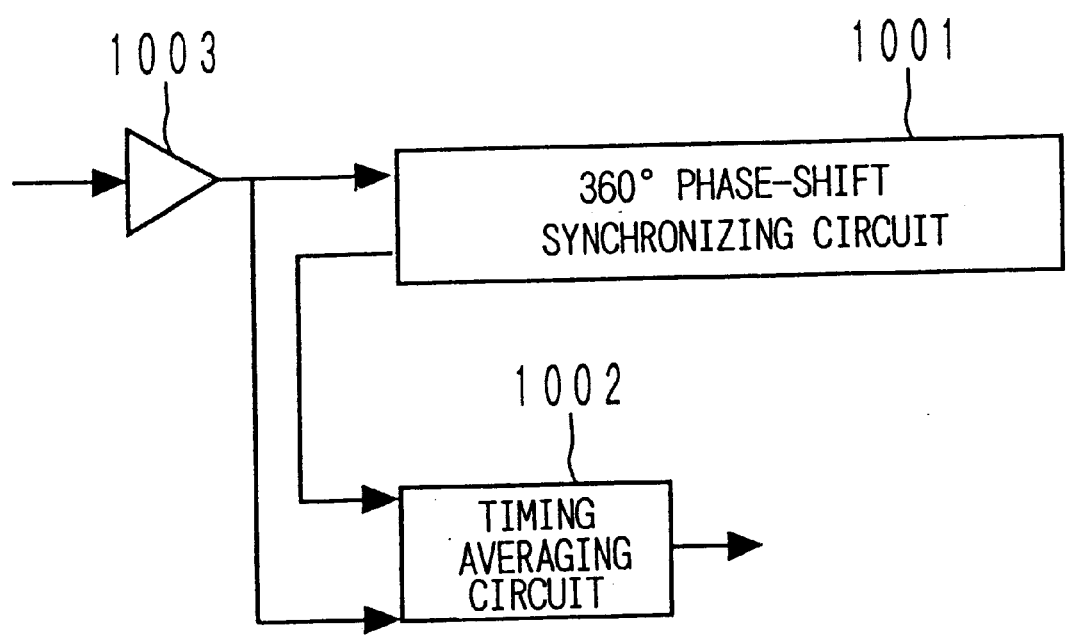
FIG. 12 is a block diagram showing the construction of an embodiment of the present invention.

A fourth embodiment of the present invention will now be described. FIG. 12 is a diagram showing the construction of the fourth embodiment. As shown in FIG. 12, a clock that has entered from an input buffer 1003 has its phase delayed by a clock-cycle fixed delay circuit (a 360 degrees phase shifter) 1001 giving a delay corresponding to the clock-cycle. This delayed clock and the undelayed clock that is obtained from the input buffer have their timings averaged by a timing averaging circuit 1002, whereby jitter is reduced.

Figure 13:
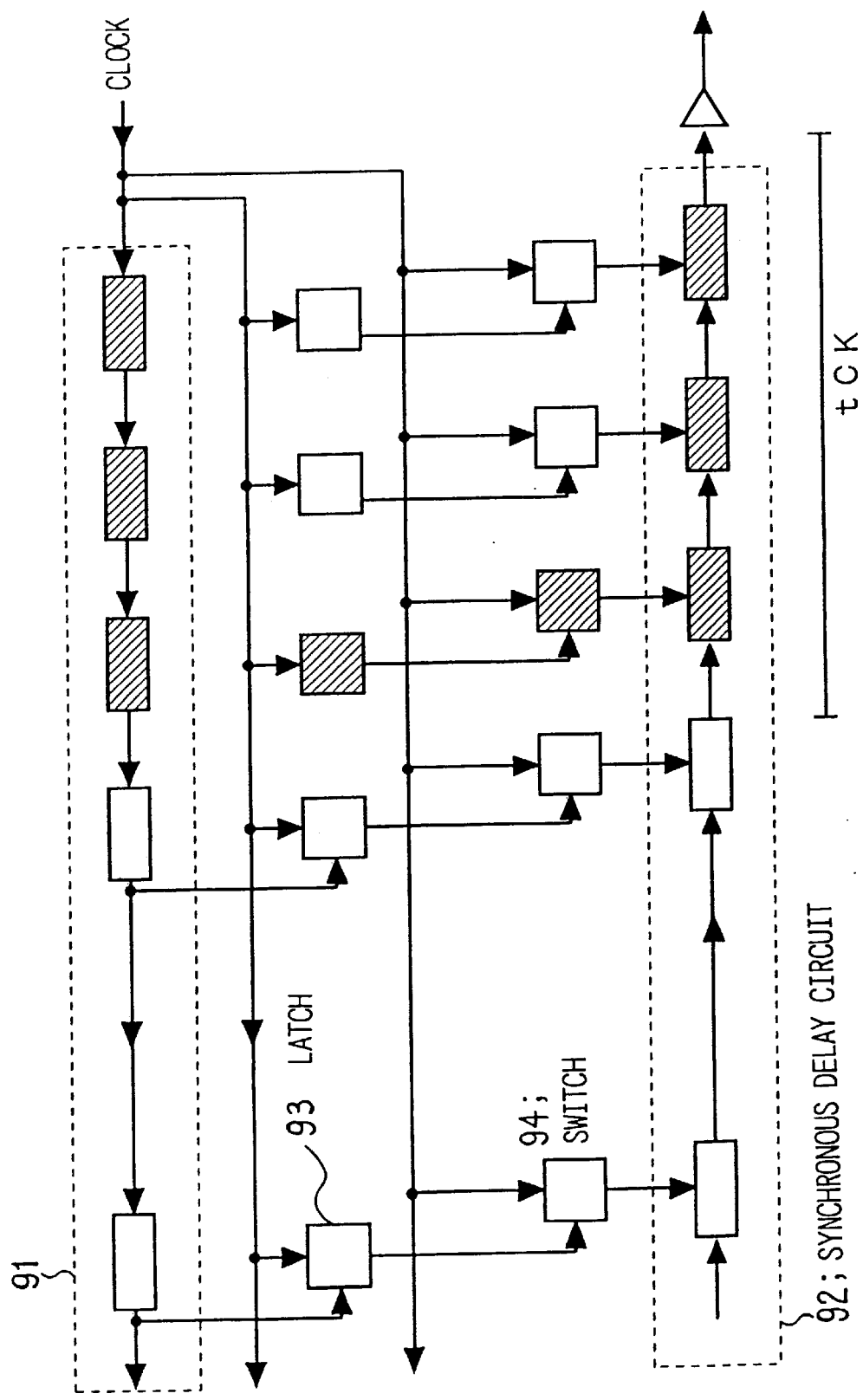
FIG. 13 is a diagram showing the construction of a fixed phase delay circuit according to an embodiment of the present invention.

As shown in FIG. 13, the fixed delay circuit is such that the clock cycle is measured by one delay circuit 91 of a pair of delay circuits and is reproduced by the other delay circuit 92 of the pair. At the moment the clock input to the delay circuit 91 propagates through the delay circuit 91, which takes a length of time equal to the clock period tCK, the next clock pulse enters, is latched by a latch circuit 93 at this position and then is input to the delay circuit 92.

Figure 14:
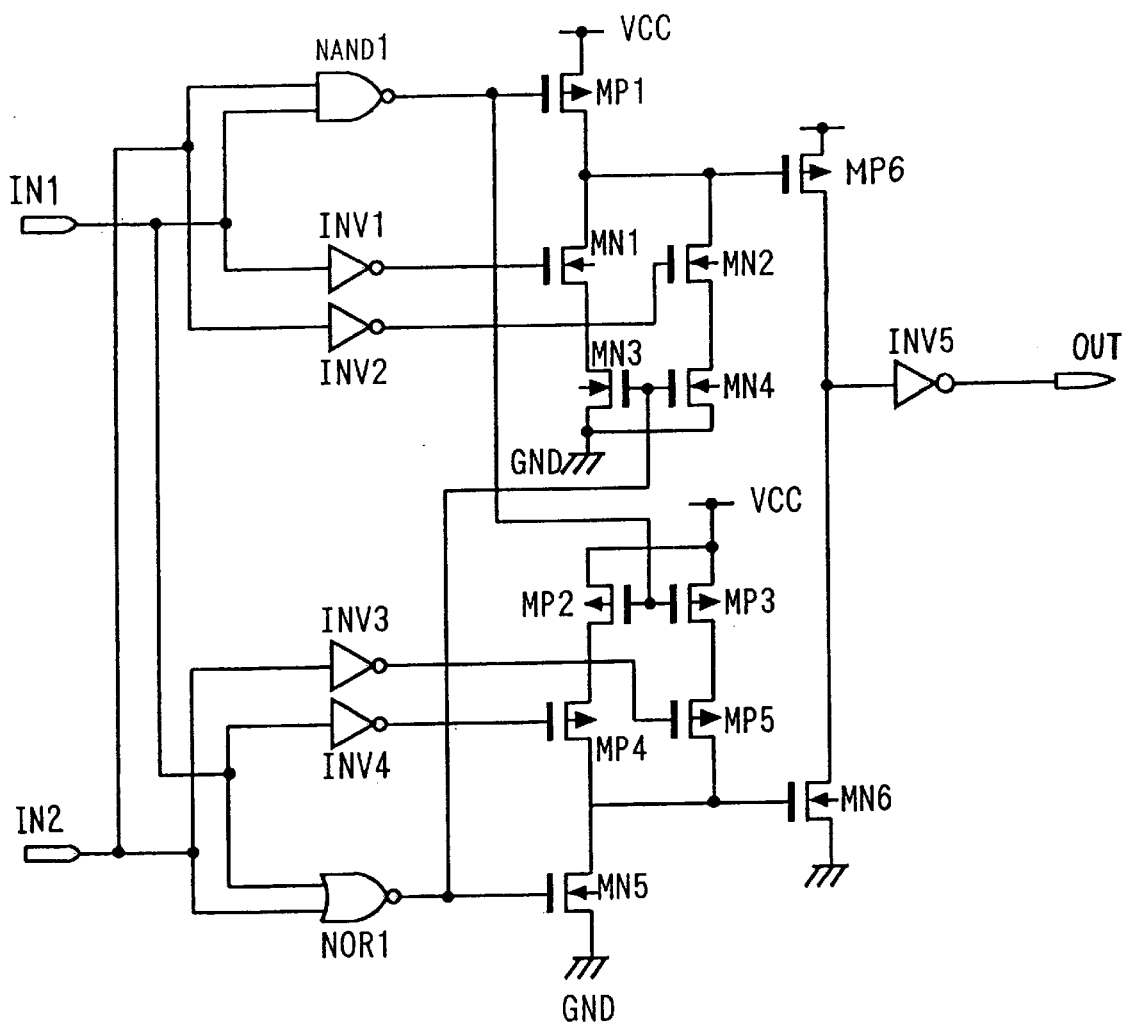
FIG. 14 is a diagram showing the construction of an embodiment of the present invention.

In this embodiment, the timing averaging circuit may be so adapted that the timings of both the rising and falling edges are averaged by the circuitry shown in FIG. 14. The circuitry shown in FIG. 14 utilizes internal transistors of NAND gates (MN3, MN1, MP1, etc.) and NOR gates (MN5, MP4, MP2, etc.) as parallel MOS transistors.

As shown in FIG. 14, transistors MN1, MN2 having input signals IN1, IN2 connected to their gates via inverters INV1, INV2, respectively, turn on successively when the high level of the input signals IN1, IN2 fall to the low level, thereby controlling the discharging of electric charge in the load capacitor of the commonly connected output (the gate node of transistor MP6, which takes on the power supply potential VCC via the transistor MP1 when the input signals IN1, IN2 are at the high level). When the gate potential of the transistor MP6 reverts to the low level, the transistor MP6 turns on and the timings of the falling edges of the output of inverter INV5 are averaged.

Transistors MP5, MP4 having the input signals IN1, IN2 connected to their gates via inverters INV3, INV4, respectively, turn on successively when the low level of the input signals IN1, IN2 rise to the high level, thereby charging the commonly connected output (the gate node of transistor MN6, which takes on ground potential via the transistor MN5 when the input signals IN1, IN2 are at the low level). When the gate of the transistor MN6 rises to the high level, the transistor MN6 turns on and the timings of the rising edges of the output of inverter INV5 are averaged.

According to this embodiment, using the clock-cycle fixed delay circuit is convenient in that a difference in the timings of the clock pulses input to the timing averaging circuit can be made small, and in that the timing averaging circuit can be realized by basic logic elements such as NAND and NOR gates. Further, using the clock-cycle fixed delay circuit is advantageous in that operating range can be widened with respect to the clock cycle.

Figure 15:
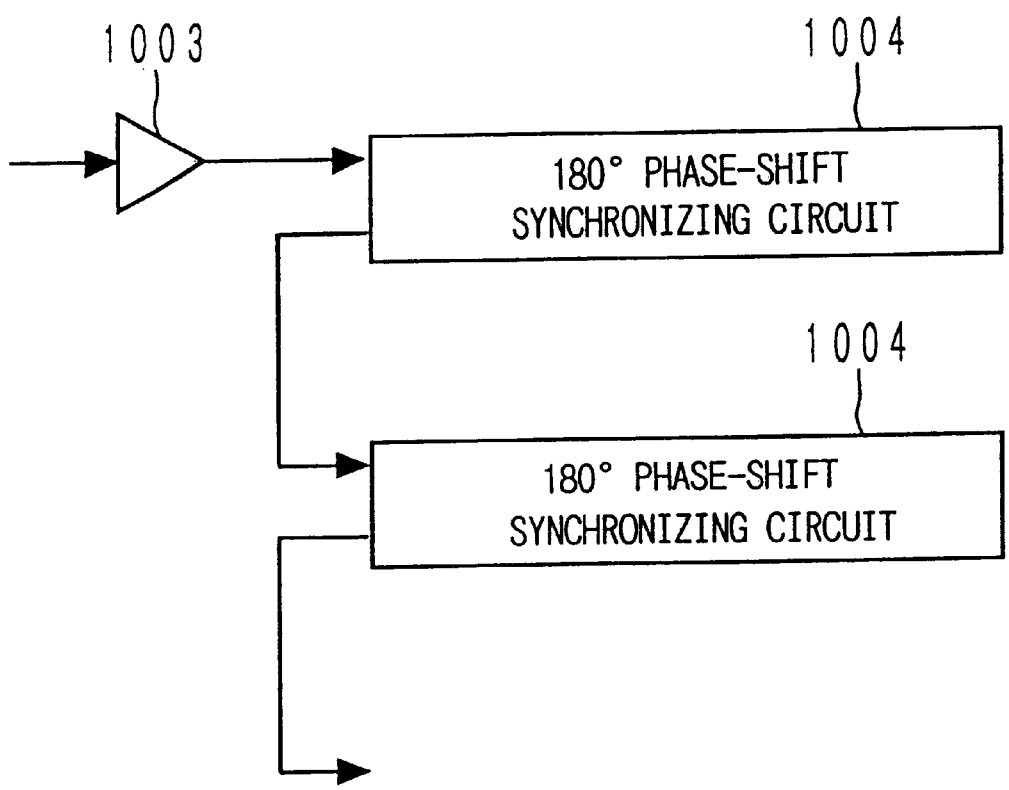
FIG. 15 is a block diagram showing the construction of an embodiment of the present invention.
Figure 16:
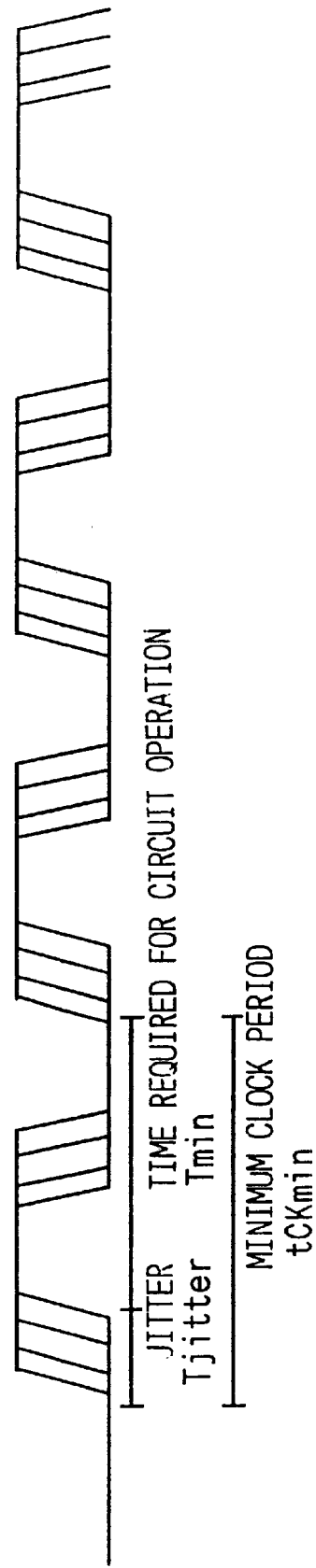
FIG. 16 is a timing chart for describing the prior art.

Further, though the amount of phase shift in the fixed delay circuit is made 360 degrees in this embodiment, two circuits each for implementing a 180 degrees phase shift may be connected in series, as depicted in FIG. 15.

[Second Mode of the Present Invention]

Figure 17:
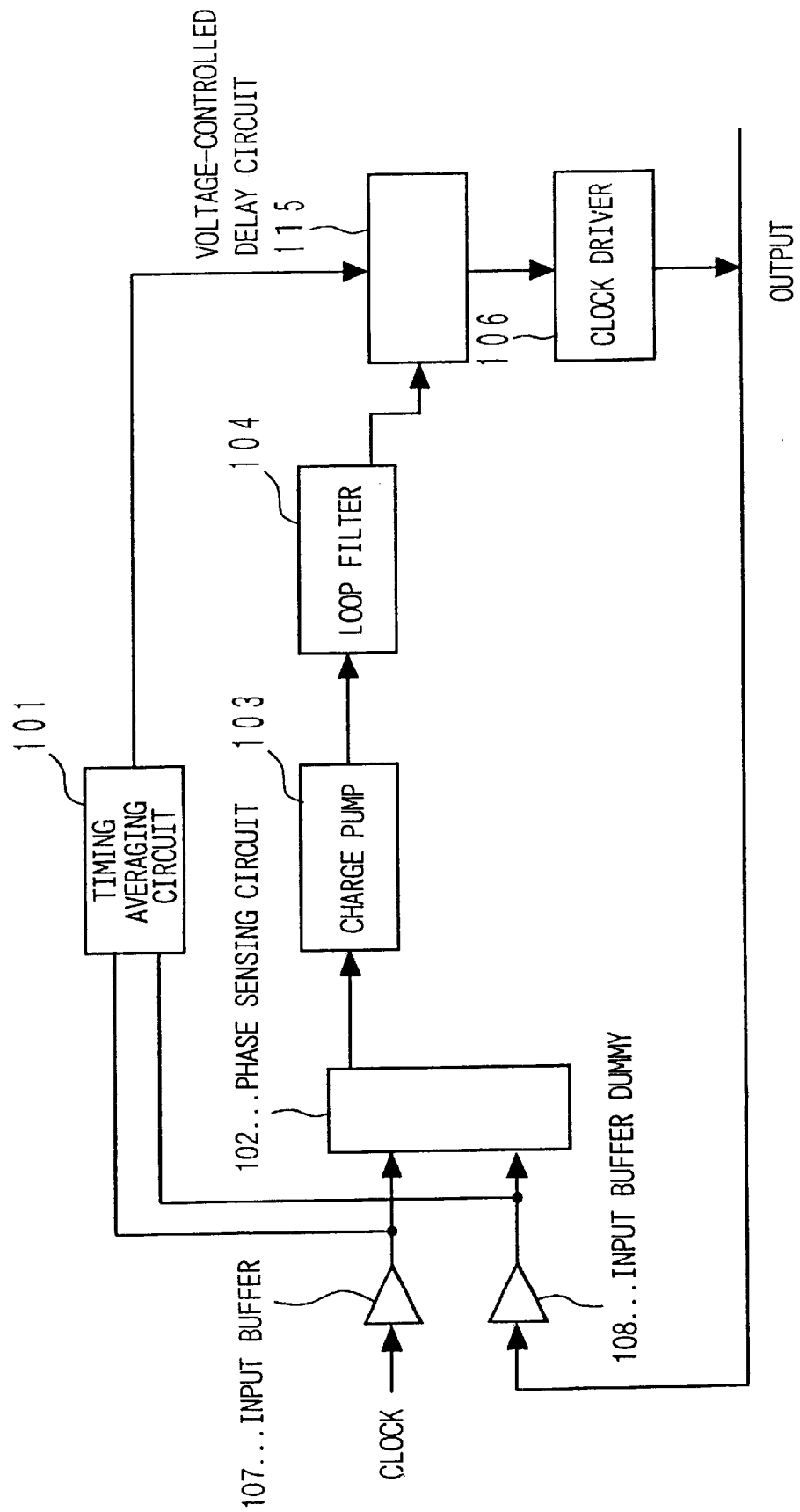
FIG. 17 is a block diagram showing the construction of a DLL according to an embodiment of the present invention.

A second mode for practicing the present invention will now be described. FIG. 17 is a block diagram showing the construction of a delay-locked loop (DLL) according to this mode of the present invention. As shown in FIG. 17, the DLL has a timing averaging circuit 101 averaging the periods between pulses of a clock signal. An externally applied clock used in a phase comparison and an internal clock are input to the timing averaging circuit 101, the output of which is input to a voltage-controlled delay circuit 115.

Figure 18:
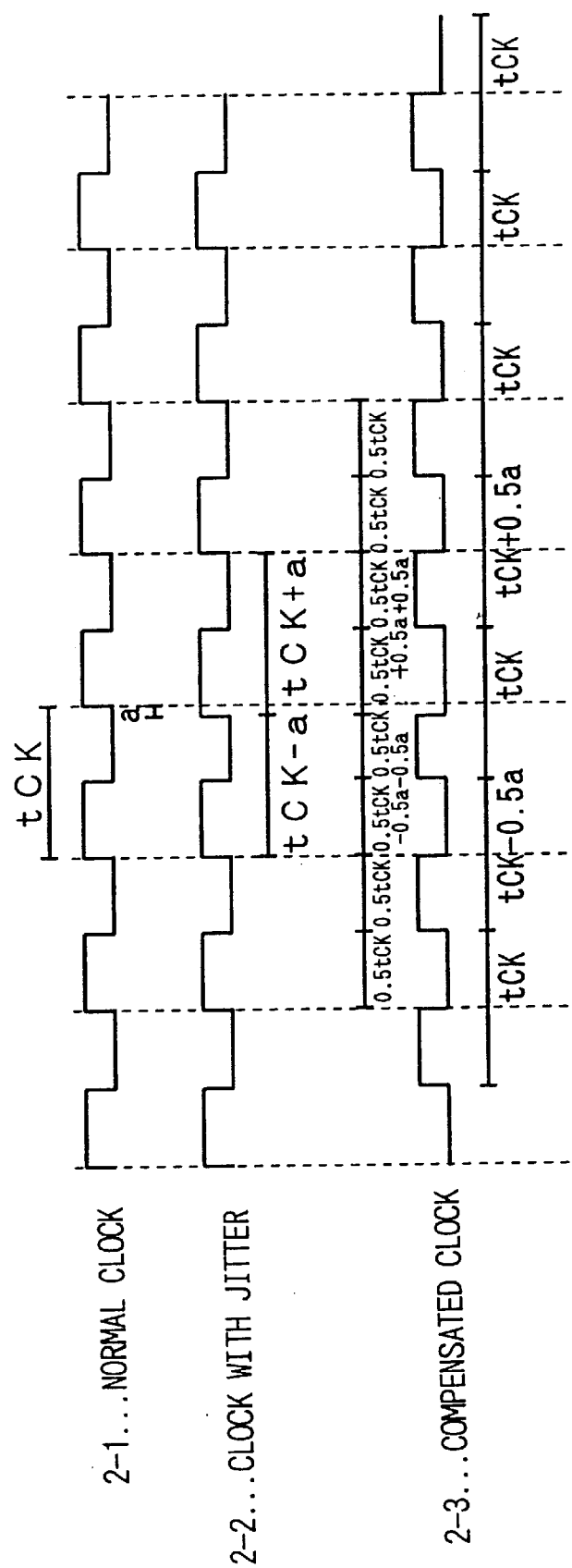
FIG. 18 is a timing chart for describing the operation of an embodiment of the present invention.

FIG. 18 illustrates the basic operation waveforms useful in describing the principle of operation of this mode of the present invention. In a case where a clock (2-2) containing a jitter component "a" with respect to a normal clock (2-1) enters after the DLL locks, the jitter component has cycles of tCK+a and tCK−a with respect to the cycle tCK of the normal clock (2-1). The jitter component of a primary jitter-compensated clock (2-3), which is obtained by passing the clock (2-2) with jitter through the timing averaging circuit 101, becomes 0.5 a. Thus, the effect of this arrangement is that jitter is compensated for and reduced by a circuit for averaging the cycles of the clock.

[Embodiment 2-1]

A first embodiment of the second mode of the present invention will now be described. As shown in FIG. 17, the DLL has the timing averaging circuit 101 averaging the cycles between pulses of the clock signal, as set forth in the description of the second mode of the present invention. The DLL is constituted by a charge pump 103, a loop filter 104 and a voltage-controlled delay circuit 115. A clock driver 106, input buffer 107 and input buffer dummy 108 construct a feedback circuit system as a clock path. The outputs of the input buffer 107 and input buffer dummy 108 enter the timing averaging circuit 101, the output of which is input to the voltage-controlled delay circuit 115. The voltage-controlled delay circuit 115 delivers the output of the timing averaging circuit 101 upon variably delaying the output based upon the output voltage of the loop filter 104.

In this embodiment, a timing dividing circuit TMD is constructed using parallel MOS transistors MP1, MP2, as illustrated in FIG. 5, by way of example. The principle of operation has already been described. The principle underlying the division of timing is as shown at FIG. 4(b). That is, first the capacitor C is charged by one MOS gate for a period time equal to the clock period T, then the capacitor C is charged by two MOS gates, thereby producing a time difference of T/2 in comparison with a case where the capacitor C is charged by two MOS gates from the start.

Figure 19:
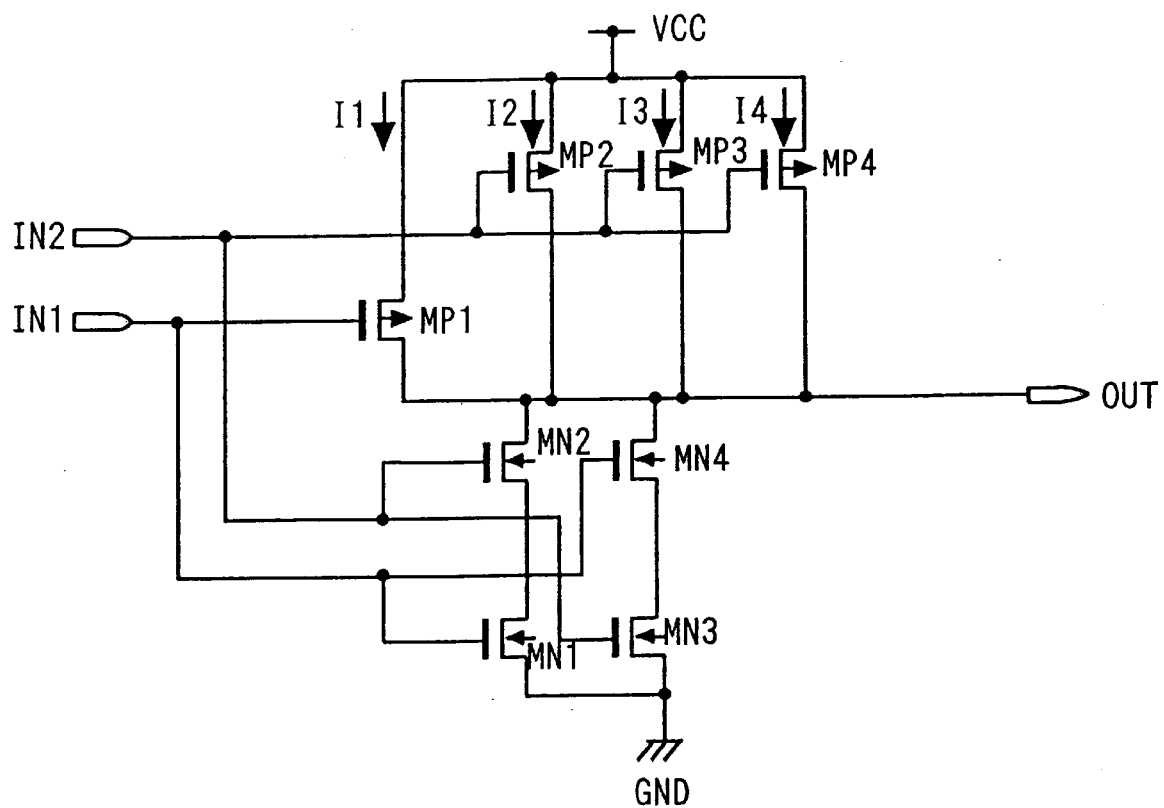
FIG. 19 is a diagram showing the construction of an averaging circuit according to an embodiment of the present invention.

FIG. 19 illustrates an example of the construction of the timing averaging circuit 101 used in this embodiment. As shown in FIG. 19, a four-switch group of PMOS transistors MP1, MP2, MP3, MP4 constructs a switch for charging a load capacitance. First the PMOS transistor MP1 turns on at the falling edge of the signal IN1 to perform charging at the current i1, then the three PMOS transistors MP2, MP3, MP4 are turned on, too, by the falling edge of the signal IN2 to charge the capacitance by currents i1 to i4 from the four switches. Discharge takes place from NMOS transistors MN1, MN2, MN3, MN4 when the signals IN1 and IN2 both rise. The circuitry shown in FIG. 19 utilizes internal transistors of NAND and NOR gates, which are basic gates.

[Embodiment 2-2]

Figure 20:
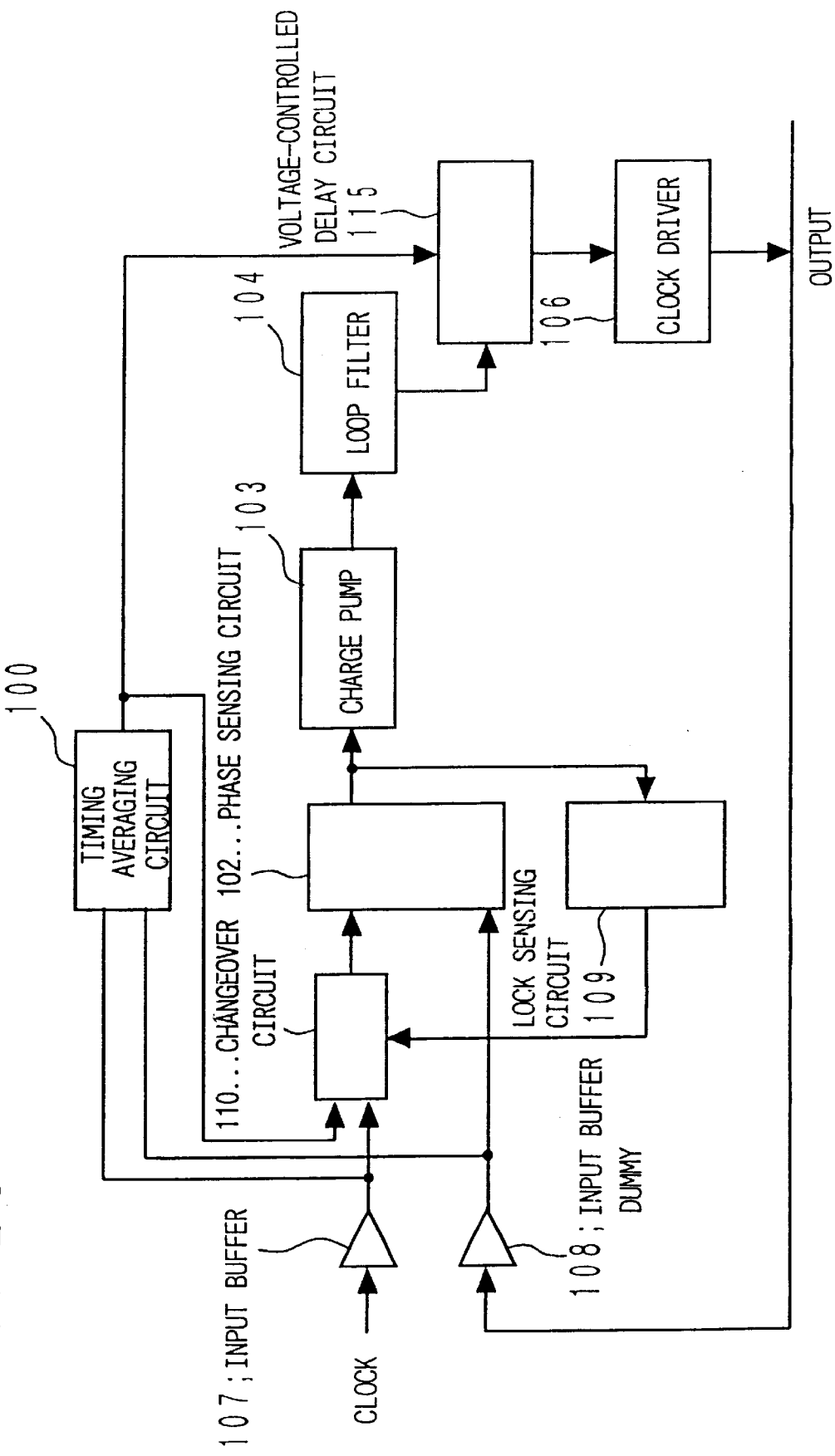
FIG. 20 is a block diagram showing the construction of a DLL according to an embodiment of the present invention.
Figure 21:
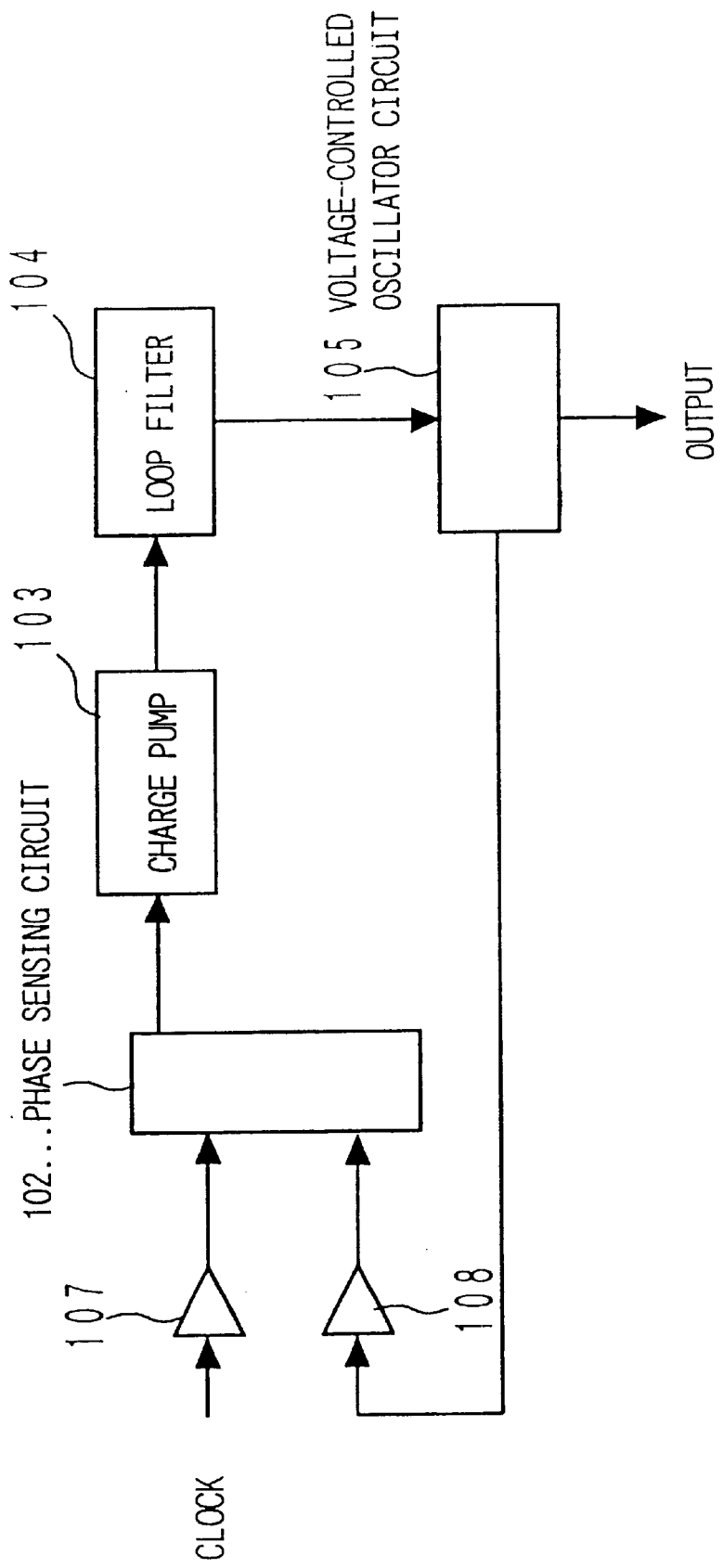
FIG. 21 is a block diagram showing the construction of a PLL according to a conventional manner.
Figure 22:
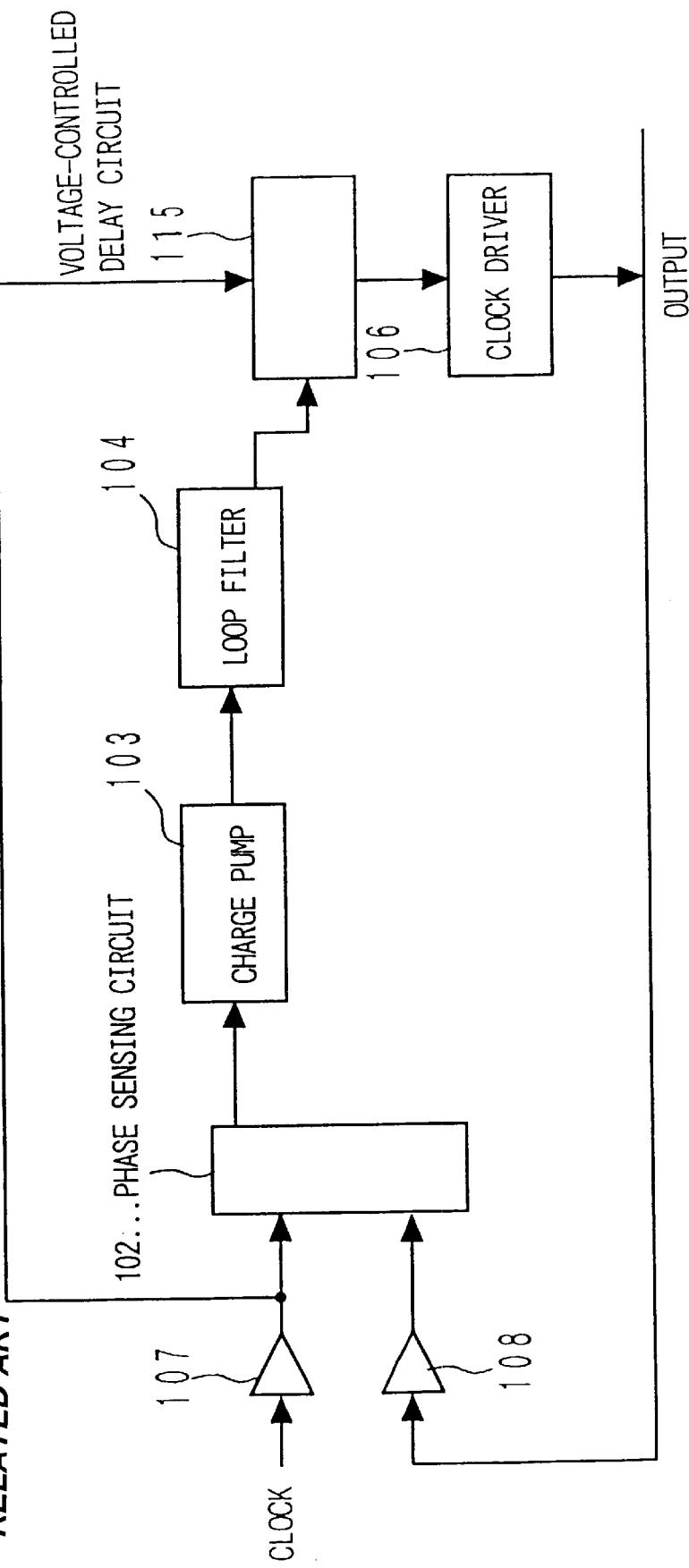
FIG. 22 is a block diagram showing the construction of a PLL according to a conventional manner.

A second embodiment of the second mode of the present invention will be described next. FIG. 20 is a block diagram showing the construction of the second embodiment of the present invention. As shown in FIG. 20, the timing dividing circuit uses a circuit arrangement identical with that of FIG. 14 as the timing averaging circuit. Here, however, the circuit depicted in FIG. 19 is employed as the NAND gate in the timing averaging circuit of FIG. 14. With this circuit, the driving performance of the PMOS transistors is raised by a factor of three by the inputs IN1 and IN2. The ratio of the NMOS transistors is added on in a similar manner even in the NOR gates. Consequently, the effects of the division of timing also are such that the timing difference between the input of IN1 and the input of IN2 is divided by four and an output having one-fourth the timing difference of IN1 relative to IN2 is obtained.

To accomplish this, the signal IN1 is coupled (fed) to the input buffer 107 and the input signal IN2 is coupled to the input buffer dummy 108, whereby the jitter component of the clock input to the voltage-controlled delay circuit 115 is reduced to one-fourth even if the jitter of the external clock is large.

An effect of this embodiment is that the jitter of the external clock can be reduced to a fraction of a few'th if the ratio (the internal dividing ratio of the time difference between the two signals) taken on by the average value of the timing averaging circuit is changed.

[Embodiment 2-3]

A third embodiment of the second mode of the present invention will now be described with reference to FIG. 20. A circuit arrangement identical with that of the first embodiment or second embodiment of the second mode of the present invention is used as the DLL and timing averaging circuit. However, this embodiment has a lock sensing (detecting) circuit 109 and a changeover circuit 110. According to this arrangement, when the DLL locks, the changeover circuit 110 changes over between the clock that enters a phase sensing circuit 102 and the output of a timing averaging circuit 100.

In this embodiment, the external clock no longer enters the phase sensing circuit 102 directly, as a result of which it is possible to suppress the effects of jitter on the stable operation of the DLL.

[Embodiment 2-4]

Figure 52:
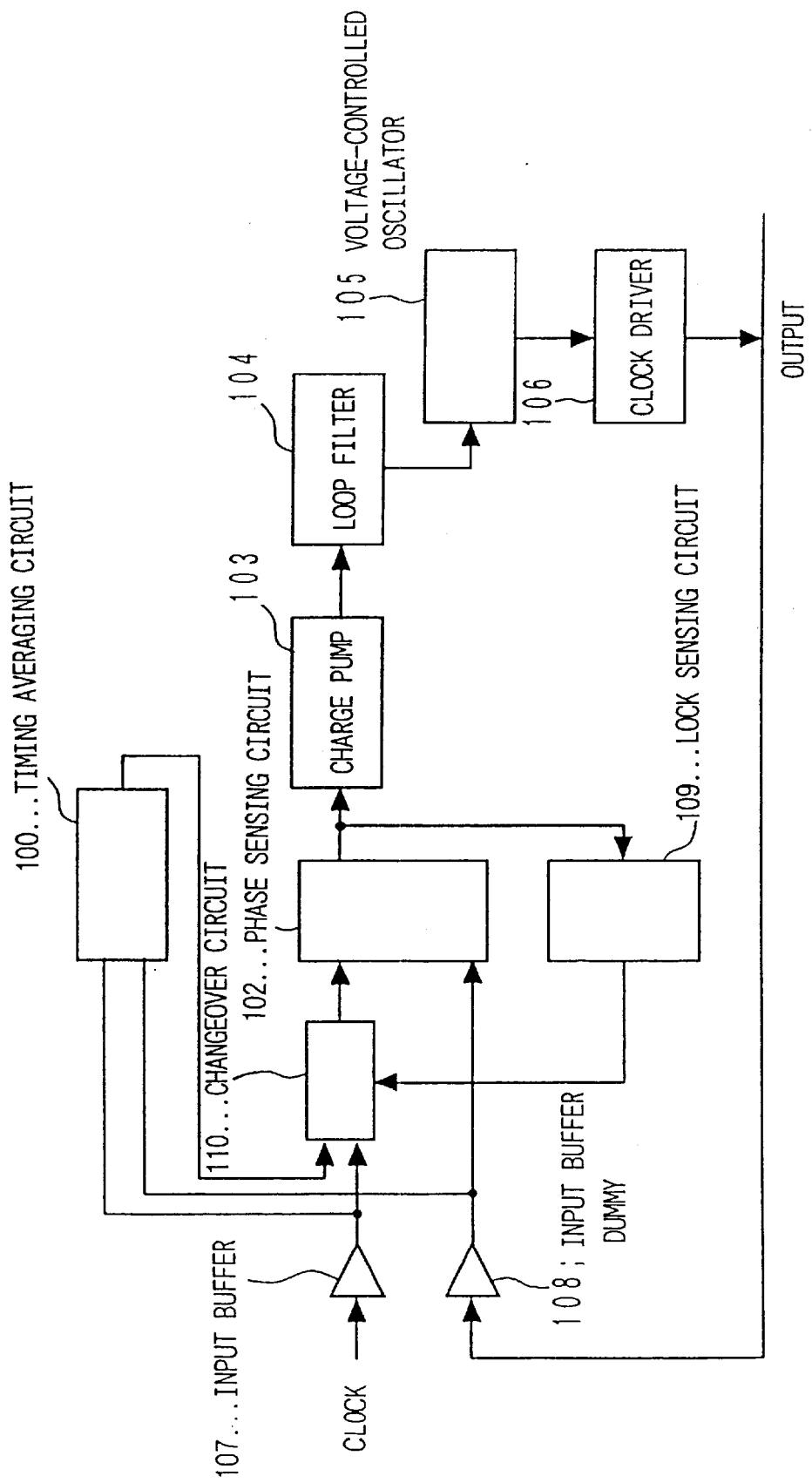
FIG. 52 is a block diagram showing the construction of a PLL according to an embodiment of the present invention.

A fourth embodiment of the second mode of the present invention will now be described. According to this embodiment, as shown in FIG. 52, the second mode of the present invention is applied to a PLL. This arrangement has the timing averaging circuit 100 for averaging the cycles between pulses of the clock signal, and the PLL is constituted by the phase sensing circuit 102, charge pump 103, loop filter 104 and voltage-controlled oscillator (VCO) 105. The clock driver 106, input buffer 107 and input buffer dummy 108 construct a feedback circuit as a clock path. The outputs of the input buffer 107 and input buffer dummy 108 are input to the timing averaging circuit 100 and the output of the timing averaging circuit 100 enters the phase sensing circuit 102. In this embodiment, the circuit arrangement shown in FIG. 19, for example, is used as the timing averaging circuit 100. That is, this embodiment has a lock sensing circuit 109 and a changeover circuit 110. When the PLL locks, the changeover circuit 110 changes over between the clock that enters the phase sensing circuit 102 and the output of a timing averaging circuit 100. In this embodiment, the external clock no longer enters the phase sensing circuit 102 directly, as a result of which it is possible to suppress the effects of jitter on the stable operation of the PLL.

[Third Mode of the Present Invention]

Figure 30:
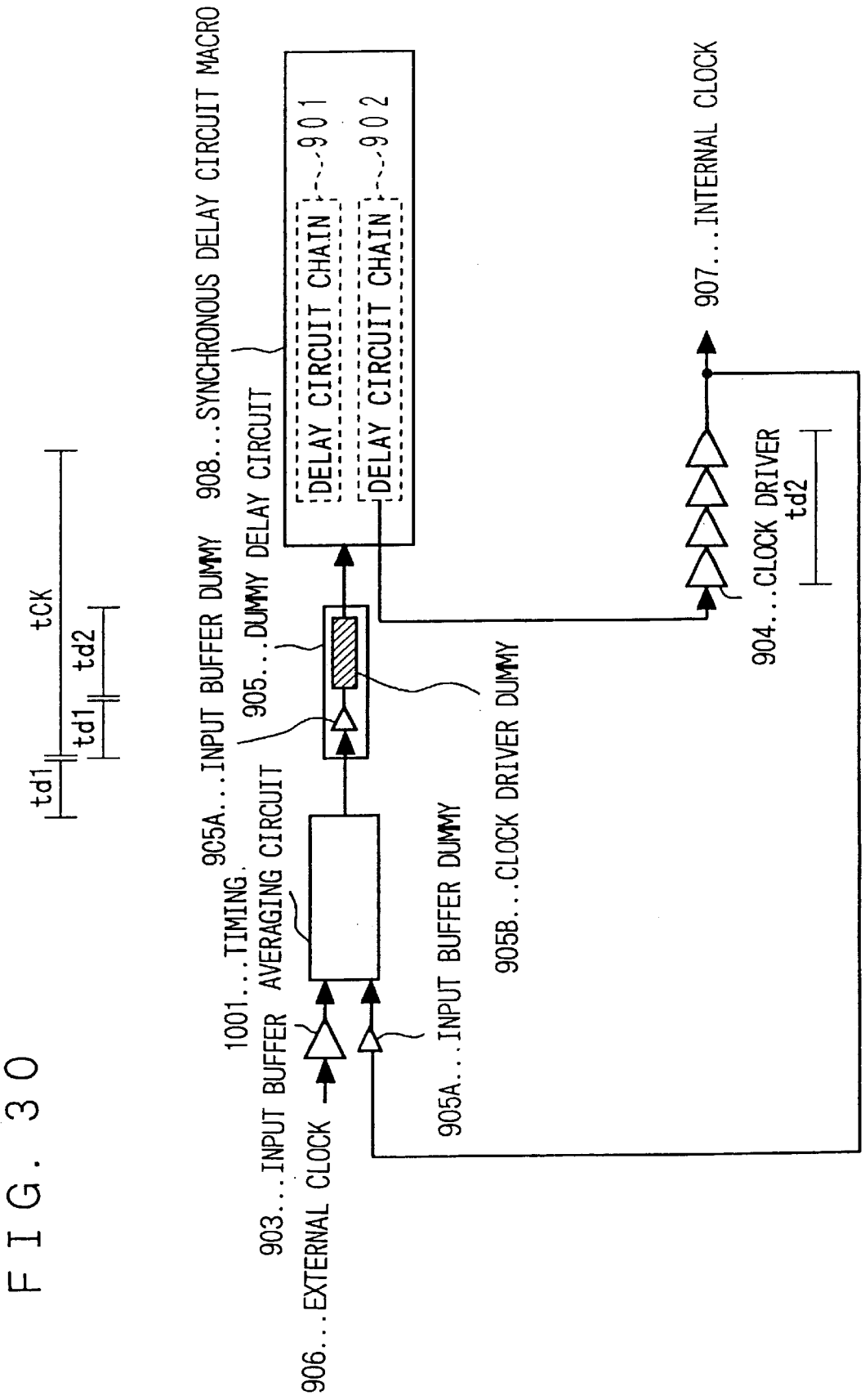
FIG. 30 is a diagram showing the construction of a clock control circuit using a synchronous delay circuit according to an embodiment of the present invention.
Figure 31:
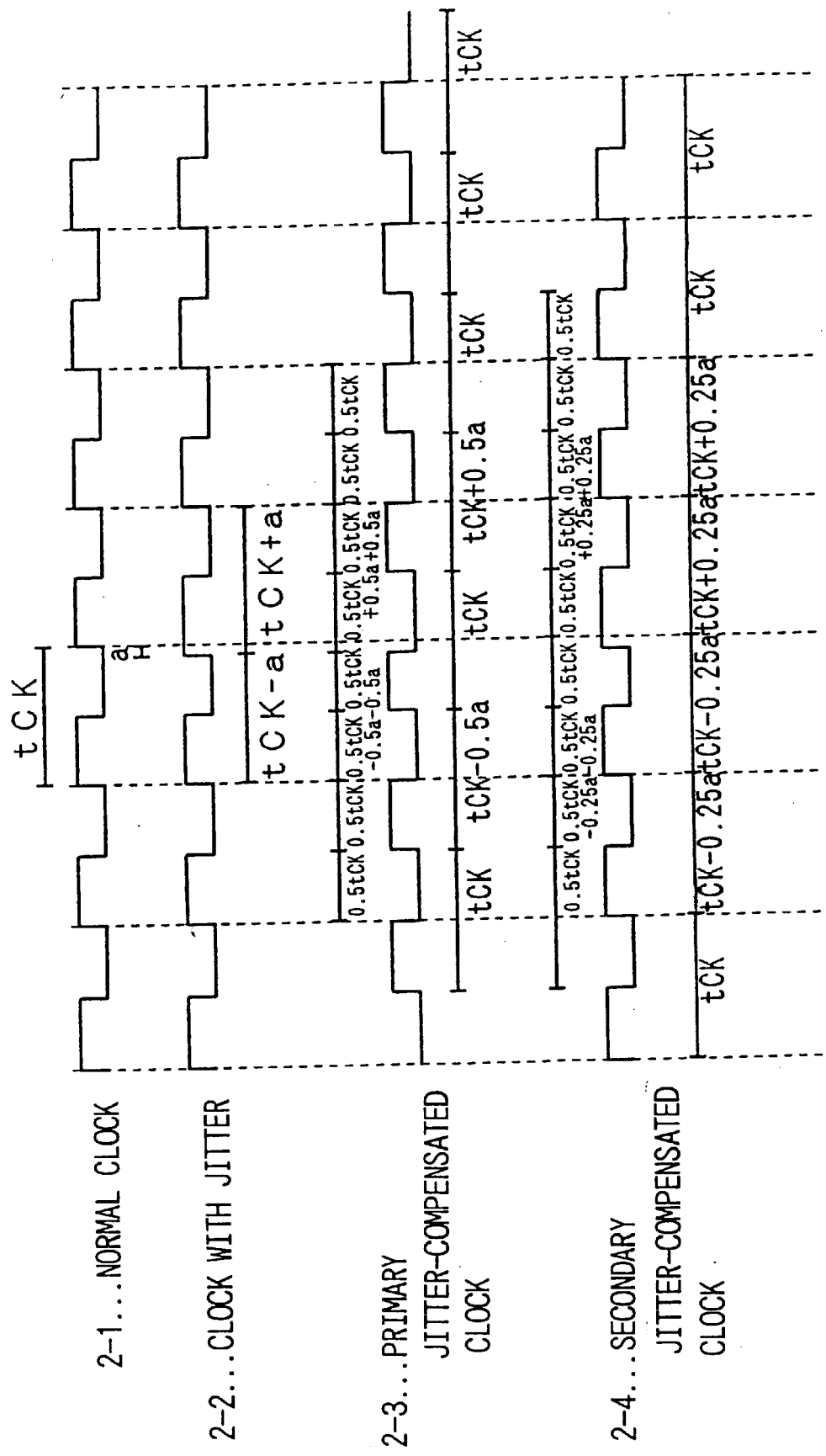
FIG. 31 is a timing chart useful in describing the operation of a clock control circuit using a synchronous delay circuit according to an embodiment of the present invention.

FIG. 30 shows the construction of a synchronous delay circuit according to this mode for practicing the present invention, and FIG. 31 is a timing chart useful in describing the principle of operation of a timing averaging circuit. This mode of the present invention has a timing averaging circuit 1001 (the construction of which is as shown in FIG. 3) which averages the cycles between pulses of the clock signal. An external clock input that enters from an input buffer 903 and a signal obtained by passing an internal clock signal 907, which is output by a clock driver 904, through an input buffer dummy 905A having a delay time characteristic equivalent to that of the input buffer 903 are input to the timing averaging circuit 1001. The output of the timing averaging circuit 1001 is input to a delay circuit 901 via a dummy delay circuit 905. At the moment the signal input to the delay circuit chain (or array) 901 advances by an amount equivalent to the clock cycle, the signal is transferred through the delay circuit chain 902 by the next clock pulse and exits from the delay circuit chain 902 upon traveling a distance equivalent to the distance traversed in the delay circuit chain 901. It should be noted that the dummy circuits of the input buffer are serially connected in the dummy delay circuit.

The principle of operation of this mode will be described with reference to the timing chart of FIG. 31. In a case where a clock 2-2 containing a jitter component "a" with respect to a normal clock 2-1 enters after the synchronous delay circuit locks, the jitter component has cycles of tCK+a and tCK−a with respect to the cycle tCK of the normal clock. The jitter component of a primary jitter-compensated clock 2-3, which is obtained by passing the clock 2-2 with jitter through the timing averaging circuit, becomes 0.5 a. Thus, the effect of this arrangement is that the jitter is compensated for and reduced by a circuit that averages the cycles of the clock.

[Embodiment 3-1]

Figure 24:
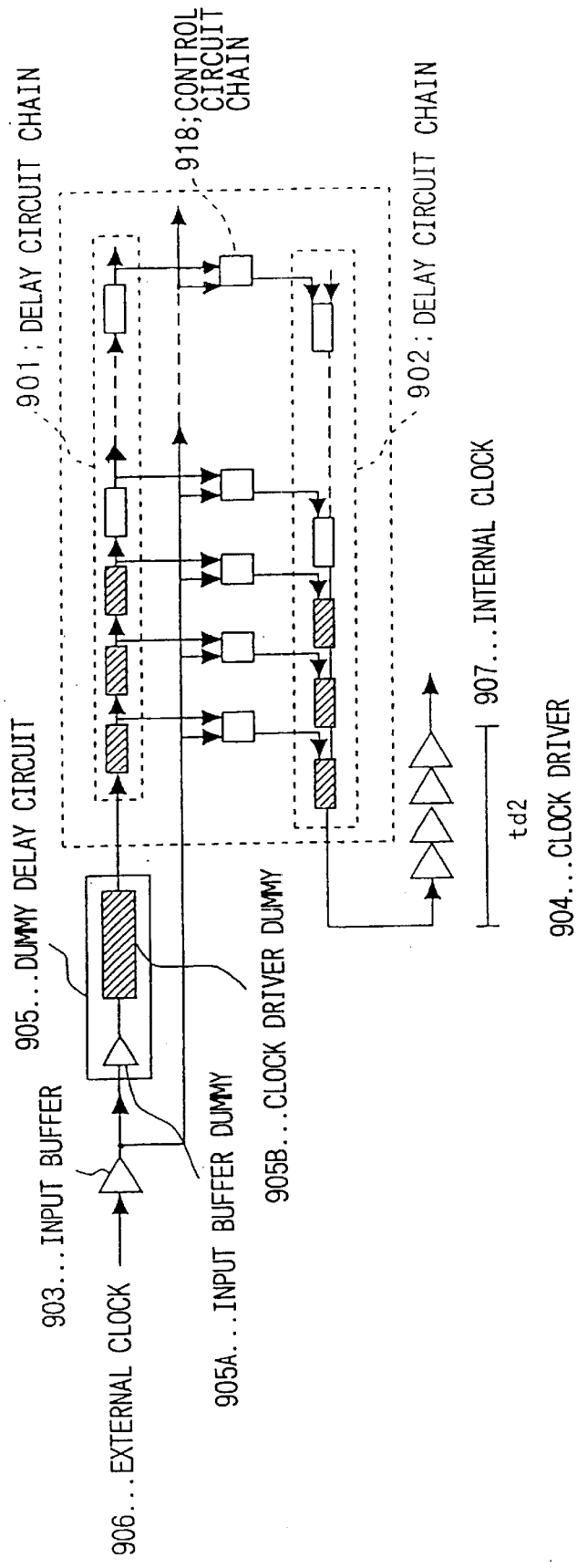
FIG. 24 is a diagram showing the construction of a clock control circuit using a synchronous delay circuit according to a basic structure.

FIG. 32 is a diagram showing the construction of a first embodiment of the third mode of the present invention. This embodiment supplies the averaging circuit of the present invention to a basic part as shown in FIG. 24. In this embodiment, use is made of two of the timing averaging circuits 1001 (these timing averaging circuits each comprise the timing dividing circuit of FIG. 3) to which two signals are input and which output signals having a time difference obtained by internally dividing the time difference between the two input signals. Both timing averaging circuits receive outputs of the input buffer 903 and input buffer dummy 905A as inputs. The first timing averaging circuit 1 applies its output to the delay circuit chain (or array) 901, and the output of the second timing averaging circuit 2 is used as a signal (a signal for deciding delay length) for controlling transfer of a signal from the delay circuit chain 901 to the delay circuit chain 902. The timing averaging circuits 1001 are basically identical in construction and are capable of being set separately to averaging ratios (internal-division ratios) of the two input signals. The averaging or internal-division ratio of the two input signals can be set by deciding the ratio of the sizes (e.g., transistor widths) of the transistors that receive the two input signals in the timing averaging circuits.

For more detail of the basic part shown in FIG. 24, refer to the disclosure of the copending U.S. patent application Ser. No. 09/087,864 filed on Jun. 1, 1998. Generally, the same applies to the basic parts shown in FIGS. 23–29, too.

By separately setting the averaging ratios or internal-division ratios of the two timing averaging circuits, it is possible to adjust the phases of the outputs and suppress the occurrence of a phase error owing to the provision of two timing averaging circuits.

[Embodiment 3-2]

Figure 33:
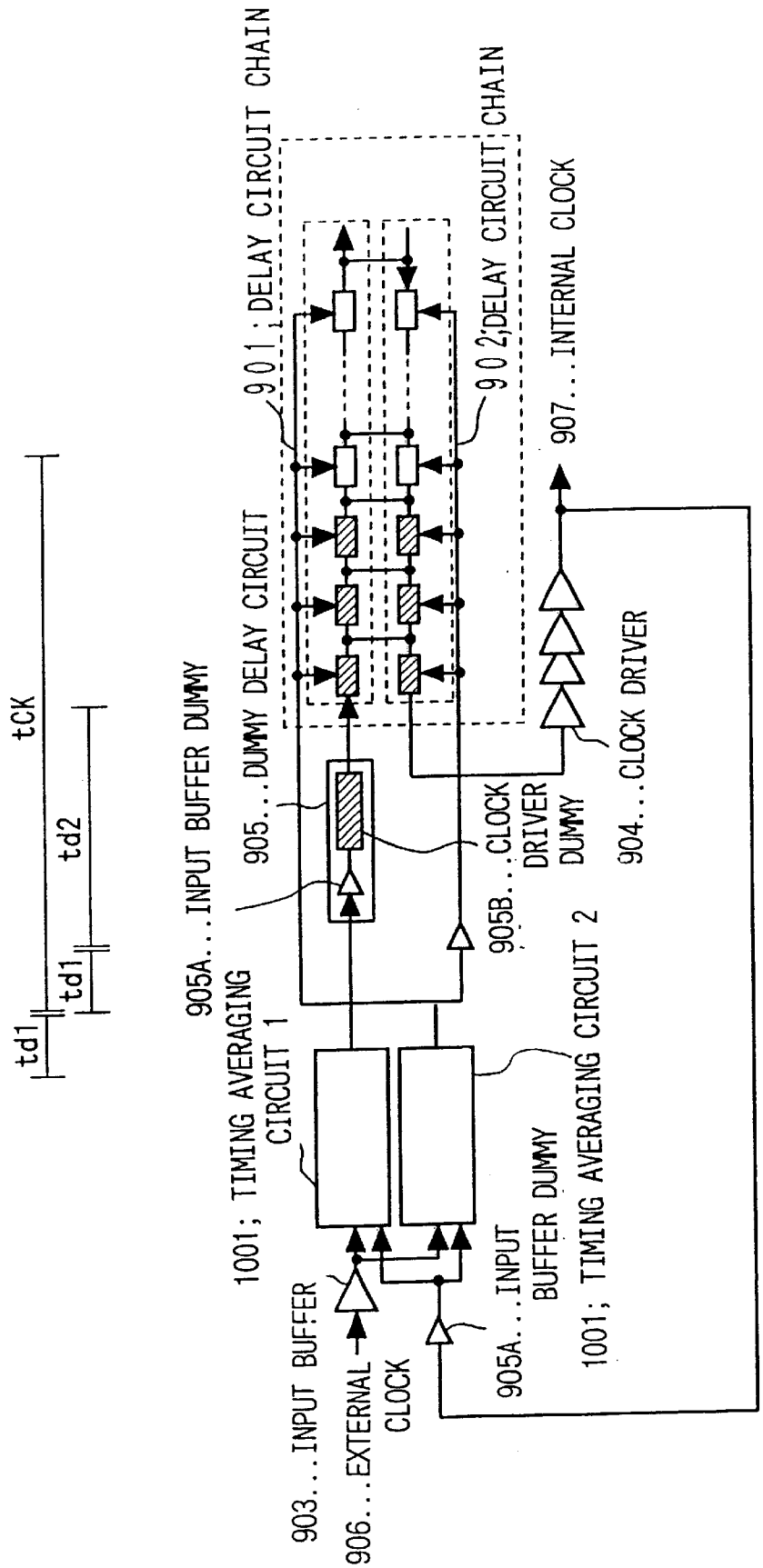
FIG. 33 is a diagram showing the construction of a clock control circuit using a synchronous delay circuit according to an embodiment of the present invention.
Figure 34:
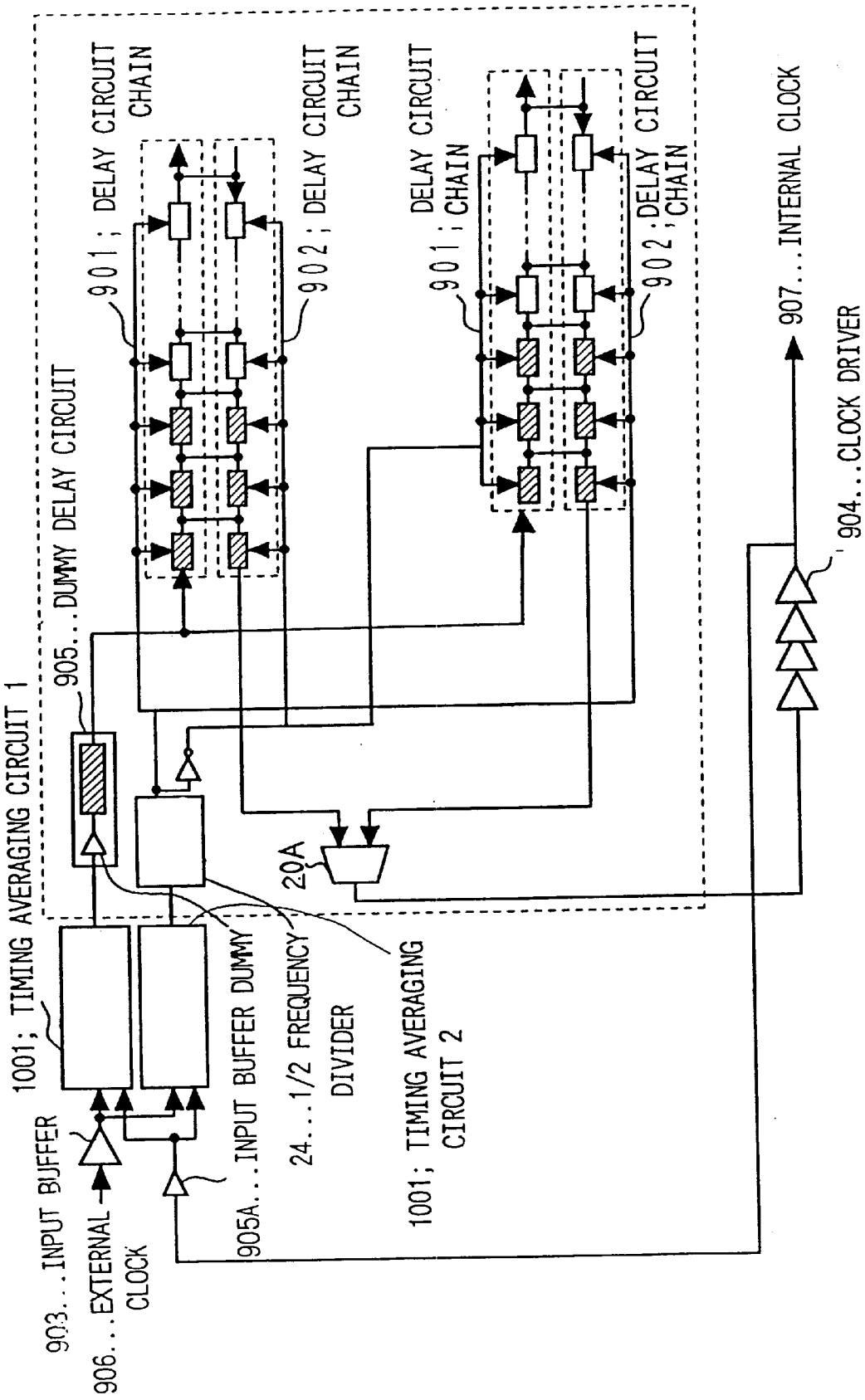
FIG. 34 is a diagram showing the construction of a clock control circuit using a synchronous delay circuit according to an embodiment of the present invention.

The construction of a second embodiment of the third mode of the present invention is illustrated in FIGS. 33 and 34. This embodiment applies the timing averaging circuit of the present invention to a basic part illustrated in FIG. 25. Two of the timing averaging circuits 1001 are used in this embodiment as well. In the arrangement illustrated in FIG. 34, the clock from the second timing averaging circuit 2 is frequency-divided by a divide-by-two frequency divider circuit 24, the frequency-divided clock signal and its complementary signal are supplied as signals that decide the delay lengths of the delay circuit chains 901, 902, and the outputs of the delay circuit chains 901, 902 are combined and extracted by a combiner 20A. The resulting signal is supplied from the clock driver 904 as an internal clock. In this embodiment, continuous operation is implemented by using the prior-art circuit of FIG. 25 in alternating fashion.

[Embodiment 3-3]

Figure 35:
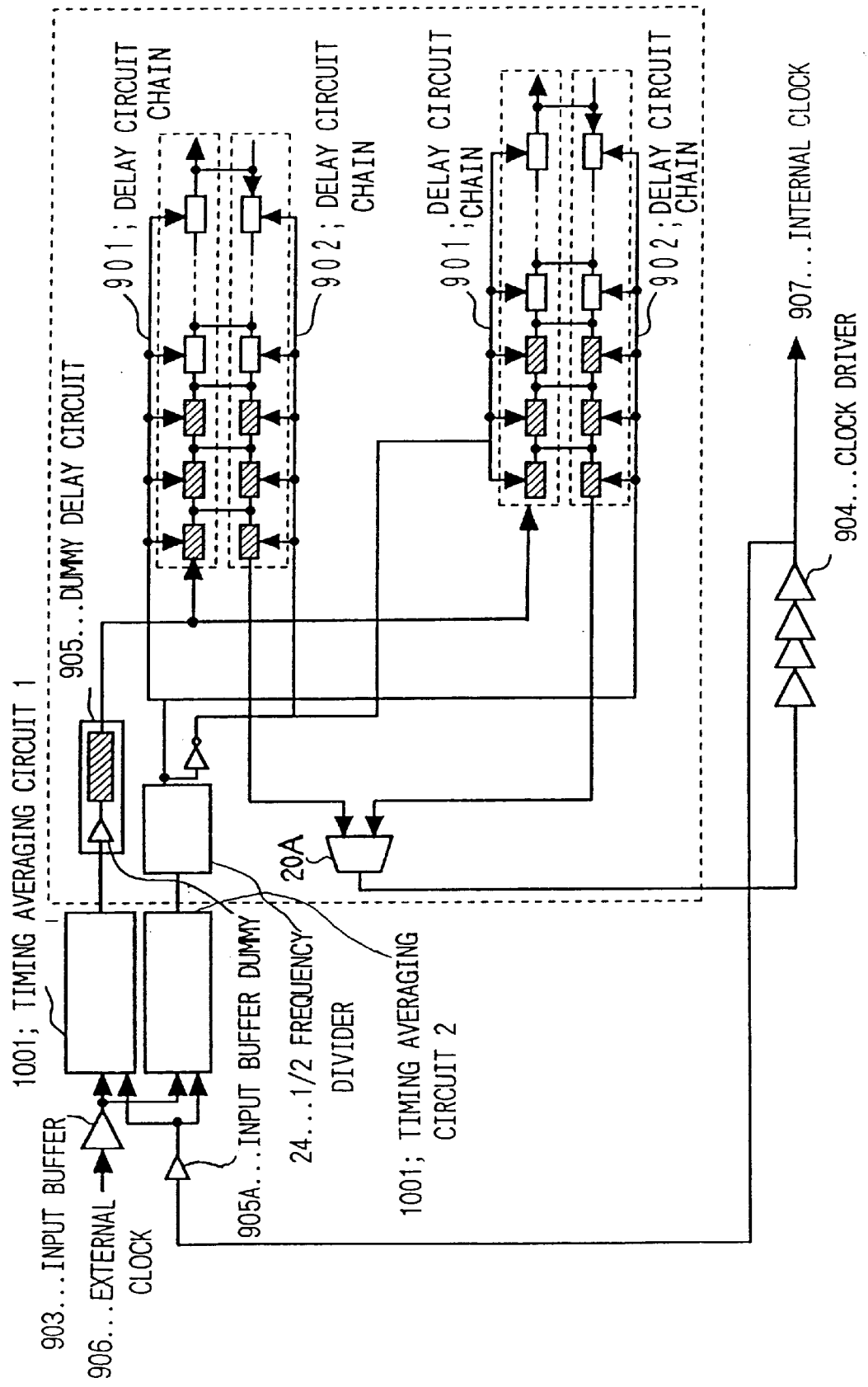
FIG. 35 is a diagram showing the construction of a clock control circuit using a synchronous delay circuit according to an embodiment of the present invention.

FIG. 35 illustrates the construction of a third embodiment of the third mode of the present invention. This embodiment applies the timing averaging circuit of the present invention to the basic part illustrated in FIG. 26. Two of the timing averaging circuits 1001 are used in this embodiment as well. The clock from the second timing averaging circuit 2 is frequency divided by the divide-by-two frequency divider circuit 24, the frequency-divided clock signal and its complementary signal are supplied as signals that decide the delay lengths of the delay circuit chains 901, 902, and the outputs of the delay circuit chains 901, 902 are combined and extracted by the combiner 20A. The resulting signal is supplied from the clock driver 904 as the internal clock.

[Embodiment 3-4]

Figure 36:
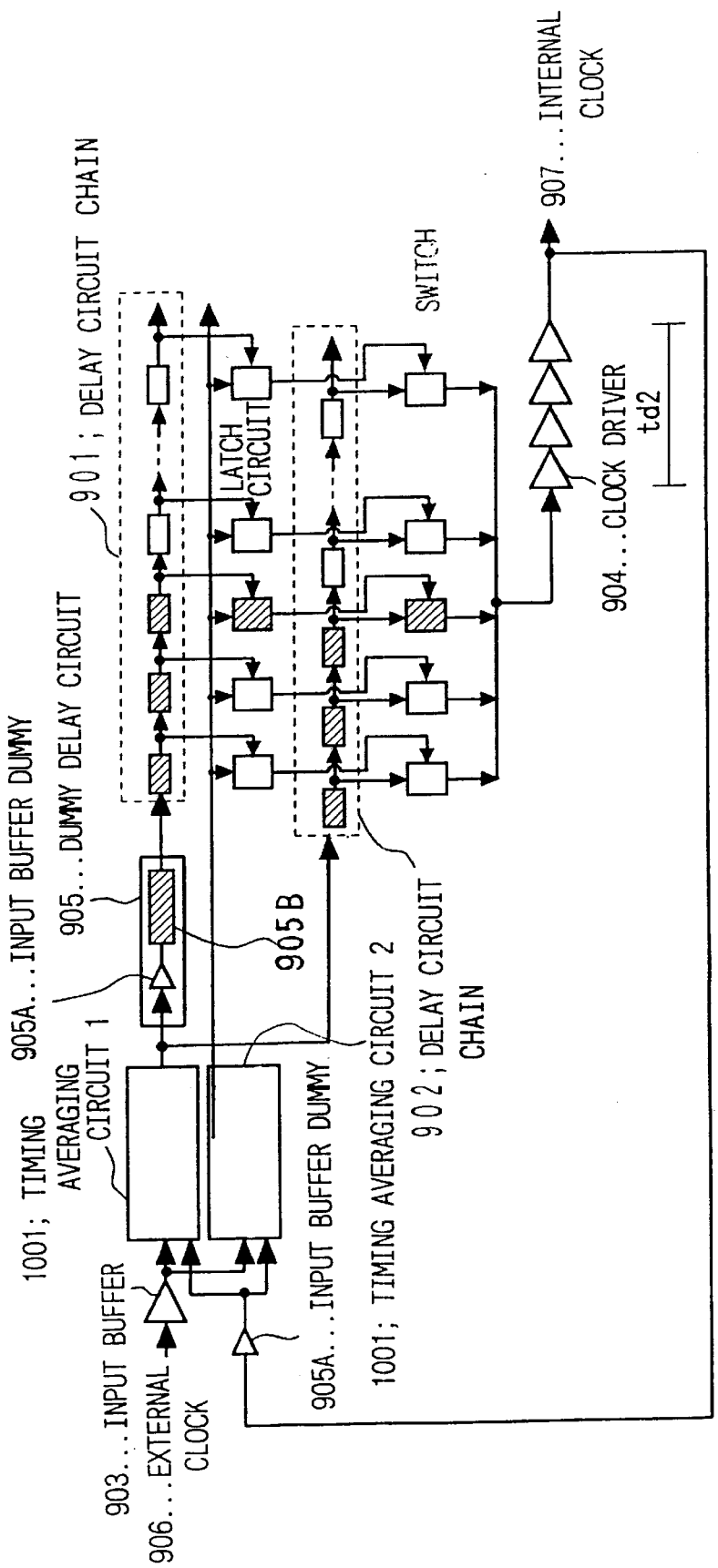
FIG. 36 is a diagram showing the construction of a clock control circuit using a synchronous delay circuit according to an embodiment of the present invention.

FIG. 36 illustrates the construction of a fourth embodiment of the third mode of the present invention. This embodiment applies the timing averaging circuit of the present invention to the basic part illustrated in FIG. 27. Two of the timing averaging circuits 1001 are used in this embodiment as well. The output of the first timing averaging circuit enters the delay circuit chain 901 from the dummy delay circuit 905, and the output of the second timing averaging circuit is used as a signal (a signal for deciding delay length) for controlling a latch that controls transfer of a signal from the delay circuit chain 901 to the delay circuit chain 902.

[Fourth Mode of the Present Invention]

A fourth mode of the present invention will now be described. FIG. 37 is a diagram showing the construction of a fourth mode for practicing the present invention. As shown in FIG. 37, the synchronous delay circuit of the present invention has a pair of delay circuit chains 11, 12 and a monitor signal generating circuit 19 for sensing the amount of delay in the clock path. (The details of a synchronous delay circuit using a monitor signal generating circuit are described in the specification of U.S. patent application Ser. No. 09/087,864 claiming the priority of Japanese Patent Application No. 9-157974 filed by the present inventor. Now the entire disclosure thereof is incorporated herein.)

In terms of the operation of this circuit, a delay quantity [tCK−(td1+td2)] obtained by subtracting the amount of delay of the clock path from an amount of delay equivalent to one cycle using one of the delay circuit chains and the delay-quantity sensing circuit is measured as the length of the delay circuit traversed by a signal, and use is made of the other delay circuit chain and the original clock path to generate a clock signal having a phase equal to that of the external clock. Furthermore, the output of the timing averaging circuit 1001, which is for averaging the cycles between pulses of the clock signal, is input to the delay circuit chain and the monitor signal generating circuit 19.

The operation through which a clock having a phase identical with that of the external clock is generated will be described with reference to the circuit arrangement shown at (a) in FIG. 37 and the timing charge shown at (b) of FIG. 37.

This arrangement has a synchronous delay circuit constituted by a delay circuit chain 911 for measuring a fixed time, and a delay circuit chain 912 for reproducing the measured delay time, as well as an input buffer 13 and a clock driver 14. The period of the clock is measured by passing a signal through the delay circuit chain 911 for measurement. However, in an interval that causes clock skew, such an interval over which the clock pulse is traveling through the clock driver 14 and an interval over which the clock pulse passes through an input buffer dummy 15, no signal travels through the delay circuit chain 911, thereby halting measurement of the clock period tCK.

Accordingly, the interval over which the signal advances through the delay circuit chain 911 becomes exactly tCK−(td1+td2), which is obtained by subtracting the delay time td2 of the input buffer and the delay time td1 of the clock driver from the clock period tCK, and the delay time reproduced by the delay circuit chain 912 also becomes tCK−(td1+td2). As a result, exactly one clock is required for a clock pulse to pass through the input buffer 13, delay circuit chain 912 and clock driver 14, and skew with respect to the external clock is essentially eliminated.

The monitor signal generating circuit 19, which generates a signal for monitoring the period of time over which a pulse advances through the clock driver 14 and input buffer dummy 15, is constituted by an RS-(reset-set) flip-flop, etc. Accordingly, in a case where a length of time which is the sum of the delay quantities of the clock driver 14 and input buffer dummy 15 is greater than the clock period tCK, the passage of the signal through the delay circuit 911 for measuring the delay of the clock driver and input buffer can be suspended for a time equal to the excess. In other words, clock skew can be eliminated also in a case where the sum of the delays of the clock driver 14 and input buffer dummy 15 is greater than the clock period tCK.

A monitor signal D which halts the advance of a clock signal as shown in the timing chart of FIG. 37(*b*) monitors the interval over which a clock pulse passes through the clock driver. The timing at which a clock advances through the clock driver at synchronization, therefore, is hastened by tCK−(td1+td2).

Figure 37A:
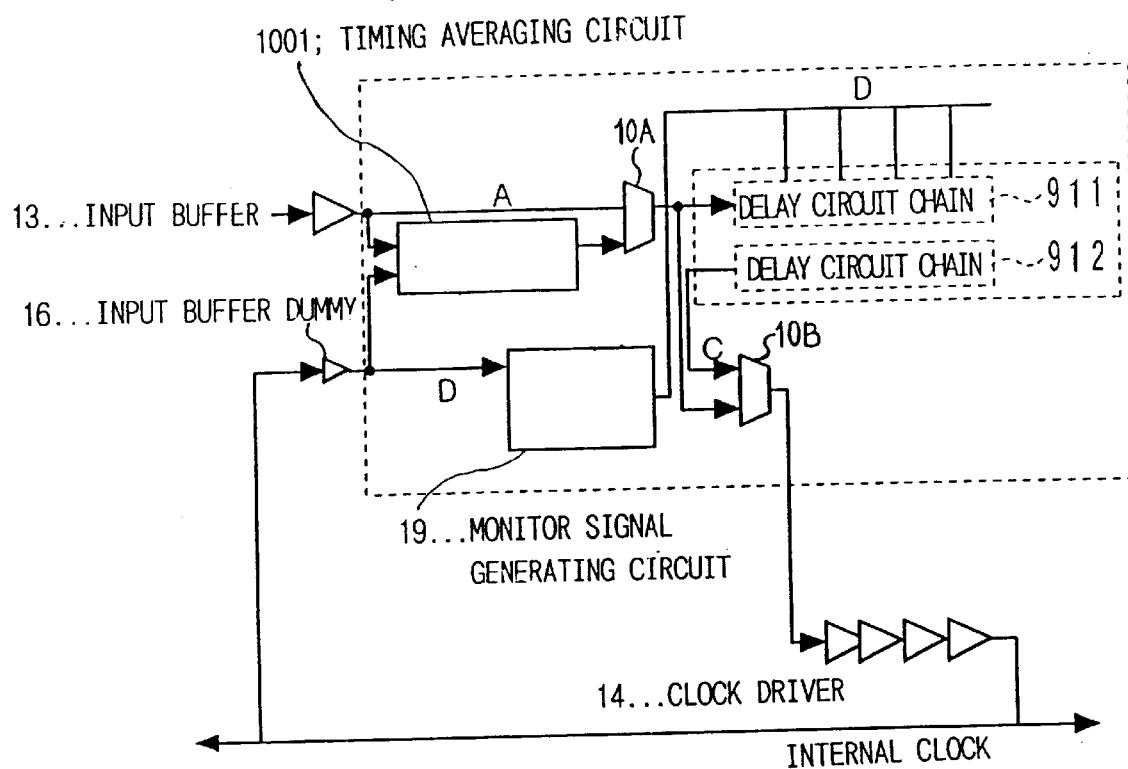
FIGS. 37(a) and 37(b) are diagrams showing the construction of a clock control circuit using a synchronous delay circuit according to an embodiment of the present invention.
Figure 37B:
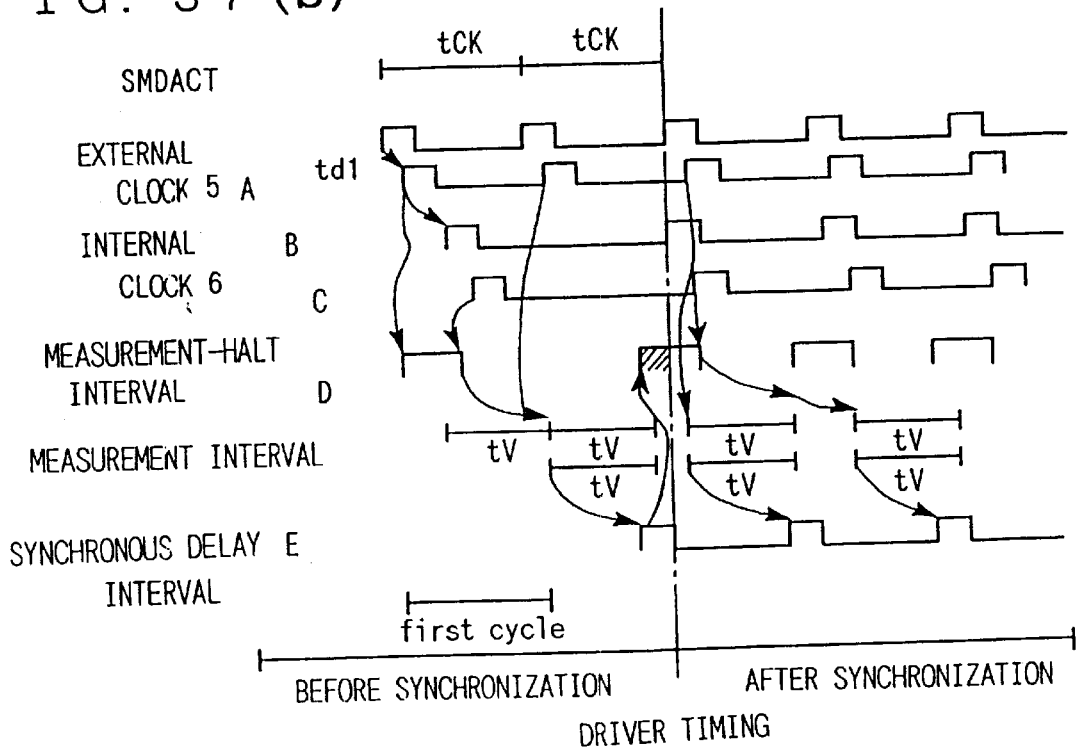

Accordingly, at the changeover from the state before synchronization to the state after synchronization, the monitor signal D is issued twice in one cycle (i.e., as shown by hatched pulse and a subsequent pulse in the timing chart). However, this is avoided by doing the following after the first output of the internal clock or after the output of the first monitor signal D:

(1) halting the monitor signal D indicated by the hatching in the timing chart of FIG. 37(b), or (2) halting the monitor signal D indicated by the hatching in the timing chart of FIG. 37(b) through a method such as changing over the clock path to stop the advance of a pulse to the clock driver.

In this embodiment, clock skew can be eliminated at a timing one cycle earlier than in the first embodiment because merely a clock signal emerges for which only once skew has not been removed.

The timing averaging circuit 1001, which has a construction similar to that of each of the foregoing embodiments, averages the timings of the output of the external clock and internal clock from the input buffer 13 and input buffer dummy 14 and applies its output signal to the delay circuit chain. Further, whether the output of the timing averaging circuit 1001 is supplied to the delay circuit chain 911 is determined by a changeover unit 10B, and averaging of timing is performed from the moment the internal clock is output via the delay circuit chain.

[Embodiment 4-1]

Figure 38:
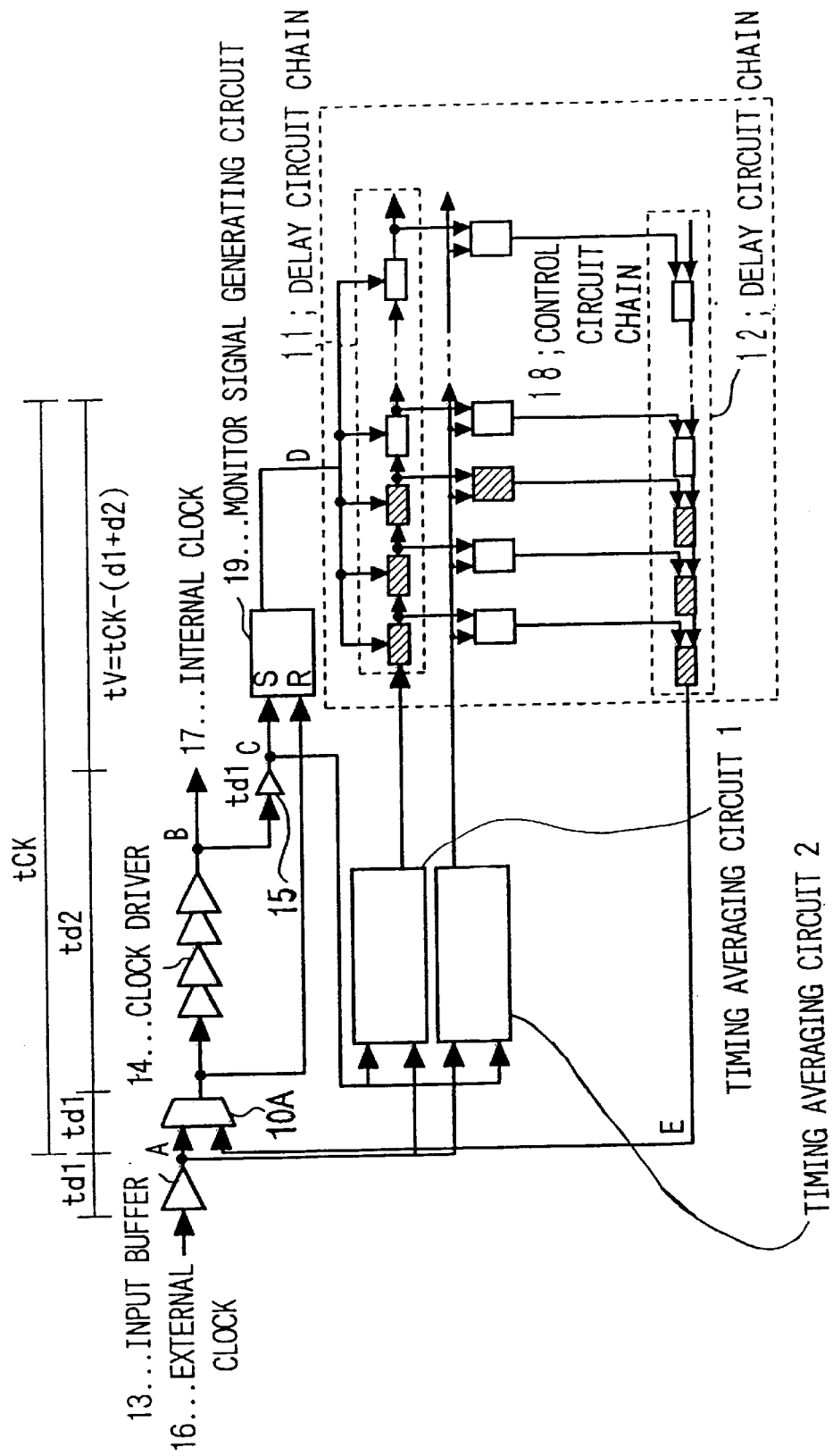
FIG. 38 is a diagram showing the construction of a clock control circuit using a synchronous delay circuit according to an embodiment of the present invention.

FIG. 38 illustrates the construction of a first embodiment of the fourth mode of the present invention. As shown in FIG. 38, this embodiment applies the averaging circuit of the present invention and the arrangement of the fourth embodiment, which comprises the art for stopping advance of the clock through the synchronous delay circuit by the monitor signal generating circuit; to the basic part shown in FIG. 24. According to this embodiment, two of the timing averaging circuits are used, both the first and second timing averaging circuits 1 and 2 receive the output of the input buffer 13 and the output of the input buffer dummy 15 as inputs, the output of one of the timing averaging circuits enters the delay circuit chain 11 and the output of the delay circuit is used as a signal for transferring a signal from the delay circuit chain 11 to the delay circuit chain 12. The two timing averaging circuits are basically identical in construction and are capable of being set separately to averaging ratios (internal-division ratios) of the two input signals. The averaging ratio or internal-division ratio of the two input signals can be set by deciding the ratio of the sizes (e.g., transistor widths) of the transistors that receive the two input signals in the timing averaging circuits.

By separately setting the averaging ratios or internal-division ratios of the two timing averaging circuits, it is possible to suppress the occurrence of a phase error owing to the provision of two timing averaging circuits.

In this embodiment also the arrangement is such that whether a timing averaging circuit is used or not is decided by a changeover unit (not shown). Timing averaging is carried out from the moment the internal clock is output via the delay circuit.

[Embodiment 4-2]

Figure 39:
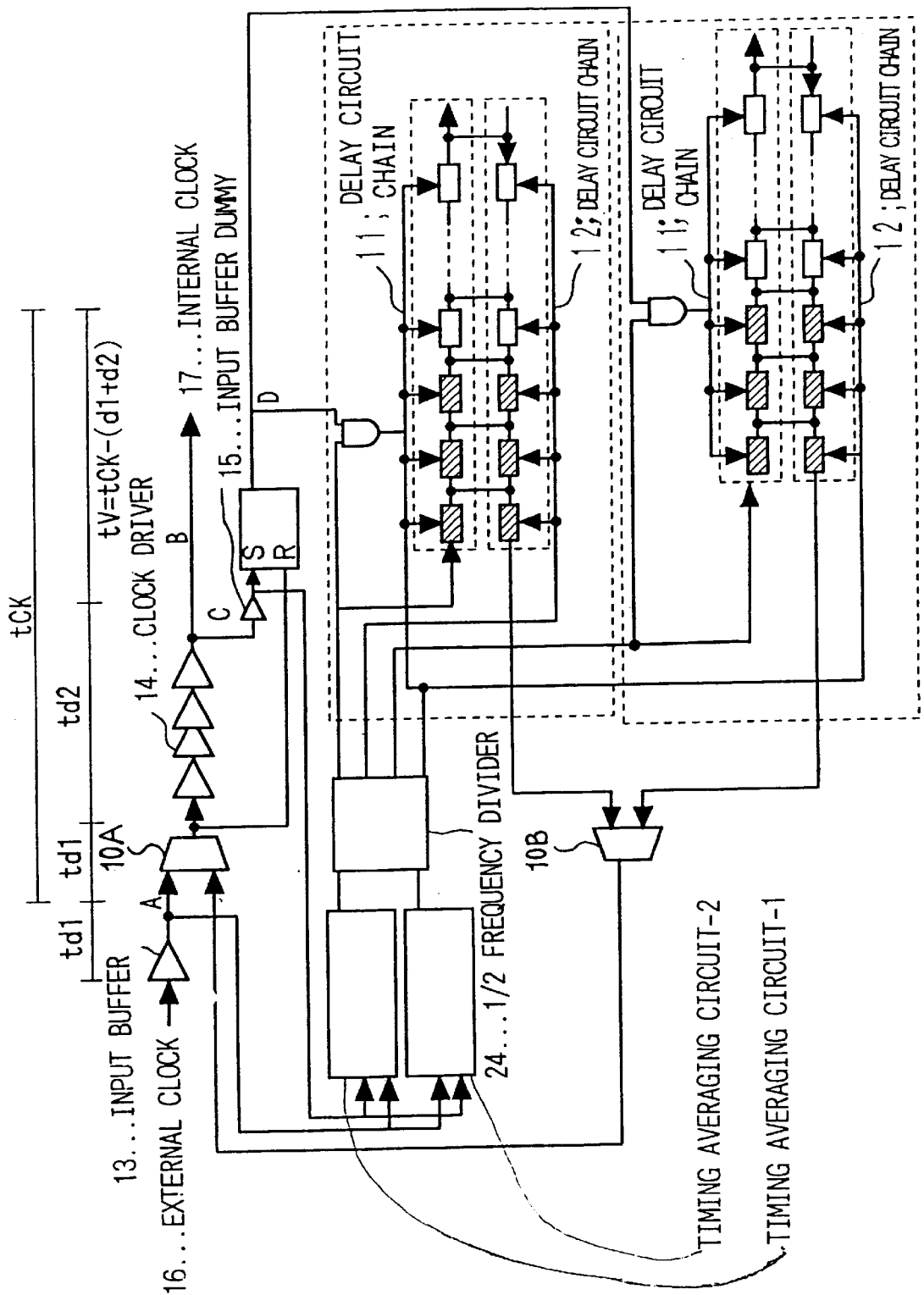
FIG. 39 is a diagram showing the construction of a clock control circuit using a synchronous delay circuit according to an embodiment of the present invention.

FIG. 39 illustrates the construction of a second embodiment of the fourth mode of the present invention. This embodiment applies the arrangement of the fourth mode to the basic part illustrated in FIG. 25. Two timing averaging circuits are used in this embodiment as well. In the arrangement shown in FIG. 39, continuous operation is implemented by frequency dividing the clock and using the basic part circuits of FIG. 25 in two sets in alternating fashion.

The outputs of the first and second timing averaging circuits 1 and 2 enter the divider circuit 24, which internally selects or logically combines these signals, and the appropriate timing can be selected from the outputs of the two timing averaging circuits at the rising edge and falling edge of the frequency-divided signal. This selection of timing depends upon the particular case, namely whether reduction of external jitter or reduction of phase error takes precedence. A description is not given here. The selection circuit per se and the frequency divider circuit per se can be implemented by the usual circuit designs. The output of the delay circuits 12 of the two delay circuit chains sets is selected by changeover unit 10B and input to a changeover unit 10A, when the signal is supplied to the clock driver 14.

[Embodiment 4-3]

Figure 40:
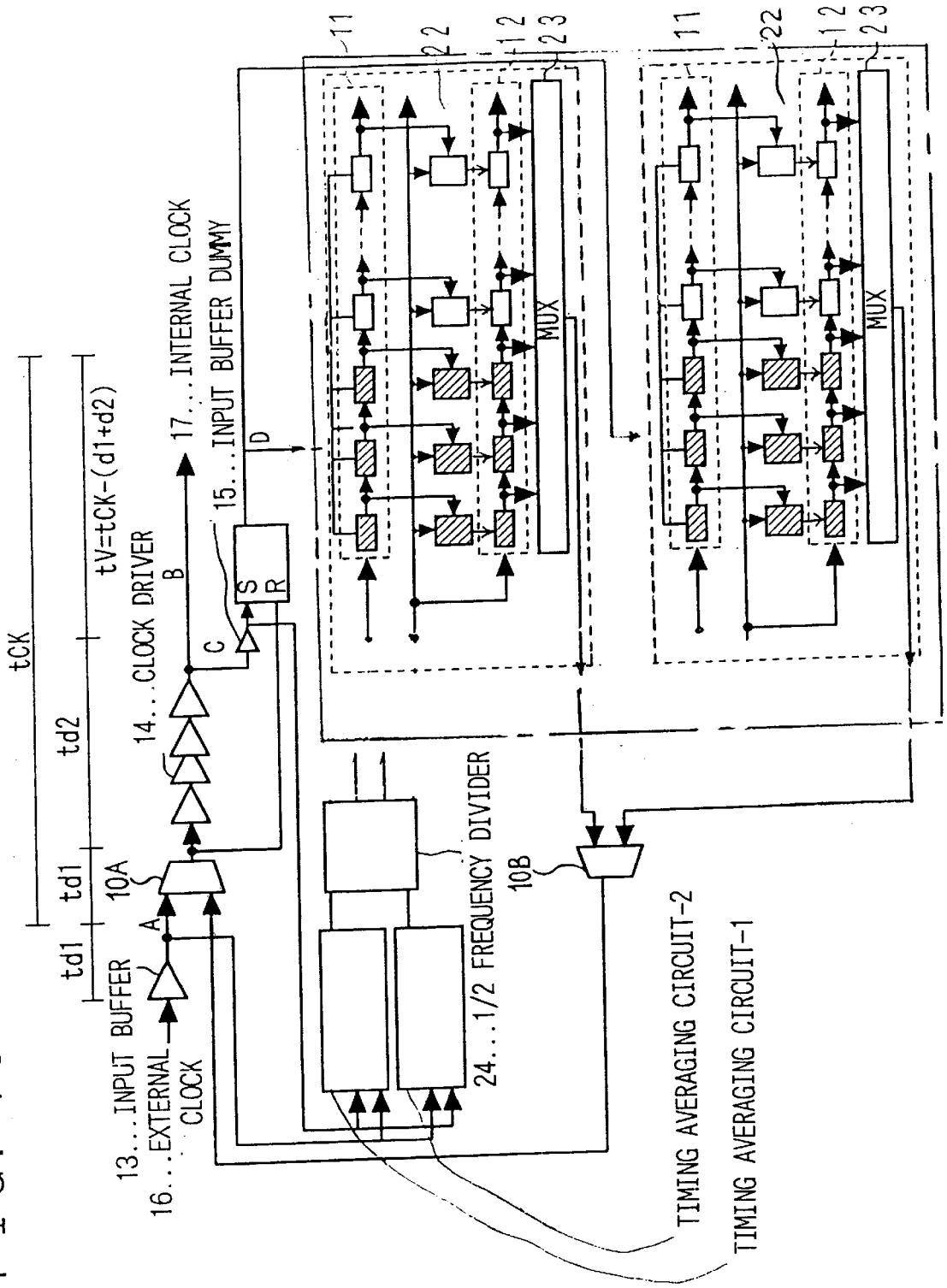
FIG. 40 is a diagram showing the construction of a clock control circuit using a synchronous delay circuit according to an embodiment of the present invention.

FIG. 40 illustrates the construction of a third embodiment of the fourth mode of the present invention. This embodiment applies the fourth mode to the basic part shown in FIG. 26. Two timing averaging circuits are used in this embodiment as well.

[Embodiment 4-4]

Figure 41:
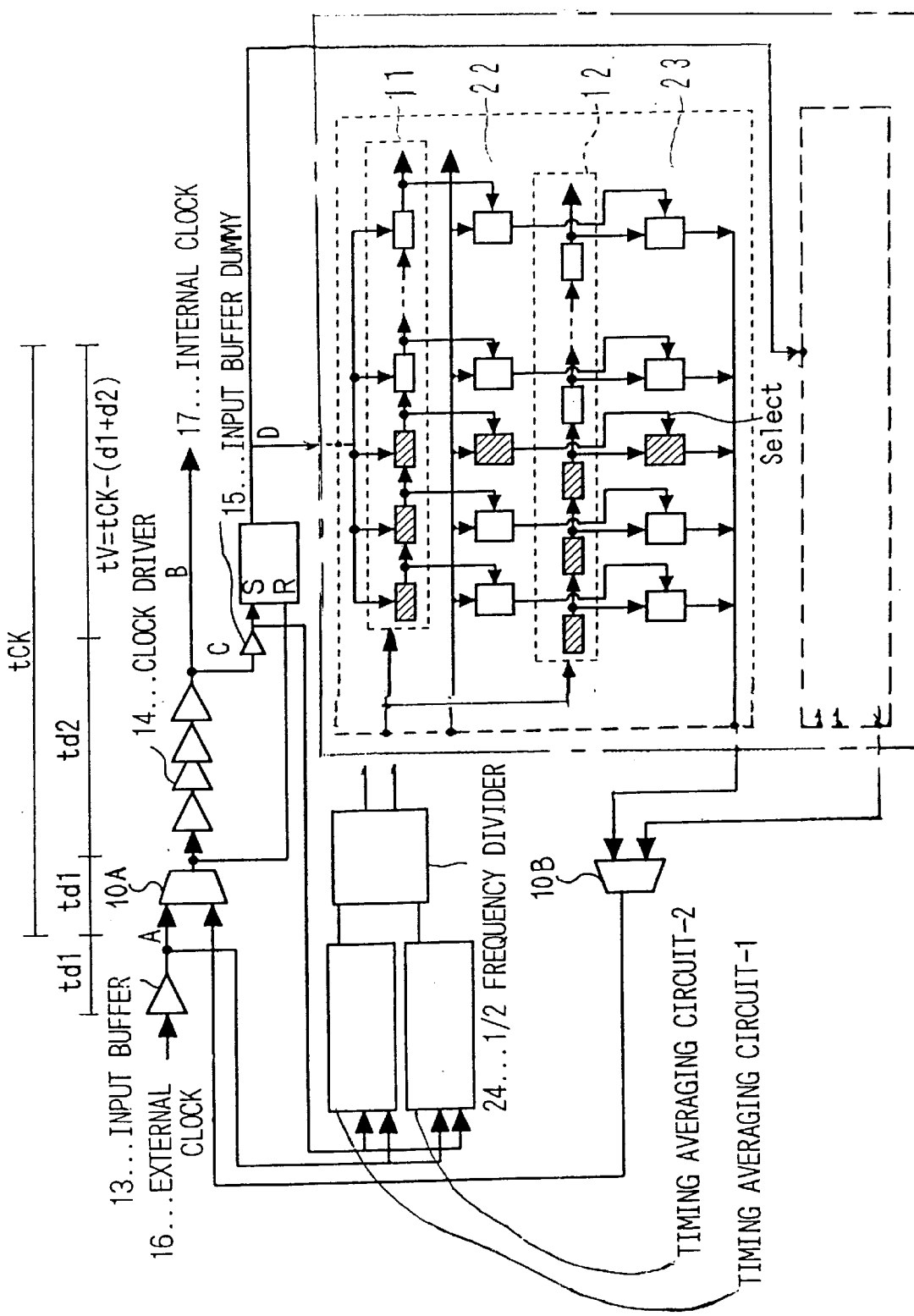
FIG. 41 is a diagram showing the construction of a clock control circuit using a synchronous delay circuit according to an embodiment of the present invention.
Figure 42:
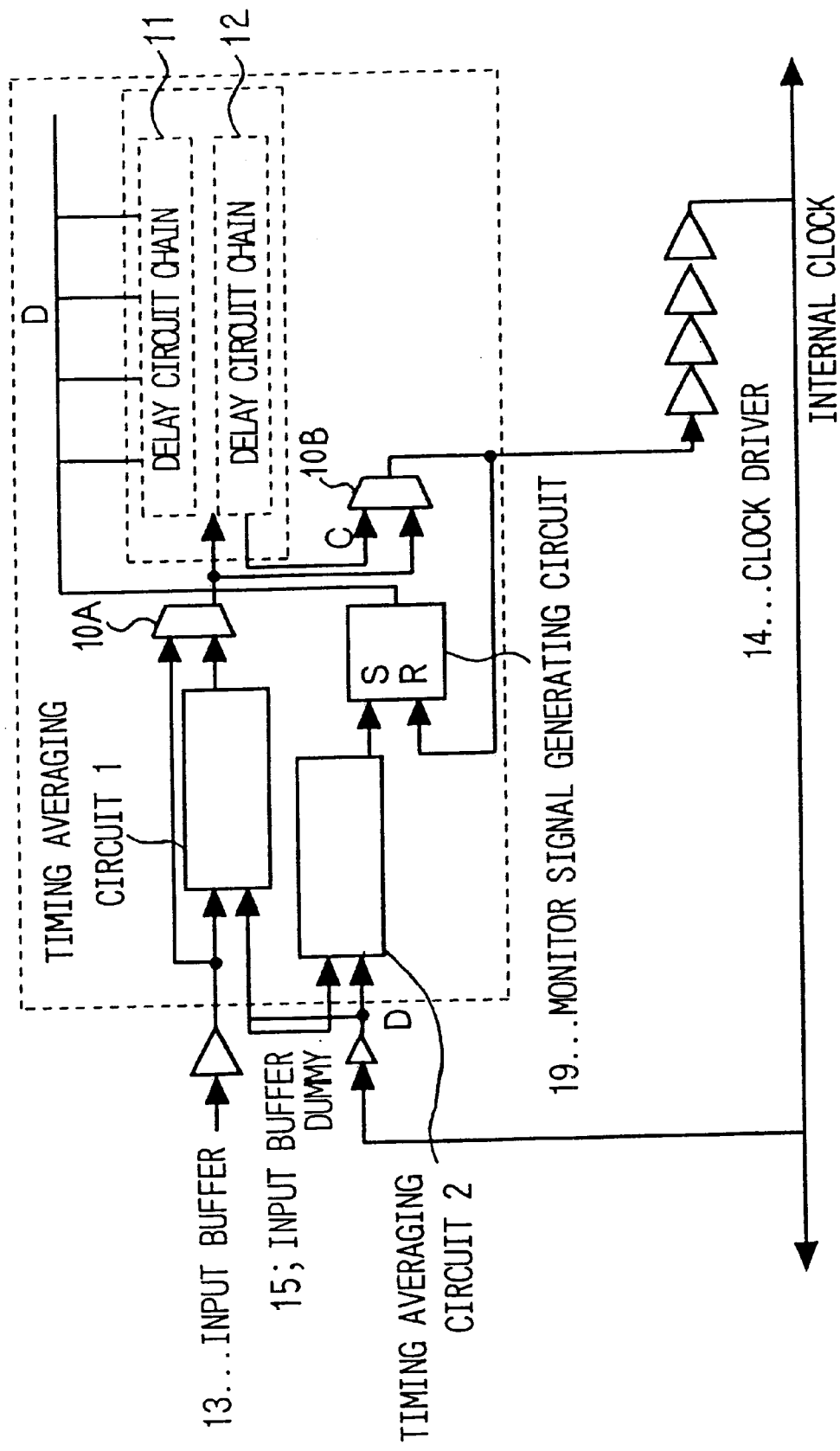
FIG. 42 is a diagram showing the construction of a clock control circuit using a synchronous delay circuit according to an embodiment of the present invention.

FIG. 41 illustrates the construction of a fourth embodiment of the fourth mode of the present invention. This embodiment applies the fourth mode to the basic part shown in FIG. 27. Two timing averaging circuits are used in this embodiment as well. The outputs of the first and second timing averaging circuits 1, 2 are frequency divided by the divide-by-two frequency divider circuit 24 and are used as signals that decide the input and delay length of the delay circuit 11 of the two delay circuits. The output of the delay circuit 12 is selected by the changeover unit 10B and input to the changeover unit 10A, when the signal is applied to the clock driver 14.

[Fifth Mode of the Present Invention]

Figure 43:
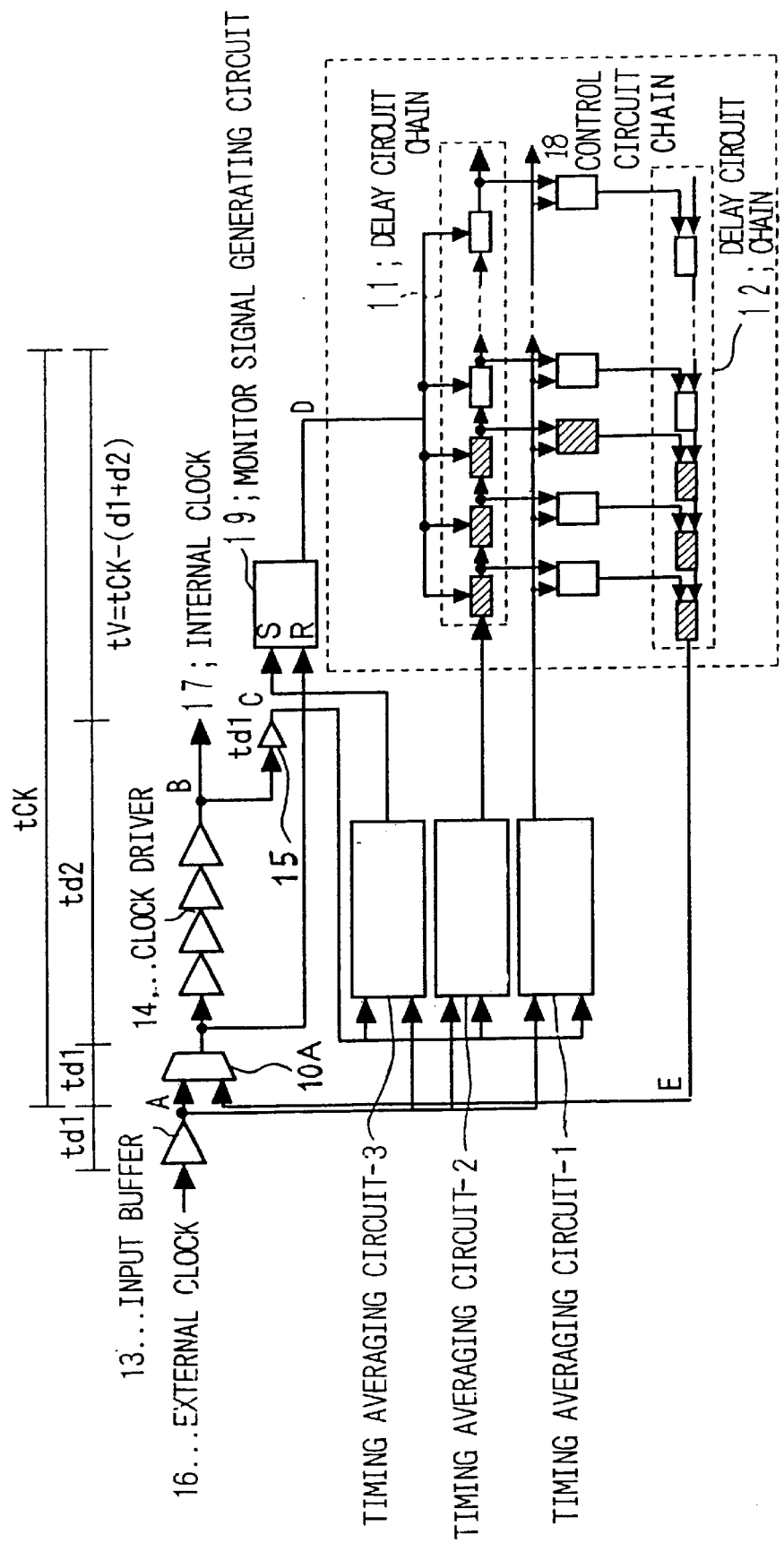
FIG. 43 is a diagram showing the construction of a clock control circuit using a synchronous delay circuit according to an embodiment of the present invention.

A fifth mode for practicing the present invention will now be described. As shown in FIG. 43, the synchronous delay circuit according to the fifth mode of the present invention has a plurality of the timing averaging circuits for averaging the cycles between pulses of the clock signal. The external clock signal from the input buffer 13 and the internal clock signal from the input buffer dummy 15 enter each of the timing averaging circuits 1, 2, and the outputs of the timing averaging circuits 1, 2 are connected to the delay circuit chains 11, 12 and to the monitor signal generating circuit 19. The timing averaging circuits 1, 2 are basically identical in construction and are capable of being set separately to averaging ratios (internal-division ratios) of the two input signals. The averaging ratio or internal-division ratio of the two input signals can be set by deciding the ratio of the sizes (e.g., transistor widths) of the transistors that receive the two input signals in the timing averaging circuits.

By separately setting the averaging ratios or internal-division ratios of the two timing averaging circuits 1, 2, it is possible to suppress the occurrence of a phase error owing to the provision of two timing averaging circuits.

[Embodiment 5-1]

FIG. 43 illustrates the construction of a first embodiment of a fifth mode for practicing the present invention. This embodiment applies the fifth mode of the present invention to the basic part illustrated in FIG. 24. The embodiment has three timing averaging circuits 1, 2, 3 each of which receives the output of the delay circuit chain 12 and output of the input buffer dummy 15 as inputs. The output of the timing averaging circuit 1 is input to the delay circuit chain 11, the output of timing-averaging circuit 2 is used as a signal for transferring a signal from the delay circuit chain 11 to the delay circuit chain 12, and the output of the timing averaging circuit 3 is input to the monitor signal generating circuit 19.

Whether a timing averaging circuit is used or not is decided by a changeover unit (not shown). Timing averaging is carried out from the moment the internal clock signal is output from the clock driver 14 via the delay circuit chains 11, 12.

[Embodiment 5-2]

Figure 44:
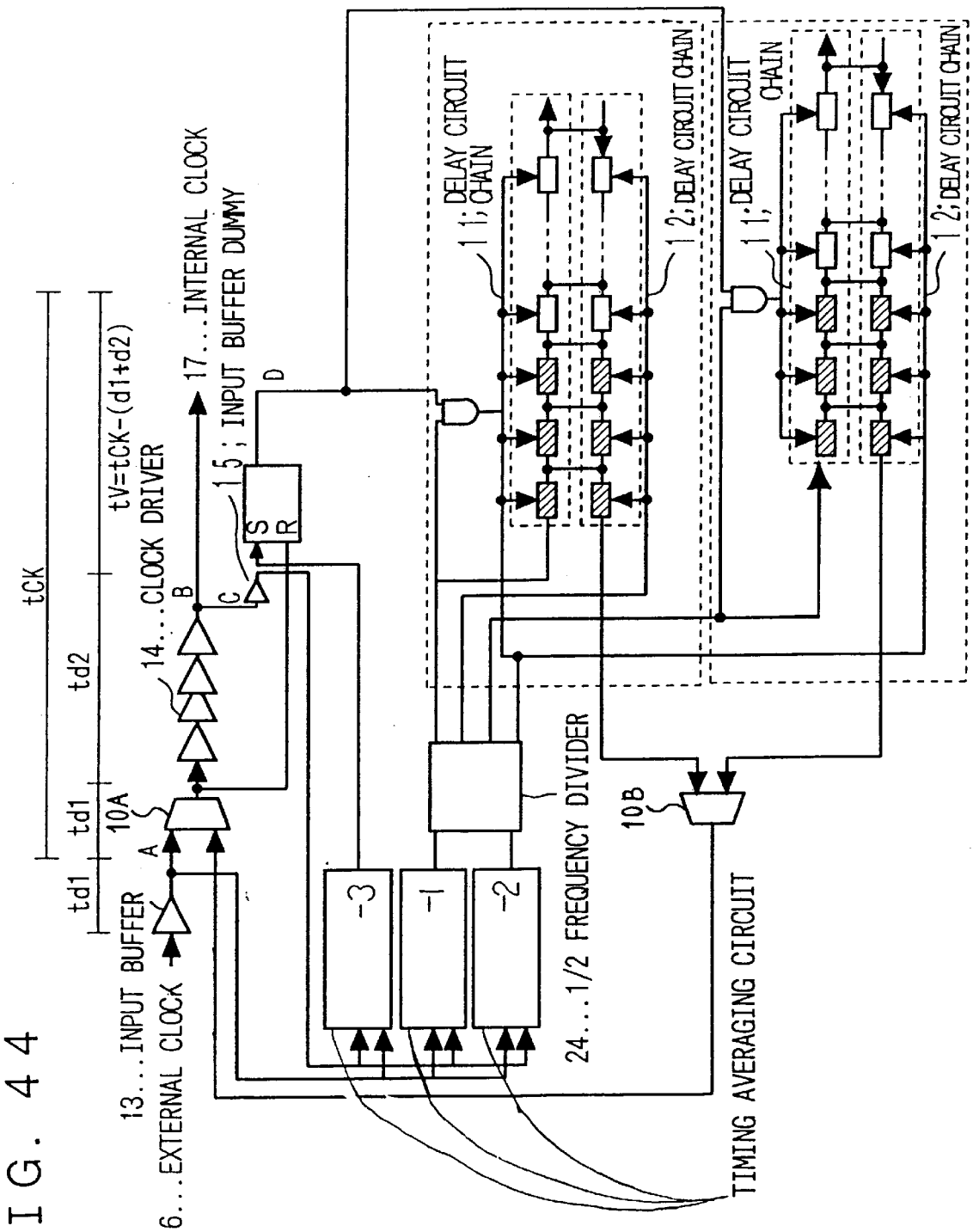
FIG. 44 is a diagram showing the construction of a clock control circuit using a synchronous delay circuit according to an embodiment of the present invention.

FIG. 44 illustrates the construction of a second embodiment of a fifth mode for practicing the present invention. This embodiment applies the fifth mode of the present invention to the basic part illustrated in FIG. 25. The embodiment also uses three timing averaging circuits 1, 2, 3. In the arrangement depicted in FIG. 44, continuous operation is implemented by frequency dividing the clock by the frequency divider 24 and using the two delay circuit chains, which are circuits exemplifying the basic part circuits of FIG. 25, in two sets in alternating fashion.

The outputs of the two timing averaging circuits 1 and 2 enter the divider circuit 24, which internally selects or combines these signals, and the appropriate timing can be selected from the outputs of the two timing averaging circuits at the rising edge and falling edge of the frequency-divided signal. This selection of timing depends upon the particular case, namely whether reduction of external jitter or reduction of phase error takes precedence. A description is not given here. The changeover circuit per se and the frequency divider circuit per se can be implemented by the usual circuit designs and are not described here.

[Embodiment 5-3]

Figure 45:
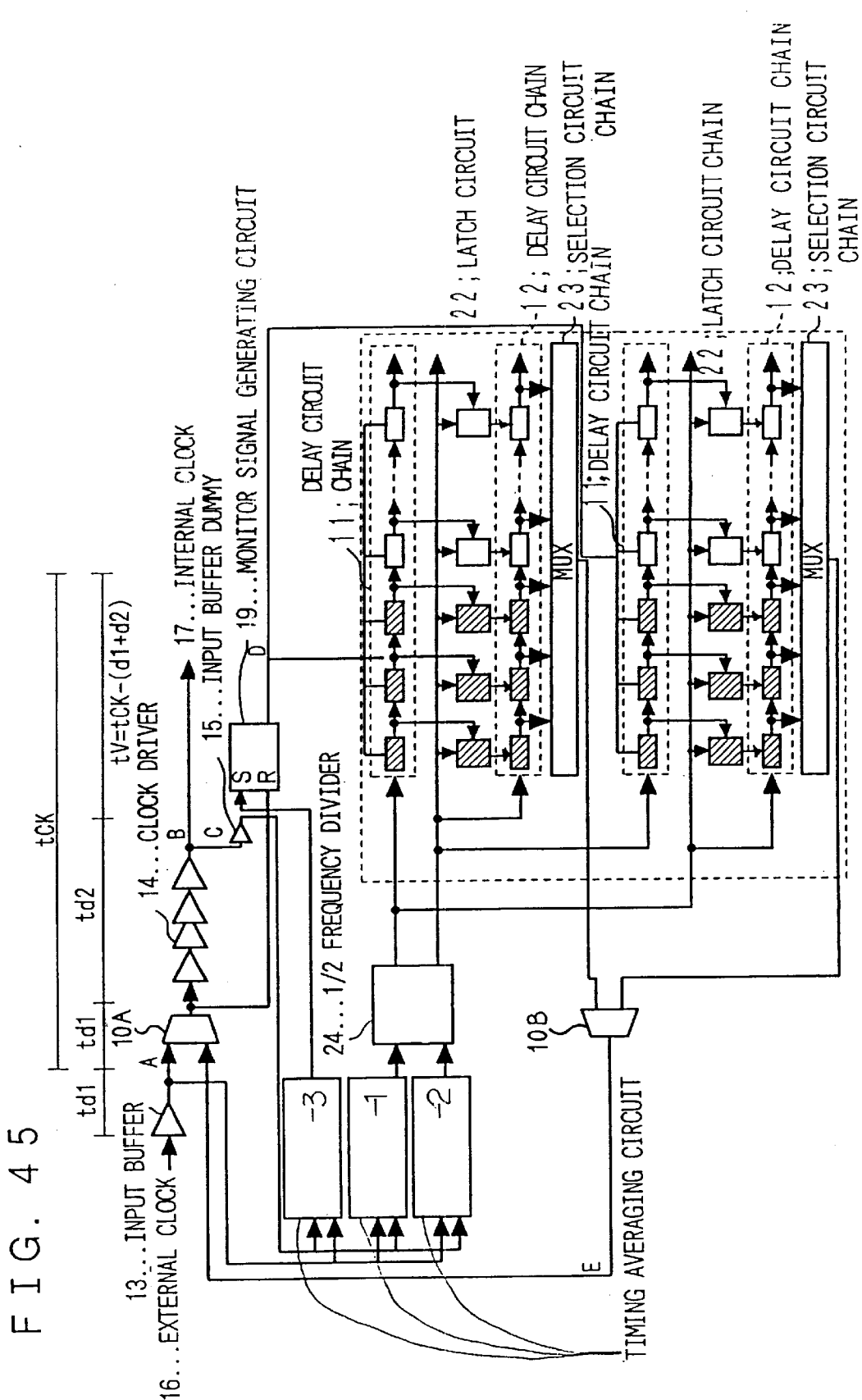
FIG. 45 is a diagram showing the construction of a clock control circuit using a synchronous delay circuit according to an embodiment of the present invention.

FIG. 45 illustrates the construction of a third embodiment of the fifth mode of the present invention. This embodiment applies the fifth mode to the basic part shown in FIG. 26. Three timing averaging circuits are used in this embodiment, too. In this embodiment also the output of the frequency divider 24, which frequency divides the outputs of the timing averaging circuits 1, 2, is applied to each of the delay circuit chains, and continuous operation is implemented by using the delay circuit chains in two sets in alternating fashion via the changeover unit 10B.

[Embodiment 5-4]

Figure 46:
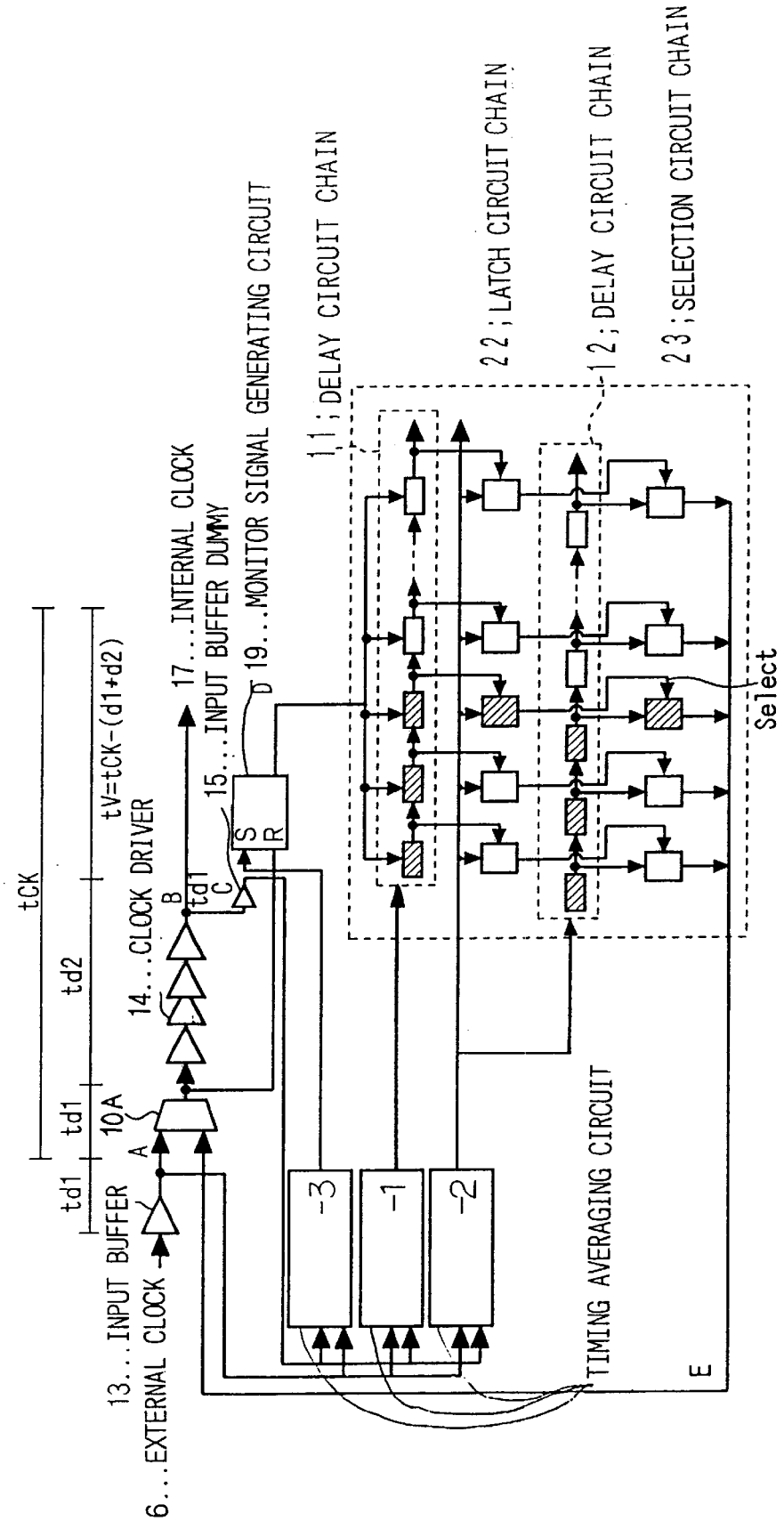
FIG. 46 is a diagram showing the construction of a clock control circuit using a synchronous delay circuit according to an embodiment of the present invention.

FIG. 46 illustrates the construction of a fourth embodiment of the fifth mode of the present invention. This embodiment applies the fifth mode to the basic part shown in FIG. 27. Three timing averaging circuits are used in this embodiment, too. The output of the input buffer 13 and a signal obtained by passing the internal clock 17 through the input buffer dummy 15 enter each of the timing averaging circuits 1, 2, 3. The output of the timing averaging circuit 1 is applied to the delay circuit chain 11, the output of the timing averaging circuit 2 is supplied as a signal for controlling transfer from the delay circuit chain 11 to the delay circuit chain 12, and the output of the timing averaging circuit 3 is applied to the monitor signal generating circuit 19.

[Sixth Mode of the Present Invention]

Figure 47:
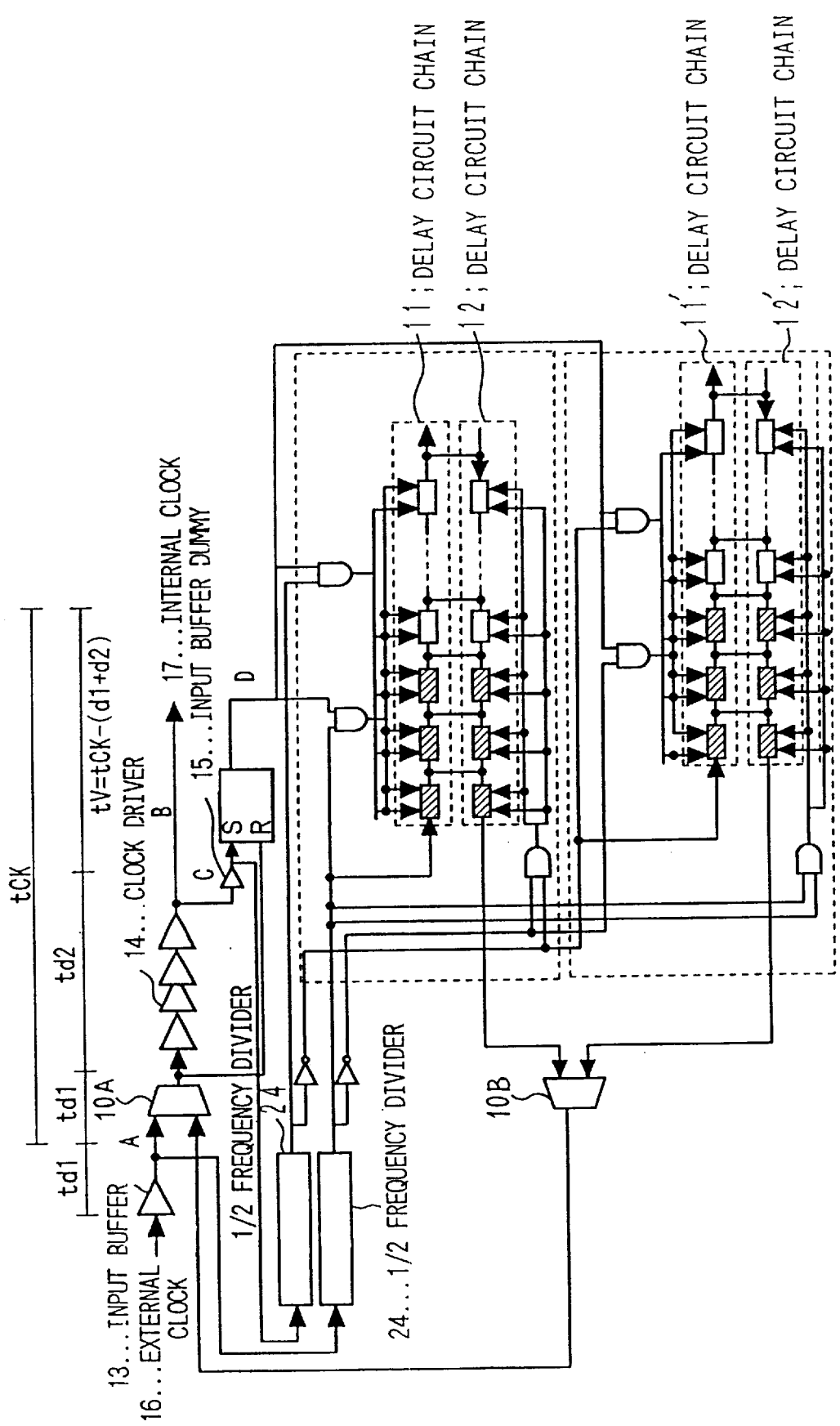
FIG. 47 is a diagram showing the construction of a clock control circuit using a synchronous delay circuit according to an embodiment of the present invention.
Figure 50:
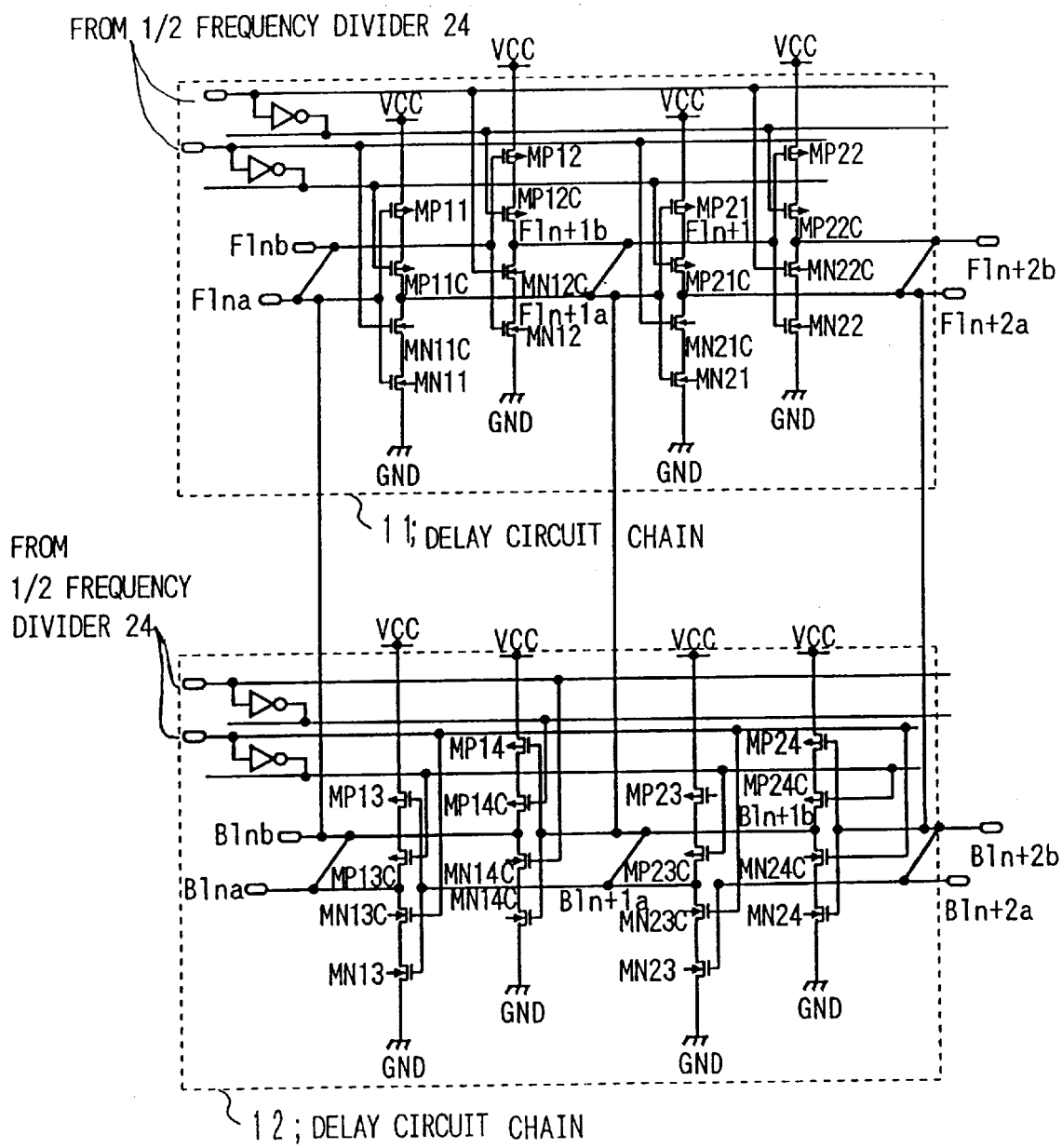
FIG. 50 is a diagram showing the construction of a synchronous delay circuit having a timing averaging circuit according to an embodiment of the present invention.

A sixth mode for practicing the present invention will now be described. As shown in FIG. 47, a timing averaging circuit for averaging the cycles between pulses of the clock signal is not expressly shown in the form of a circuit block. The timing averaging circuits are incorporated within the delay circuit chains. As shown in FIG. 50, the delay circuit chains themselves are constructed by arraying gates in parallel and function as timing averaging circuits.

More specifically, as shown in FIG. 50, the first and second delay circuit chains 11, 12 have, as a delay circuit of one stage, first and second clocked inverter circuits (MN11, MP11, MN11C, MP11C and MN12, MP12, MN12C, MP12C) arranged in parallel with respect to the input signals, output nodes (FIn+1b, FIn+1a) to which first and second clock driver circuits are commonly connected are charged and discharged, and each node (FIn+1b, FIn+1a) of the first delay circuit chain 11 is connected to the corresponding node (BIn+1b, BIn+1a) of the second delay circuit chain 12. In the arrangement shown in FIG. 50, a PMOS transistor MP11 and an NMOS transistor MN11 of the clocked inverter are connected to the power supply and ground, respectively, at locations closer to the power supply and ground than transistors MP11C, MN11C, which are for controlling activation and deactivation. That is, the transistors MP11C, MN11C for controlling activation and deactivation are disposed between the power supply and ground at positions further inward than the CMOS transistors for signal drive.

As shown in FIG. 47, the external clock from the input buffer 13 and a signal obtained by passing the internal clock through the input buffer dummy 15 are frequency divided by the divide-by-two frequency divider circuits 24 and then applied to the delay circuit chain 11 as its two inputs. Transistors MP11C, MN11C for switch control are turned on and off by the frequency-divided signals from the frequency dividers 24 of FIG. 47.

The parallel delay circuit chains are basically identical in construction and the averaging ratios (internal-division ratios) are capable of being set independently depending upon the ratio of the sizes of the transistors (e.g., ratio of gate widths of the transistors).

In this embodiment, the clock path is not occupied solely for the sake of timing averaging. As a result, advantages are that there is no limitation imposed upon high-speed operation by a timing averaging circuit and that a timing difference between the external clock and internal clock is not limited to the delay time difference of the timing averaging circuit.

[Embodiment 6-1]

Figure 48:
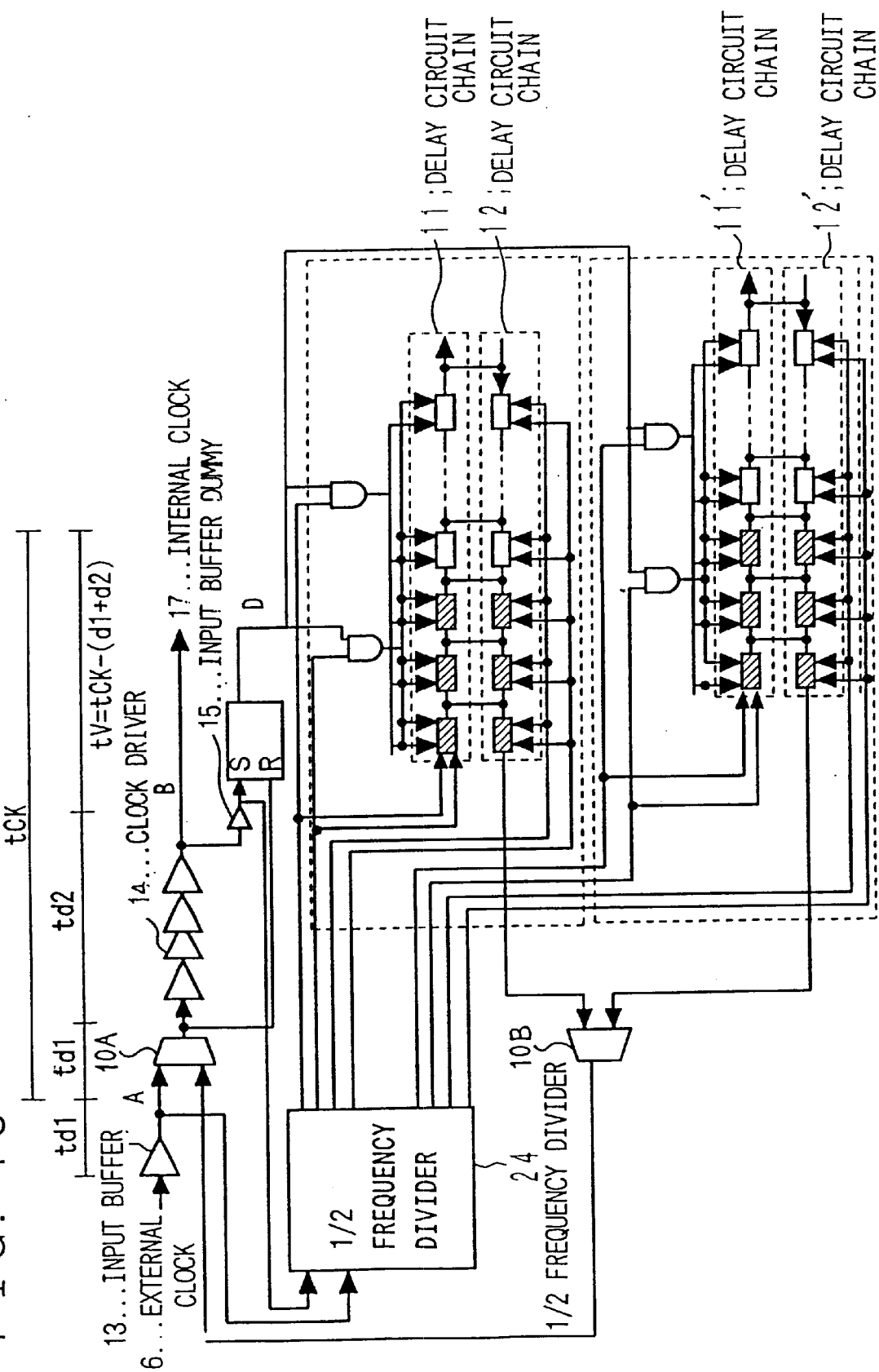
FIG. 48 is a diagram showing the construction of a clock control circuit using a synchronous delay circuit according to an embodiment of the present invention.

FIG. 48 illustrates the construction of a first embodiment of the sixth mode for practicing the present invention. According to this embodiment, the timing averaging circuits are incorporated within the delay circuits, as shown in FIG. 50, and the delay circuits themselves are constructed by arraying gates in parallel and function as timing averaging circuits. As shown in FIG. 48, the external clock from the input buffer 13 and a signal obtained by passing the internal clock signal 17 through the input buffer dummy 15 are frequency divided by the divide-by-two frequency divider circuit 24 and then applied as two input signals to each delay circuit chain 11, 11' in each of two sets of the delay circuit chains and also input as a signal for deciding the delay length. The appropriate timing can be selected by the changeover unit 10B from the outputs (2 sets) of the two timing averaging circuits at the rising edge and/or falling edge of the signal frequency divided by the frequency divider 24. This selection of timing depends upon the particular case, namely whether reduction of external jitter or reduction of phase error takes precedence. A description is not given here. The changeover circuit per se and the frequency divider circuit per se can be implemented by the usual circuit designs and are not described here.

Figure 49:
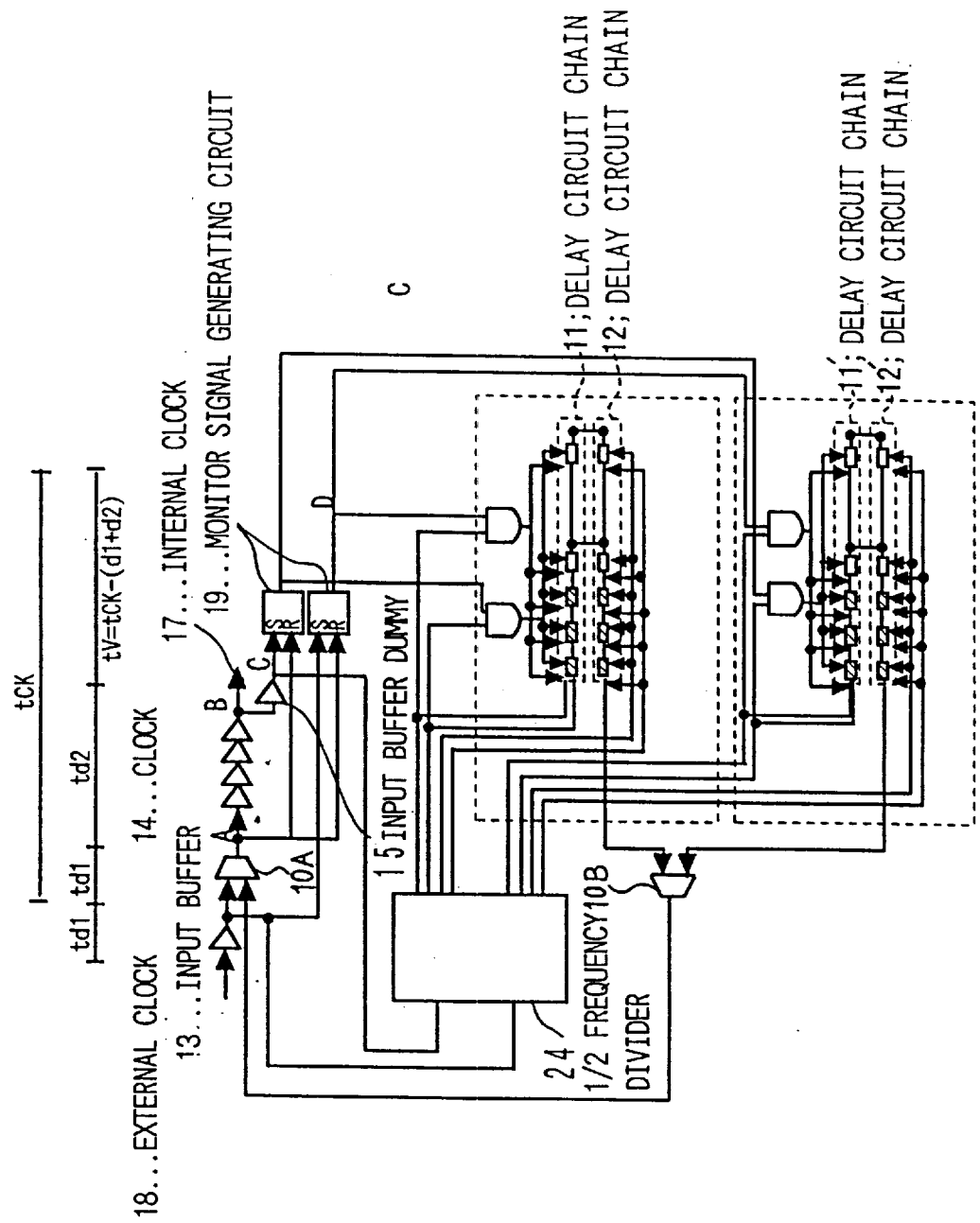
FIG. 49 is a diagram showing the construction of a clock control circuit using a synchronous delay circuit according to an embodiment of the present invention.

FIG. 49 illustrates the construction of a second embodiment of the fifth mode of the present invention. As in the arrangement shown in FIG. 48, in this embodiment the timing averaging circuits are incorporated in the delay circuit chains 11, 12. This arrangement differs from that shown in FIG. 48 in that it is equipped with two of the monitor signal generating circuits 19 for respective ones in each set of the delay circuit chains. The monitor signal generating circuit 19 generates the monitor signal for halting the advance of the clock through the delay circuit chain 11 for a period of time equivalent to the delay times of the clock driver and input buffer dummy.

Figure 25:
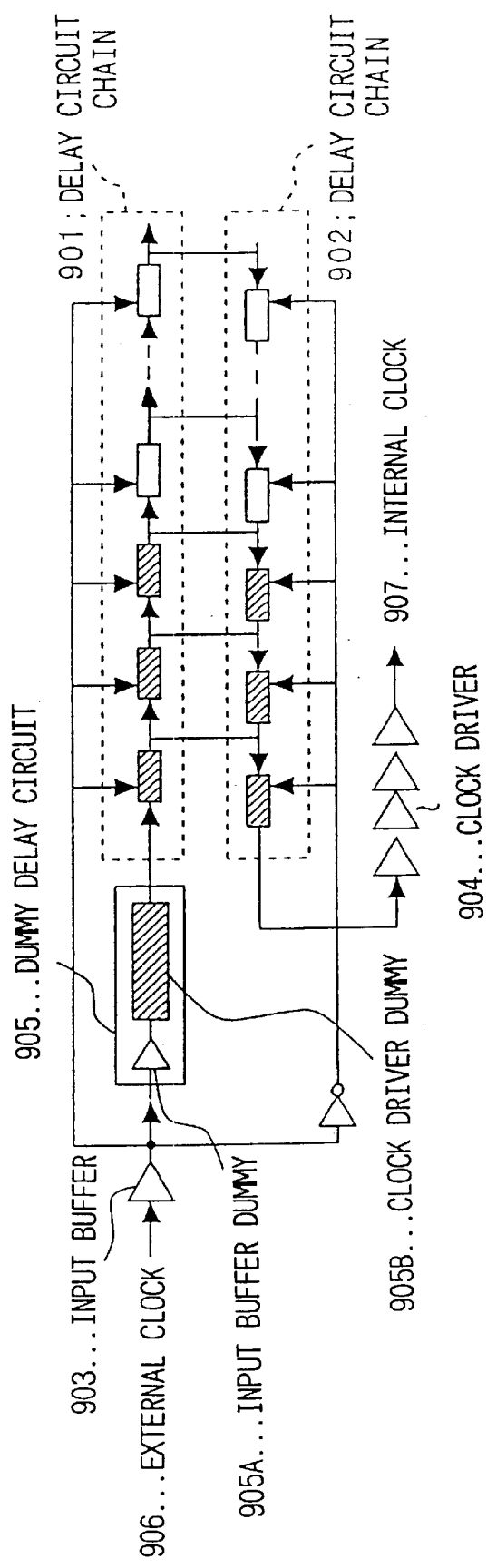
FIG. 25 is a diagram showing the construction of a clock control circuit using a synchronous delay circuit according to a basic structure.
Figure 26:
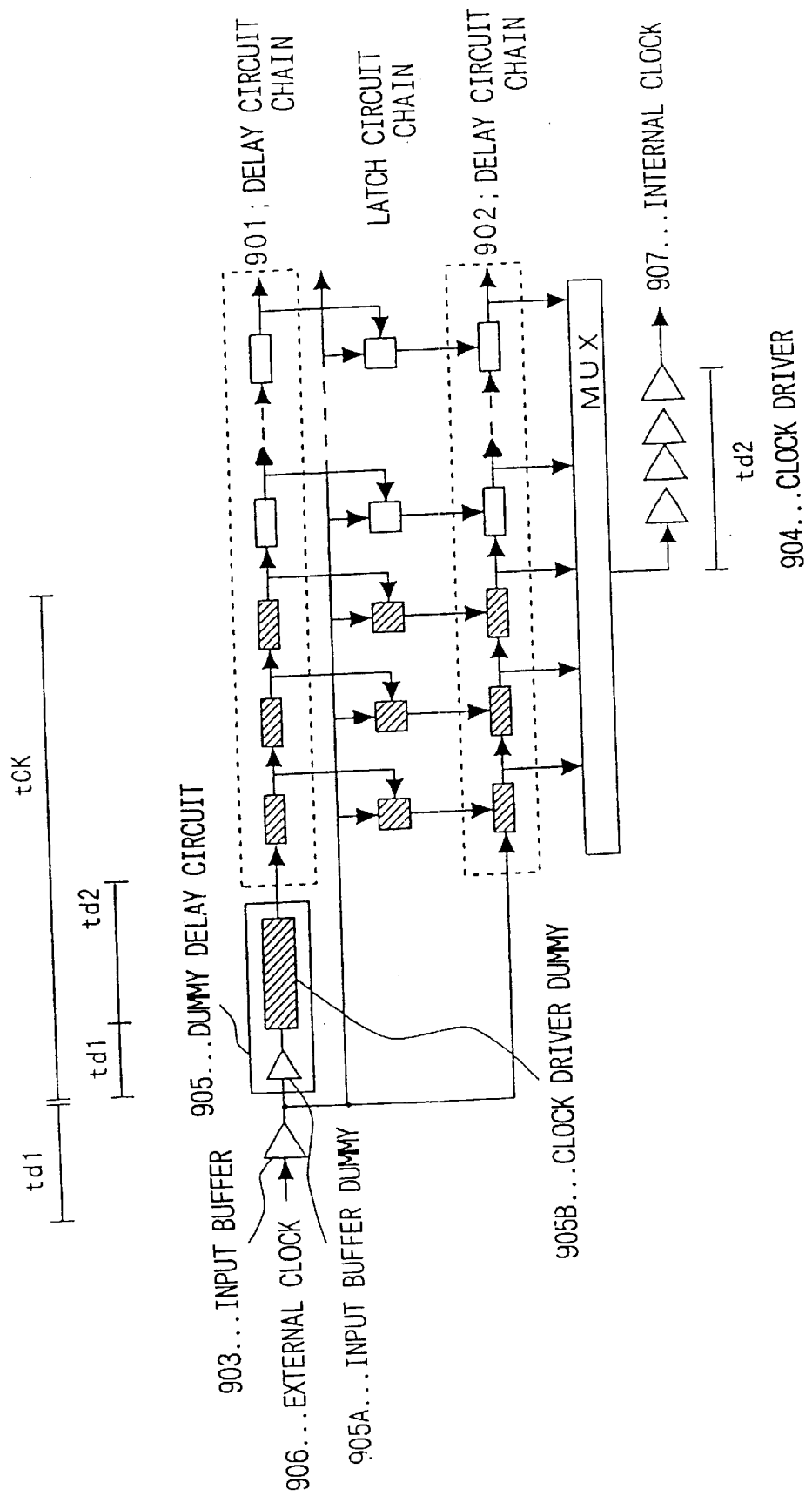
FIG. 26 is a diagram showing the construction of a clock control circuit using a synchronous delay circuit according to a basic structure.
Figure 27:
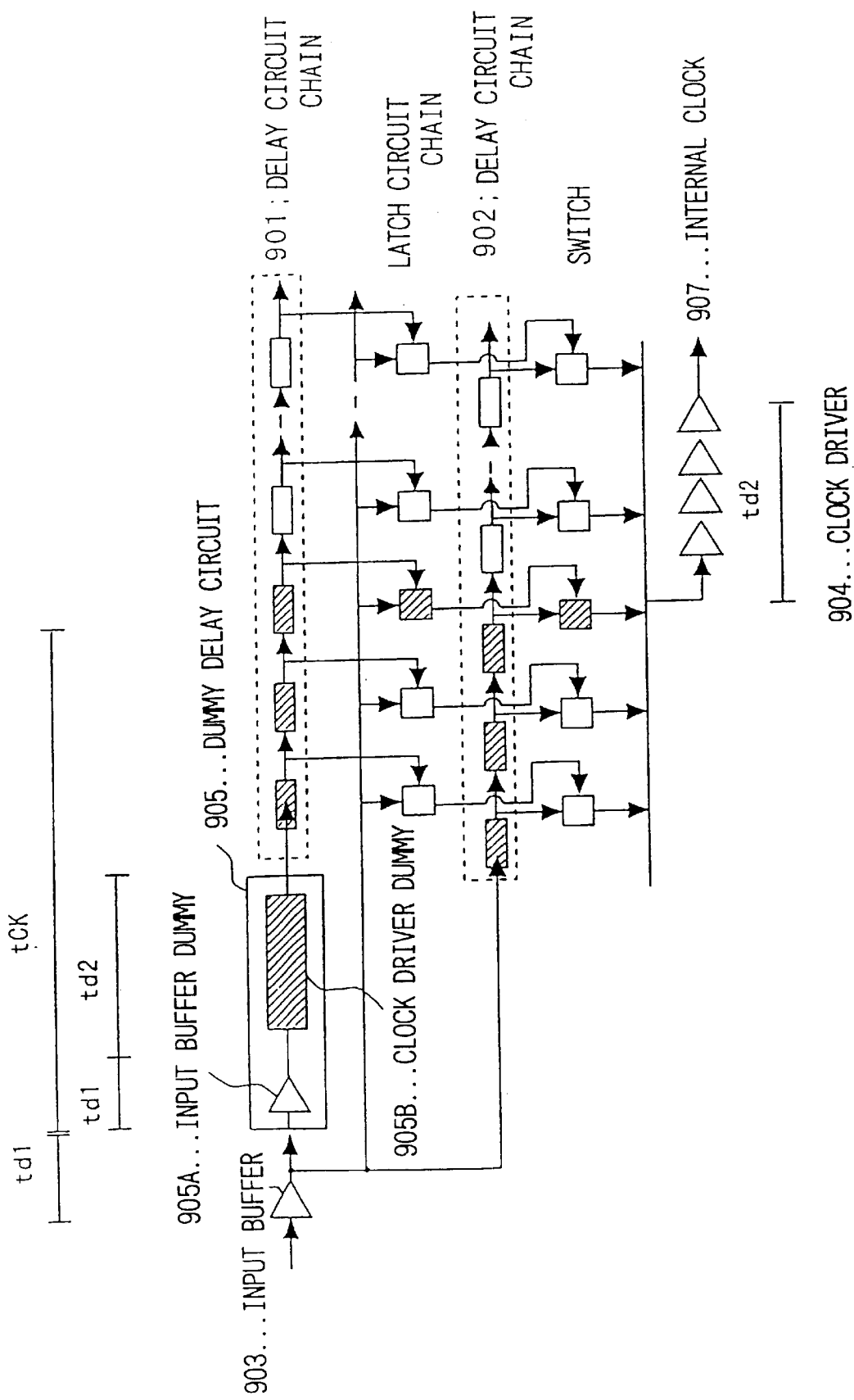
FIG. 27 is a diagram showing the construction of a clock control circuit using a synchronous delay circuit according to a basic structure.
Figure 28A:
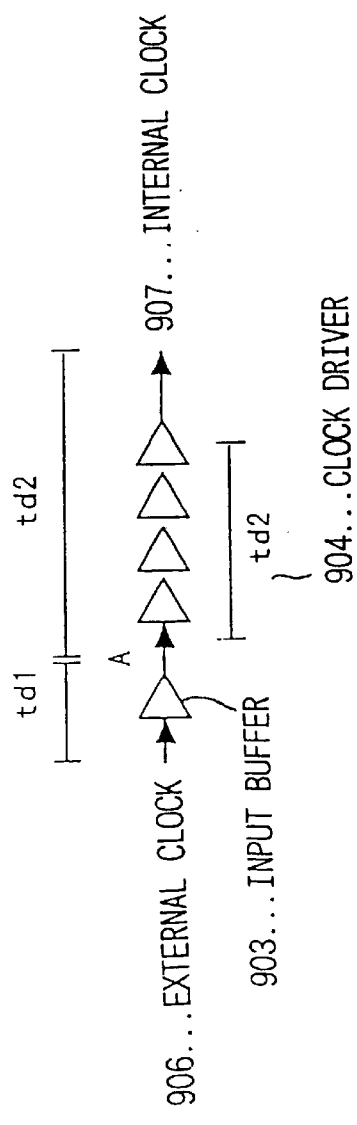
FIGS. 28(a) and 28(b) are diagrams showing the construction of a clock control circuit using a synchronous delay circuit according to a basic structure.
Figure 28B:
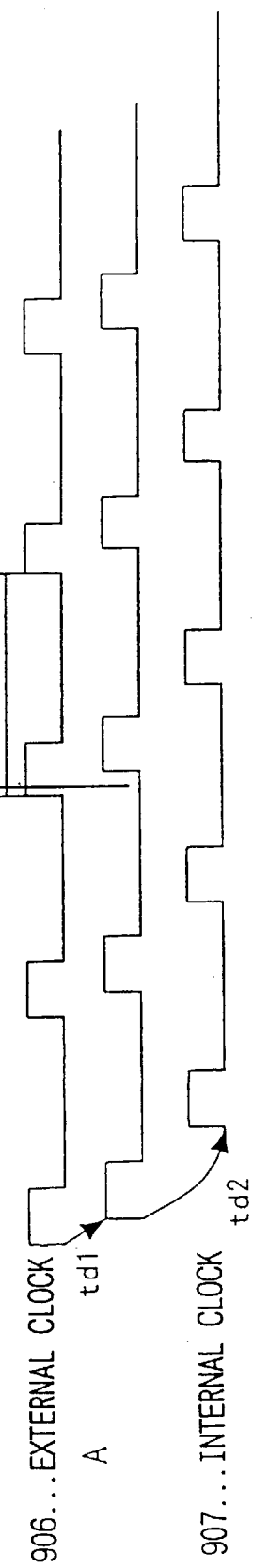

Though this mode and its embodiments use the basic part of FIG. 25 as a base, similar effects are obtained if the basic parts shown in FIGS. 24, 27 and 28 are adopted as the base.

Further, the delay circuit chains 11, 12 are constructed in units of delay circuits composed of clocked inverters. Among the serially connected transistors of the delay circuits, the transistors of the clocking gates are disposed on the output side, and timing averaging and control of clock signal advance are given a higher priority than passage through the delay circuits.

Part of one of the delay circuit chains shown in FIG. 50 can be extracted and utilized as a timing averaging circuit of a synchronous delay circuit.

In addition, in order to reduce the number of elements in the delay circuit chains, the delay circuit chains shown in FIG. 50 may be constructed by adopting an arrangement in which the PMOS transistors and NMOS transistors are repeated in one chain in alternating fashion. Such an arrangement is shown in FIG. 51 and reduces the number of elements by approximately half.

Figure 51:
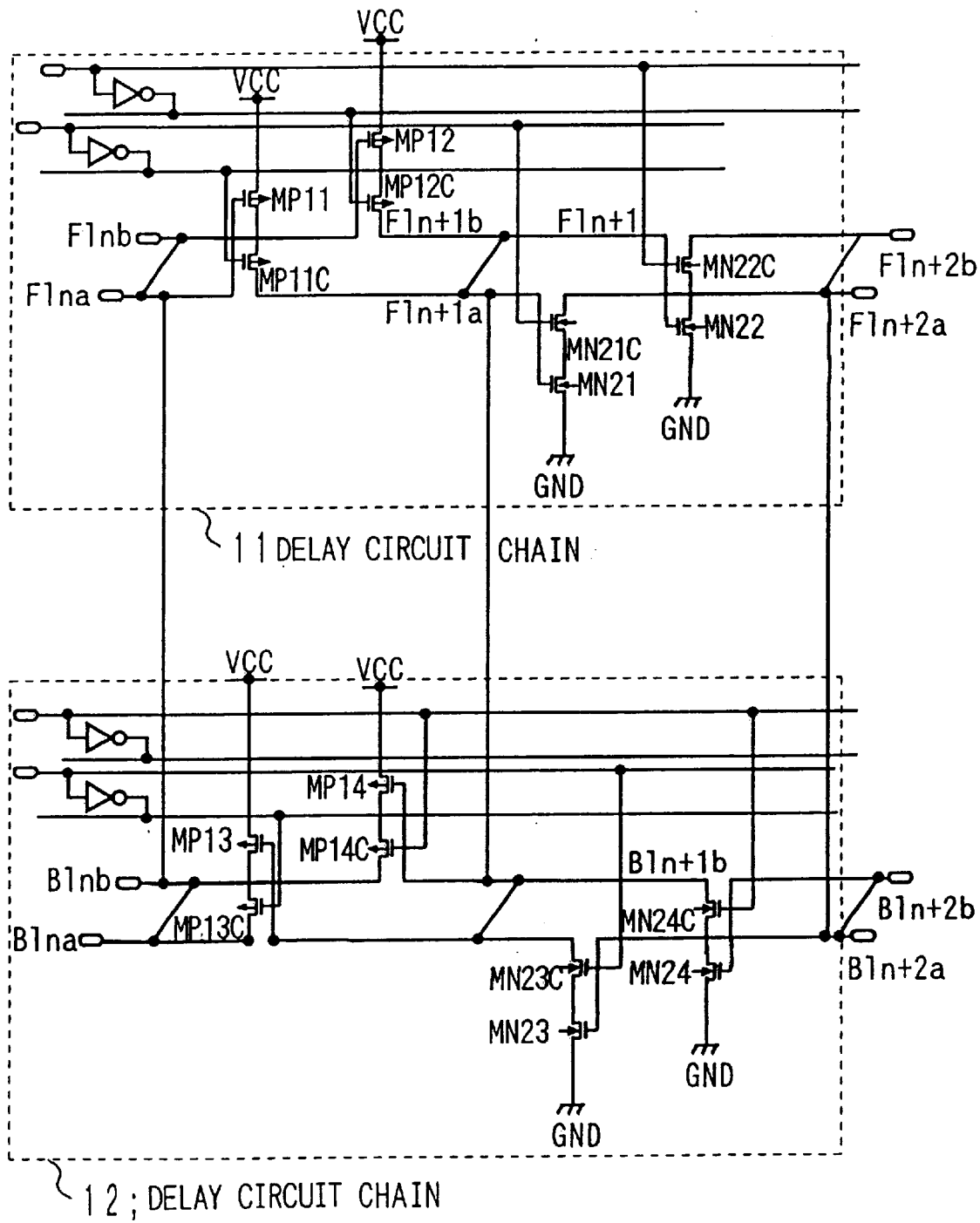
FIG. 51 is a diagram showing the construction of a synchronous delay circuit having a timing averaging circuit according to an embodiment of the present invention.

In FIG. 51, the delay circuit chain 11 has first and second PMOS switches MP11, MP12 in one stage for being turned on by the falling edges of the first and second input signals. These first and second PMOS switches MP11, MP12 are turned on in response to the falling edges of the first and second input signals, whereby the common output nodes of these first and second PMOS switches are charged. The commonly connected nodes are input to the first and second NMOS switches MN21, MN22 of the next stage. These first and second NMOS switches MN21, MN22 of the next stage are turned on in response to the rising edge of the commonly connected nodes, thereby discharging the output nodes to ground. The delay circuit chain 12, through which signals propagate in a direction opposite that of the delay circuit chain 11, has PMOS switches MP13, MP14 and NMOS switches MN23, MN24 in the stages that correspond to the PMOS switches MP12, MP13 and NMOS switches MN21, MN22 of each stage of the delay circuit chain 11. The output node of the PMOS switch stage of delay circuit chain 11 is connected to the output node of the NMOS switch in delay circuit chain 12 of a stage thereof preceding the PMOS switch which corresponds to the above-mentioned stage. A switch is inserted between each PMOS switch and the power supply VCC and between the NMOS switch and the output in order to control the ON/OFF (closing and opening) of these paths.

In order to deal with long cycles, the delay circuits may be make ring-shaped and the number of times signals circulate through the rings may be controlled by a counter (see the specification of Japanese Patent Kokai Publication No. 8-137091).

Effects of the Invention will be briefly mentioned as follows.

In accordance with the present invention, as described above, an averaging circuit is provided for generating a signal having a time component obtained by averaging an input time difference between two signals input with certain constant time difference between them, and pulses of a different clock signal are supplied to this circuit, thereby generating a clock signal in which the time difference between the different pulses is internally divided. As a result, clock signal jitter can be reduced without using a feedback circuit such as a PLL.

Further, in accordance with the present invention, the effect of reducing jitter can be doubled or enhanced by connected timing averaging circuits in series.

In accordance with the present invention, use is made of a multi phase clock obtained by frequency dividing a clock signal. This makes it possible to use a timing averaging circuit in which MOS transistors are simply arranged in parallel.

By increasing the number of phases of the multiphase clock, it is possible to cope with and support a high-frequency clock signal.

Furthermore, in accordance with the present invention, a timing averaging circuit can be realized through a simple arrangement, which employs NAND and NOR gates, by using fixed-delay circuit chain.

In accordance with the present invention, there is provided a system having a circuit for generating a signal having a time component obtained by averaging an input time difference between two signals input with certain constant time difference between them, and a circuit for applying pulses of a different clock signal to this circuit, wherein a DLL circuit is equipped with a circuit for internally dividing the time difference between these different pulses, an external clock input and an internal clock input used in a phase comparison are applied to the circuit which internally divides the time difference between the different pulses, and the output of this circuit is input to a voltage-controlled delay circuit. As a result, jitter of the clock signal is averaged by internal division with the internal clock, whereby jitter is reduced.

Further, in accordance with the present invention, when clock signal jitter is averaged by internal division with the internal clock, the internal-division ratio is decided so as to enlarge the timing component of the internal clock, thereby doubling/enhancing the jitter reducing effect.

In accordance with the present invention, a signal input to a phase comparator is changed over from the external clock to a signal obtained by internally dividing the external clock and the internal clock, with the changeover being made after locking is achieved. This reduces the influence of the external clock jitter on the stable operation of a DLL or PLL.

Furthermore, in accordance with the present invention, a synchronous delay circuit is equipped with an averaging circuit, thereby reducing the jitter component of the internal clock.

As many apparently widely different embodiments of the present invention can be made without departing from the spirit and scope thereof, it is to be understood that the invention is not limited to the specific embodiments thereof except as defined in the appended claims.

It should be noted that any further objects and aspects of the present invention will become apparent from the entire disclosure, other than those explicitly recited herein.

Also it should be noted any combination of any elements/ components/units/modules disclosed in the embodiments or omission of any part therefrom may be done within the generic concept of the present invention.

What is claimed is:

1. A clock control circuit of a semiconductor integrated circuit device for generating an internal clock from an entered external clock, comprising:

(a) a delay-locked loop adapted to vary delay of the input signal, and having at least a phase-difference sensing circuit, a charge pump, a loop filter and a voltage-controlled delay circuit, to which an output from said loop filter is input as a control voltage;

(b) a timing averaging circuit generating a signal having a time difference obtained by internally dividing, at a prescribed ratio, a time difference between two signals that are input with a fixed time difference between them;

(c) wherein an output of said voltage-controlled delay circuit is supplied as an internal clock via a clock driver; and (d) wherein a clock signal, which is input to said phase-difference sensing circuit, obtained by inputting the external clock via an input buffer, and a signal obtained by passing said internal clock through an input buffer dummy circuit having a delay time equivalent to that of said input buffer are applied to said timing averaging circuit, with an output of said timing averaging circuit being applied as an input signal to said voltage-controlled delay circuit.

2. The clock control circuit according to claim 1, wherein in said timing averaging circuit, internal-division ratio is decided in such a manner that timing ratio of the internal clock signal is enlarged as the ratio at which the time difference is internally divided, to said timing averaging circuit being input the external clock from said input buffer and the internal clock signal supplied from said voltage-controlled delay circuit through said clock driver and said input buffer dummy circuit.

3. The clock control circuit according to claim 1, further comprising:

(e) a lock sensing circuit for sensing a locked state from the output of said phase-difference sensing circuit; and (f) a changeover circuit supplying said phase-difference sensing circuit with either the input clock or the output of said timing averaging circuit;

(g) wherein after locking is sensed, said changeover circuit changes over the signal supplied to said phase-difference sensing circuit from the external clock input from said input buffer to a signal obtained by internally dividing the time difference between the external clock and the input clock by said timing averaging circuit.

4. A delay-locked loop circuit comprising:

(a) at least a phase-difference sensing circuit, a charge pump, a loop filter and a voltage-controlled delay circuit, to which an output from said loop filter is input as a control voltage, to vary delay of the input signal; and (b) a timing averaging circuit generating a signal having a time difference obtained by internally dividing, at a prescribed ratio, a time difference between two signals that are input with a fixed time difference between them;

(c) wherein said timing averaging circuit is supplied with an input clock signal entering said phase-difference sensing circuit and an output signal from said voltage-controlled delay circuit, an output of said timing averaging circuit being applied as an input signal to said voltage-controlled delay circuit.

5. The delay-locked loop circuit according to claim 4, further comprising:

(d) a lock sensing circuit sensing a locked state from the output of said phase-difference sensing circuit; and (e) a changeover circuit supplying said phase-difference sensing circuit with either the input clock or the output of said timing averaging circuit;

(f) wherein after locking is sensed, said changeover circuit changes over the signal supplied to said phase-difference sensing circuit from the input clock to a signal derived from said timing averaging circuit.

6. A clock control circuit of a semiconductor integrated circuit device for generating an internal clock from an entered external clock, comprising:

(a) a phase synchronizing loop circuit having at least a phase-difference sensing circuit, a charge pump, a loop filter and a voltage-controlled oscillator circuit;

(b) a timing averaging circuit generating a signal having a time difference obtained by internally dividing, at a prescribed ratio, a time difference between two signals that are input with a fixed time difference between them;

(c) wherein said timing averaging circuit is supplied with a clock signal, which is obtained by inputting the external clock via an input buffer, and a signal obtained by passing an internal clock, which is obtained by outputting a signal from said voltage-controlled oscillator via a clock driver, through an input buffer dummy circuit having a delay time equivalent to that of said input buffer;

(d) a lock sensing circuit sensing a locked state from the output of said phase-difference sensing circuit; and (e) a changeover circuit supplying said phase-difference sensing circuit with either the input clock or the output of said timing averaging circuit;

(f) wherein after locking is sensed, said changeover circuit changes over the signal supplied to said phase-difference sensing circuit from the input clock to a signal output from said timing averaging circuit.

7. A phase synchronizing loop circuit having at least a phase-difference sensing circuit, a charge pump, a loop filter and a voltage-controlled oscillator circuit, comprising:

(a) a timing averaging circuit generating a signal having a time difference obtained by internally dividing, at a prescribed ratio, a time difference between two signals that are input with a fixed time difference between them;

(b) wherein said timing averaging circuit is supplied with an input clock signal and an output signal from said voltage-controlled oscillator circuit, and an output of said timing averaging circuit is applied as one input of said phase-difference sensing circuit.

8. The phase synchronizing loop circuit according to claim 7, further comprising:

(c) a lock sensing circuit sensing a locked state from the output of said phase-difference sensing circuit; and (d) a changeover circuit supplying said phase-difference sensing circuit with either the input clock or the output of said timing averaging circuit;

(e) wherein after locking is sensed, said changeover circuit changes over the signal supplied to said phase-difference sensing circuit from the input clock to a signal output from said timing averaging circuit.

* * * * *